(12) United States Patent
Faris

(10) Patent No.: US 7,033,910 B2
(45) Date of Patent: Apr. 25, 2006

(54) METHOD OF FABRICATING MULTI LAYER MEMS AND MICROFLUIDIC DEVICES

(75) Inventor: Sadeg M. Faris, Pleasantville, NY (US)

(73) Assignee: Reveo, Inc., Elmsford, NY (US)

( * ) Notice: Subject to any disclaimer, the term of this patent is extended or adjusted under 35 U.S.C. 154(b) by 0 days.

(21) Appl. No.: 10/717,220

(22) Filed: Nov. 19, 2003

(65) Prior Publication Data

US 2004/0201013 A1    Oct. 14, 2004

Related U.S. Application Data

(63) Continuation-in-part of application No. 09/950,909, filed on Sep. 12, 2001.

(60) Provisional application No. 60/439,232, filed on Jan. 10, 2003, provisional application No. 60/428,125, filed on Nov. 20, 2002.

(51) Int. Cl.
*H01L 21/30* (2006.01)
*H01L 21/46* (2006.01)

(52) U.S. Cl. ...................... 438/455; 438/458; 438/459; 438/464

(58) Field of Classification Search ................. 438/40, 438/82, 99, 455–459, 464, 977
See application file for complete search history.

(56) References Cited

U.S. PATENT DOCUMENTS 5,976,953 A * 11/1999 Zavracky et al. ........... 438/455
6,214,733 B1 * 4/2001 Sickmiller .................. 438/691

* cited by examiner

*Primary Examiner*—Chuong Anh Luu
(74) *Attorney, Agent, or Firm*—Ralph J. Crispino

(57) ABSTRACT

A method for fabricating multi layer microelectromechanical and microfluidic devices is disclosed. Multi layer microelectromechanical and microfluidic devices are fabricated on a substrate with layers of predetermined weak and strong bond regions where deconstructed layers of devices at or on the weak bond regions. The layers are then peeled and subsequently bonded to produce a multi layer microelectromechanical and microfluidic devices. An arbitrary number of layers can be bonded and stacked to create either microelectromechanical or microfluidic device or a hyrbid type of device. Also disclosed are methods of creating edge interconnects and vias through the substrate to form interconnections between layers and devices thereon.

42 Claims, 50 Drawing Sheets

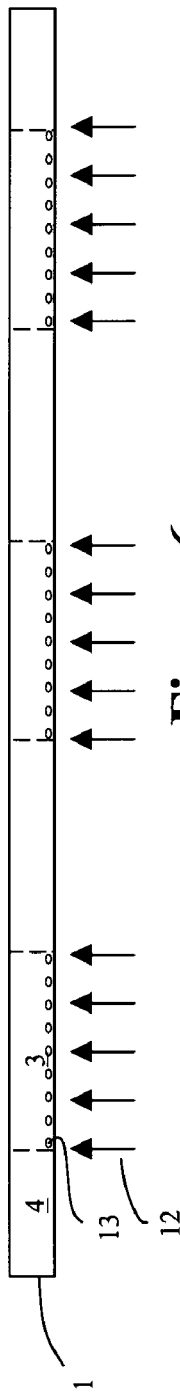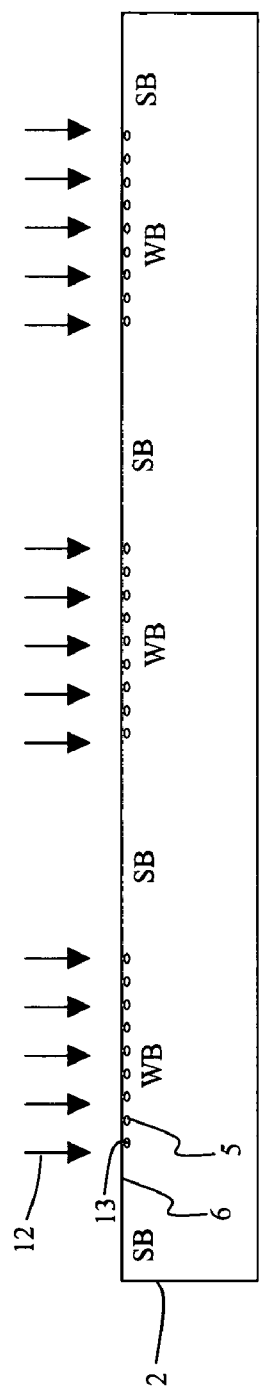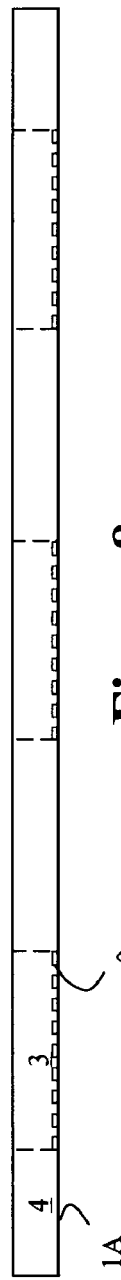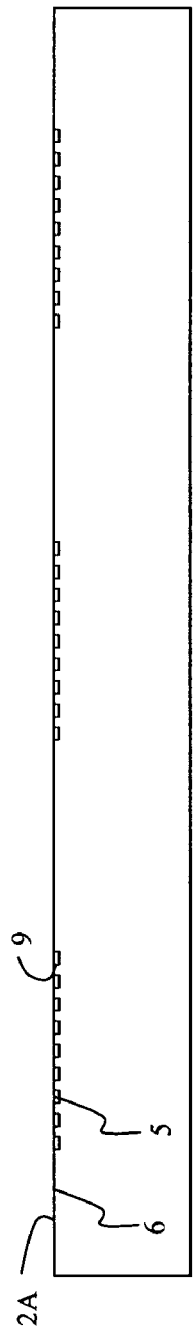

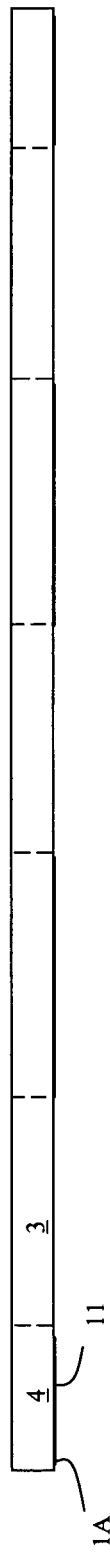
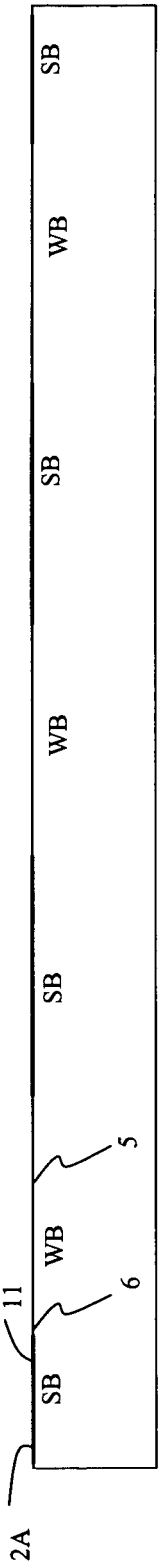
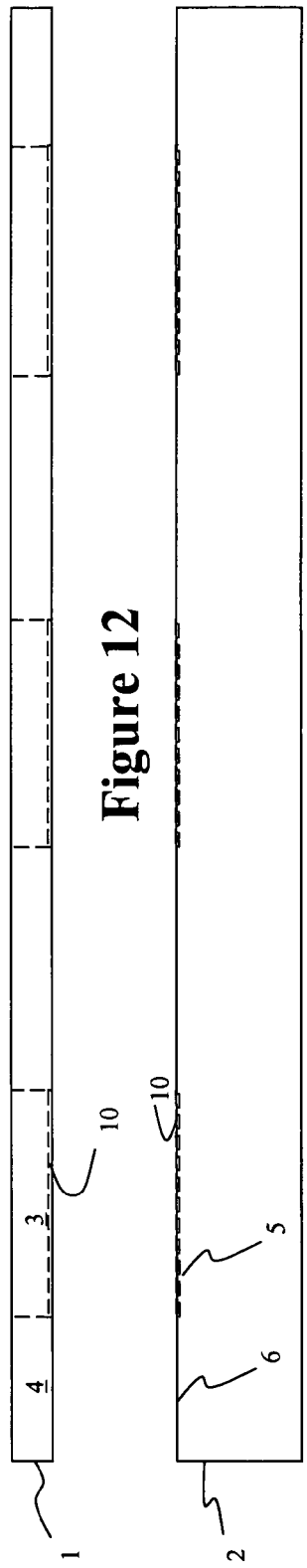
Figure 10
Figure 11
Figure 12
Figure 13

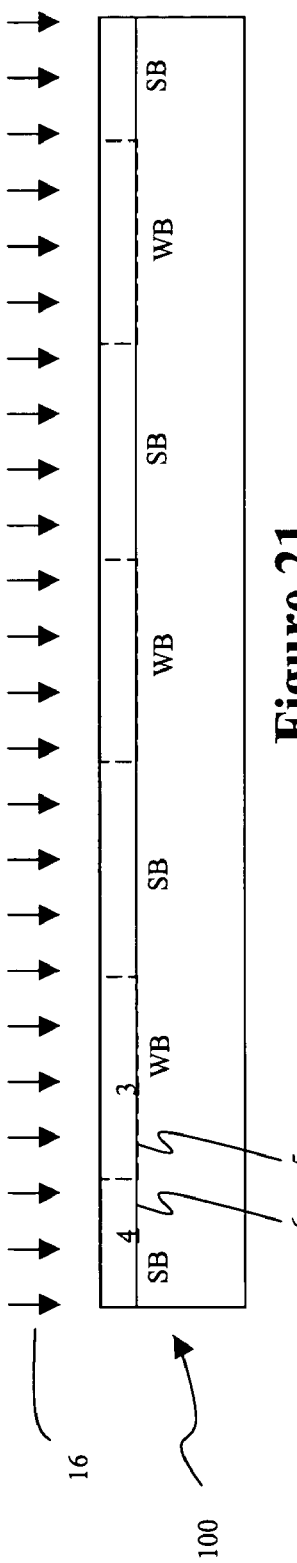
Figure 21
Figure 22
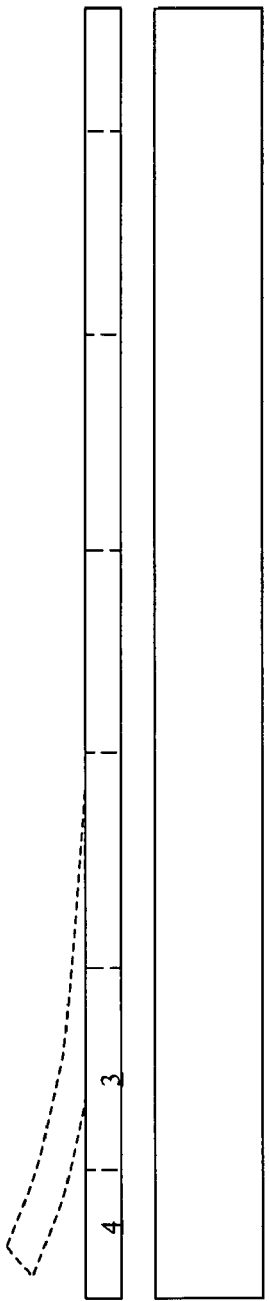
Figure 23

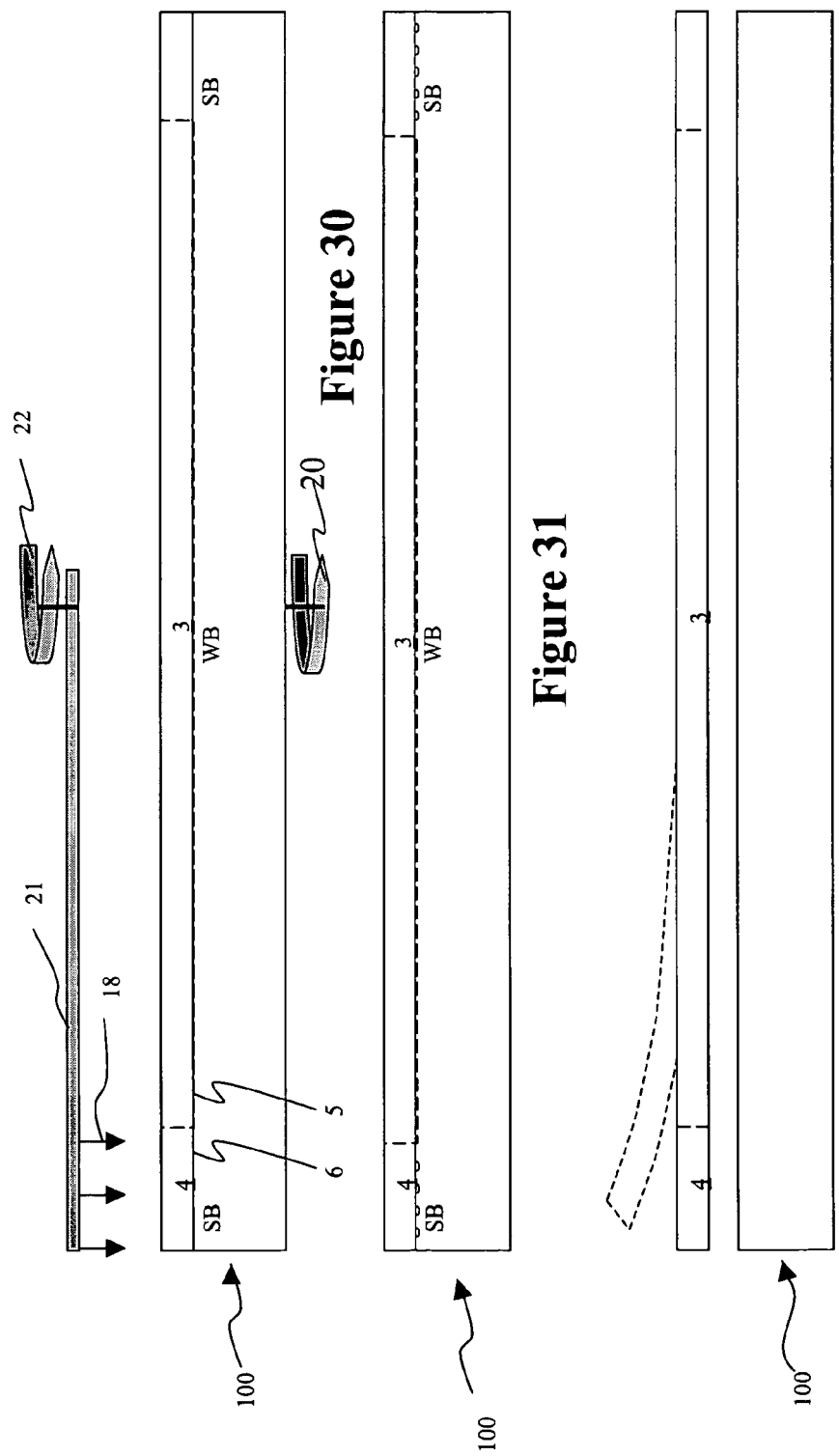

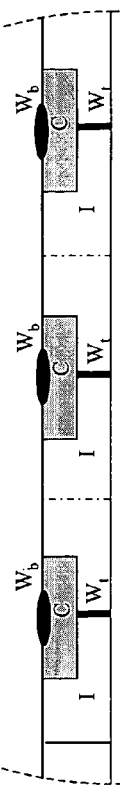
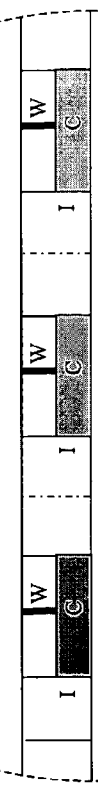
Figure 47
Figure 46

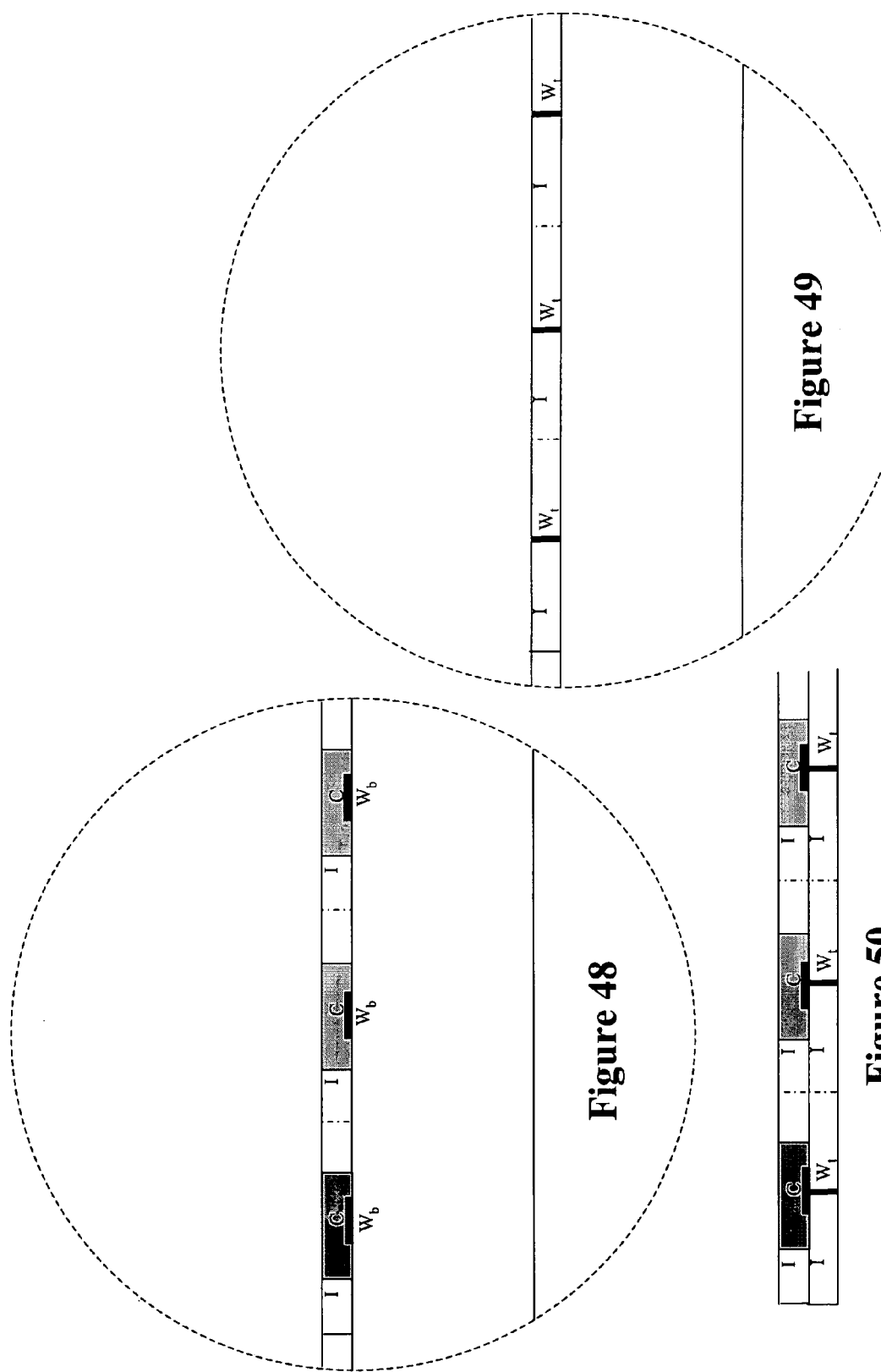

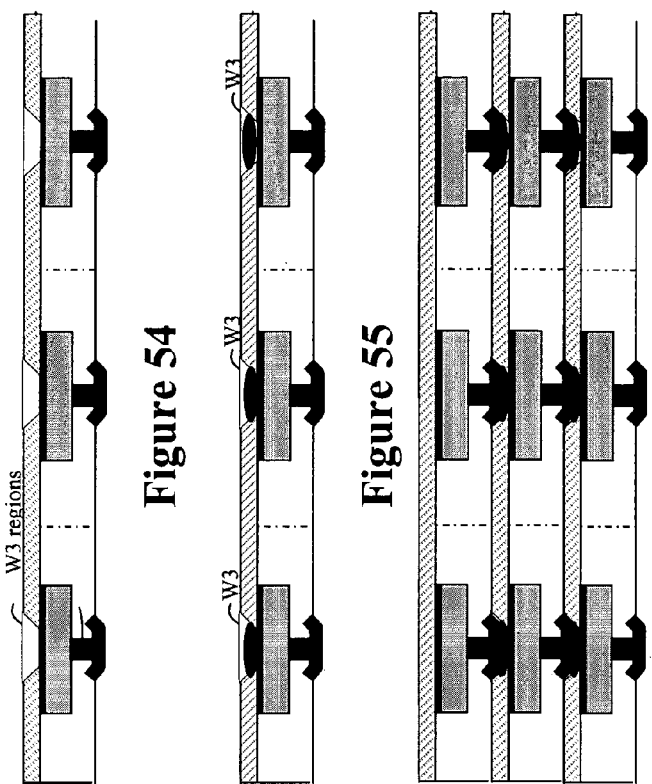
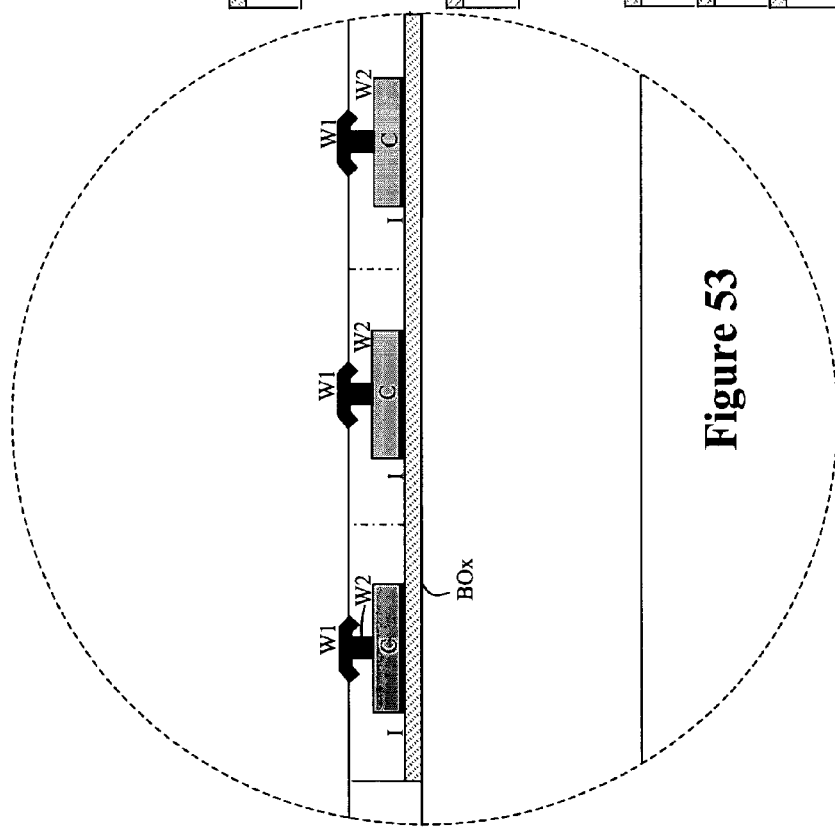
Figure 54
Figure 55
Figure 56
Figure 53

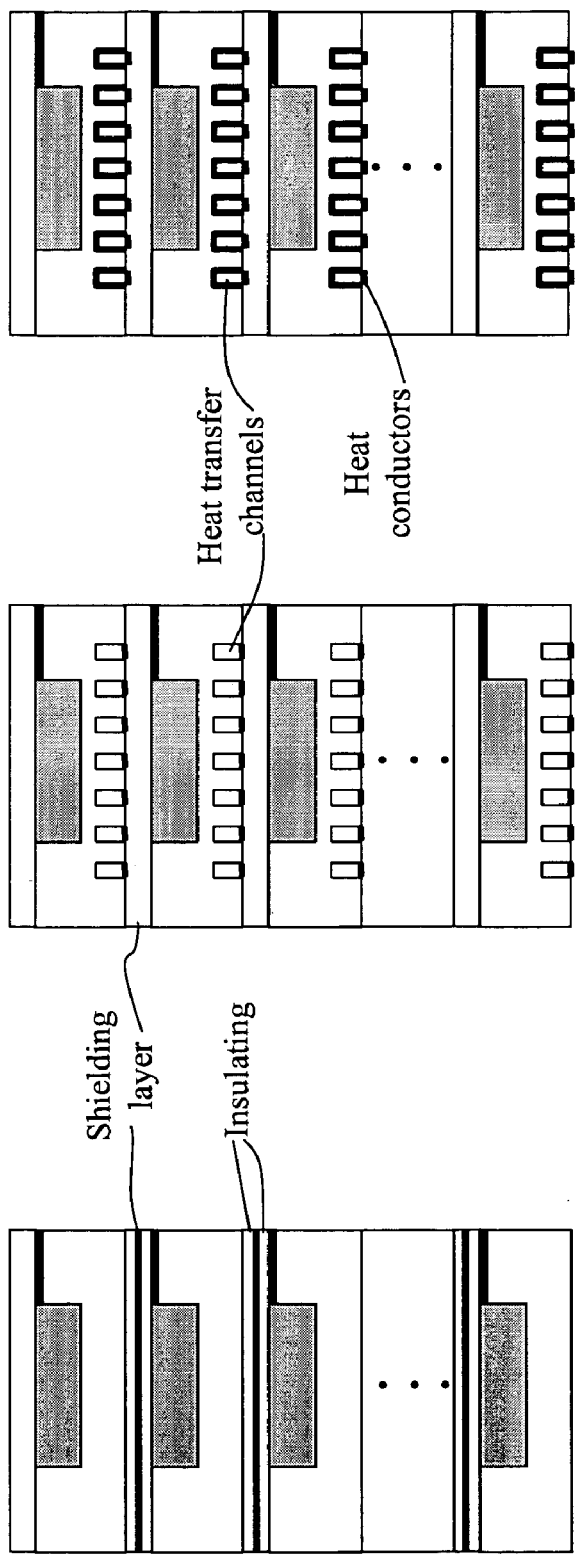
Figure 67
Figure 66
Figure 65
Heat transfer channels
Heat conductors
Shielding layer
Insulating
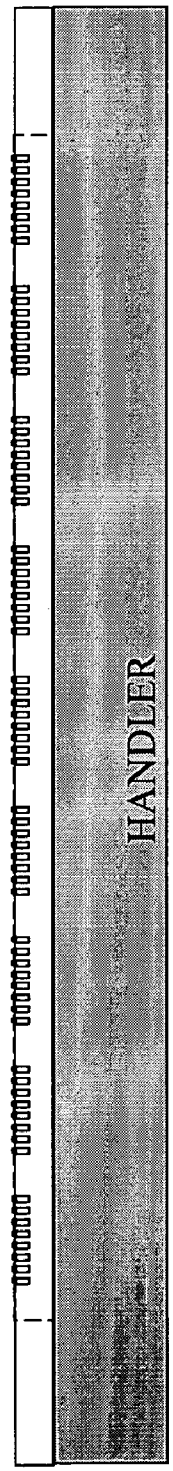
Figure 68
HANDLER

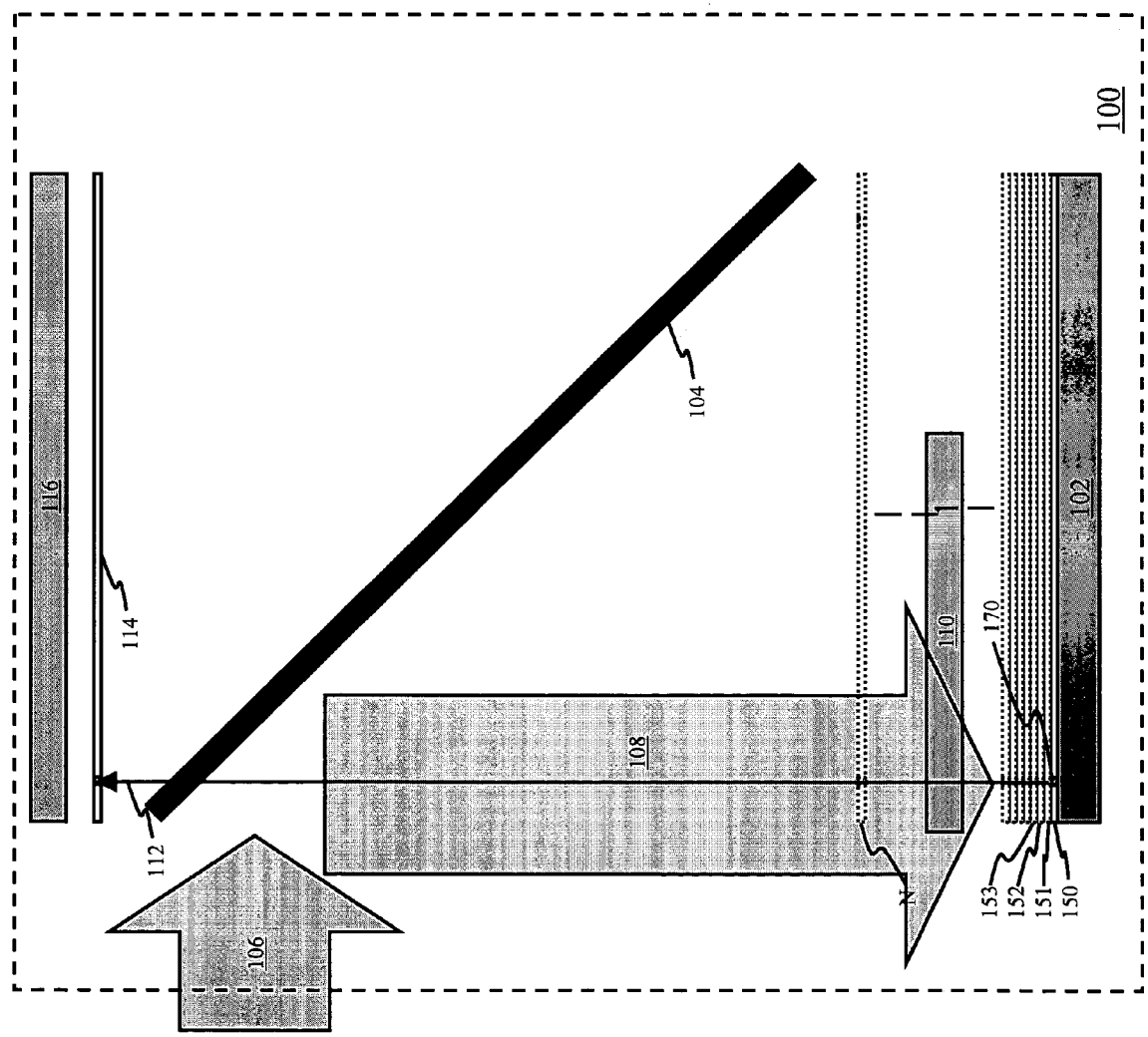

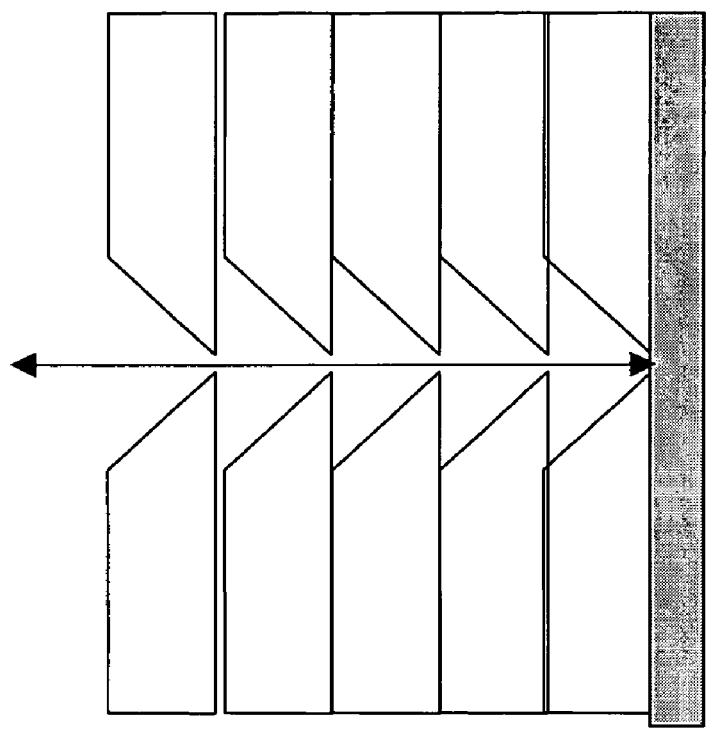
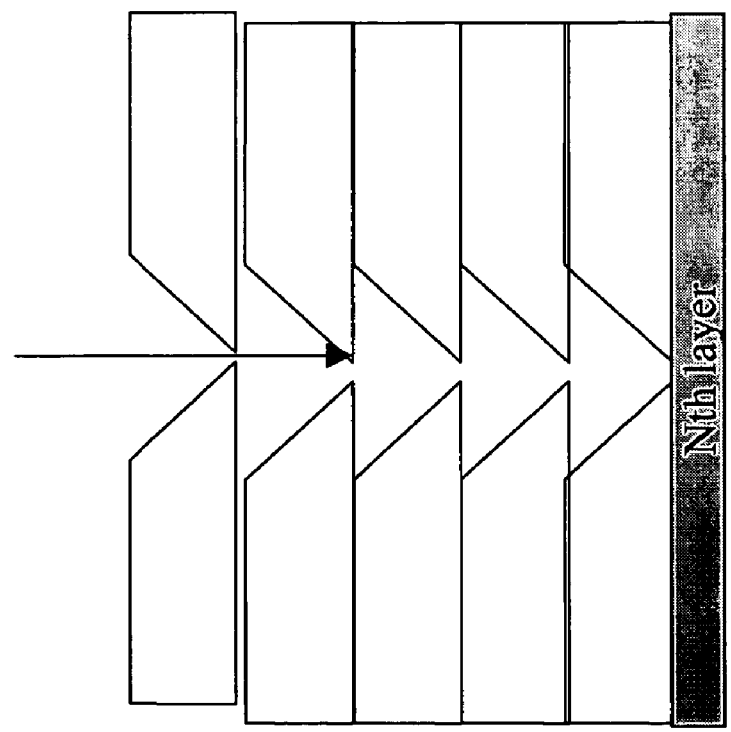
Figure 86

First attempt:
Second Attempt:
Alignment:

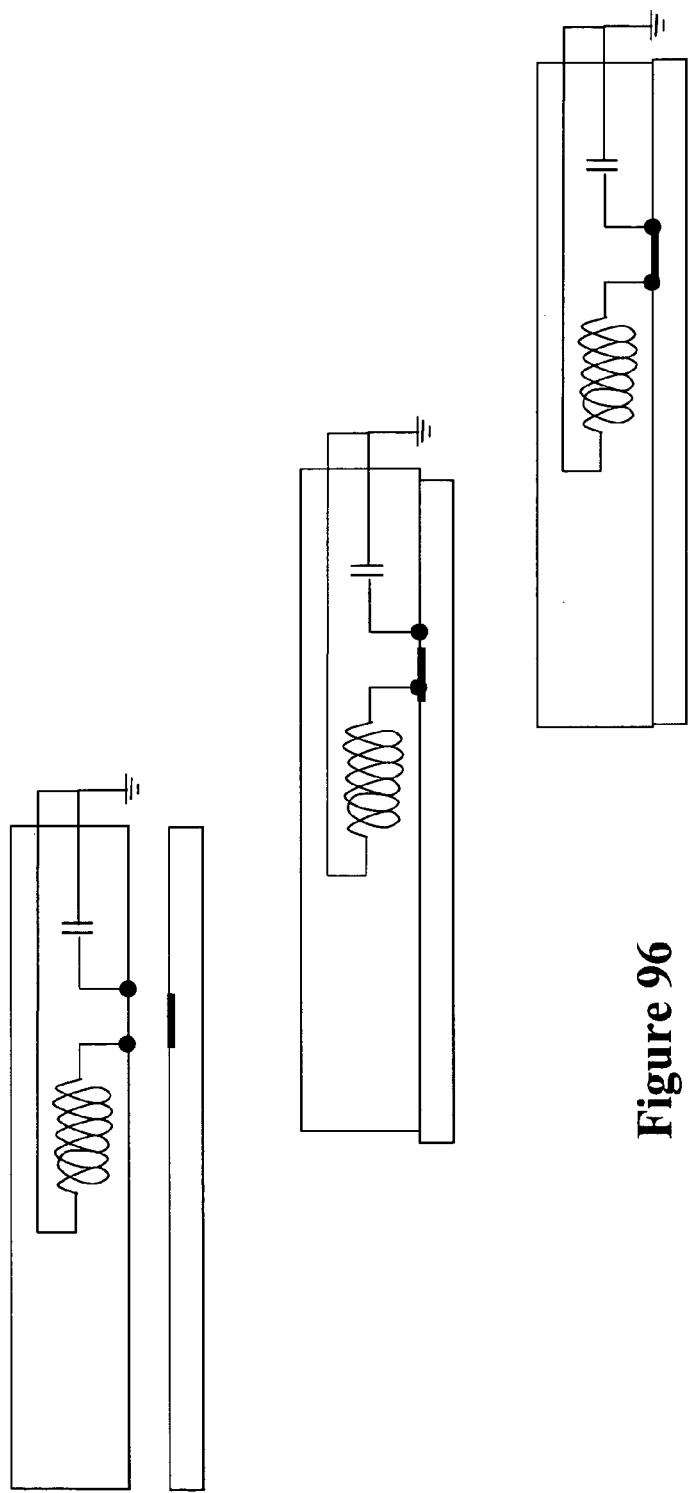
Figure 96
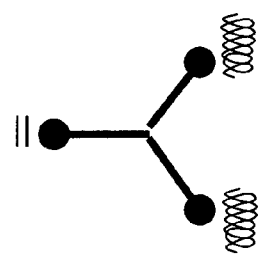
Figure 97

METHOD OF FABRICATING MULTI LAYER MEMS AND MICROFLUIDIC DEVICES

CROSS-REFERENCE TO RELATED APPLICATIONS

This application claims the benefit under 35 U.S.C. § 119(e) of U.S. Provisional Application No. 60/428,125 filed on Nov. 20, 2002, and U.S. Provisional Application No. 60/439,232 filed on Jan. 10, 2003, which are both herein incorporated by reference. This application is a continuation-in-part of and claims the benefit under 35 U.S.C. § 120 of copending U.S. patent application Ser. No. 09/950,909 filed on Sep. 12, 2001 entitled "Thin Films and Production Methods Thereof" which is herein incorporated by reference.

TECHNICAL FIELD

The invention relates to a fabrication process for multi layer microelectromechanical devices and microfluidic devices and, more particularly, to a process for fabricating a vertical microelectromechanical and microfluidic devices on a semiconductor substrate.

BACKGROUND ART

The demand for faster and cheaper integrated circuits is ever growing. Moore's Law posits that the number of transistors per square inch would double every year. However, as traditional two dimensional (or planar) chipmaking methods are reaching its boundaries, in order to fulfill the prophecy of Moore's Law, more innovative techniques for expanding the chipmaking frontiers are necessary.

Heretofore, most of the demand for denser integrated circuits has been met by ever shrinking active devices fabricated on a relatively planar structure. That is, two dimensional chipmaking has been the predominant method of semiconductor fabrication. Most semiconductor devices have been built in a planar monocrystalline semiconductor substrate. This approach allows only very limited vertical integration into the third dimension.

As the limitations of two dimensional chip making are approaching, major breakthroughs in performance will be derived from three dimensional chipmaking (that is, chip-making in the z-dimension).

Vertical integration, or stacking of microdevices into the same package, is an attractive way to decrease packaging volume, to increase circuit density and to conserve board space, and to increase performance and functionality. Reductions of interchip delays and power consumption are both benefits of stacked integration. If the devices are thinned and stacked on top of each other, the advantages in cost and circuit density are potentially huge. For both IC and MEMS processes, the third dimension of the silicon wafer remains largely unexploited.

Current commercial approaches to vertical stacking of 2-dimensional devices are generally chip-scale and rely on wafer thinning by grinding. Most methods rely on interconnection by way of throughholes or wire-bonded, stacked mother-daughter chips. Current methods all have limitations with respect to package size, cost, reliability and yield impact. Despite the difficulties, stacking devices to achieve 3-D integration is finding applications, particularly in combining Micro Electromechanical Systems ("MEMS") with Application Specific Integrated Circuits ("ASIC") controllers. High density memory packages made by stacking individual chips have found specialty applications.

IBM U.S. Pat. No. 6,355,501 discloses a method of fabricating a three-dimensional IC assembly, generally on chip scale. Disclosed therein is assembly consisting of three dimensional stacked Silicon on Insulator ("SOI") chips, and a method of forming such integrated circuit assembly. Each of the SOI chips includes a handler making mechanical contact to a first metalization pattern making electrical contact to a semiconductor device. The metalized pattern, in turn, contacts a second metalization pattern positioned on an opposite surface of the semiconductor device. The disclosed method includes the steps of: a) providing a substrate having a third metalized pattern on a first surface of the substrate; b) aligning one of the SOI chips on the first surface of the substrate, by having the second metalization pattern of the SOI chip make electrical contact with the third metalized pattern of the substrate; c) removing the handler from the SOI chip, exposing the first metalization pattern of the SOI chip; d) aligning a second one of the SOI chips with the first SOI chip, having the second metalization pattern of the second SOI chip make electrical contact to the exposed first metalization pattern of the first SOI chip; and e) repeating steps c) and d) for mounting subsequent SOI chips one on top of the other. However, this reference teaches a method that may be prohibitively expensive and severally functionally limited.

A key disadvantage of the method taught in the aforementioned U.S. Pat. No. 6,335,501 is that the applicants thereof note that forming three-dimension circuits on a wafer scale leads to low yield. Further, alignment of each chip is considered to be a significant problem preventing wafer scale stacking. Each chip stacking step includes alignment of the layers to be bonded to each other. Transparent adhesives and windows must be provided to allow optical access to the alignment marks on both surfaces to be bonded to each other. Further, the handler must be transparent to the alignment marks. Other disadvantages relate to the number of sequential repeated process steps. As described therein, to make electrical contract between stacked layers, a solder reflow step is performed between each layer when it is stacked and aligned. After reflow, the chip stack is edge bonded. Further, the handler must be removed by glue removal (by laser or other heating), polishing, and other preparation steps before the subsequent layer may be bonded. Finally, excess substrate is grinded or otherwise etched-back for removal.

These drawbacks lead to several disadvantages related to cost and functionality. Cost detriments are found with the grinding removal; numerous sequential steps; chip scale as opposed to wafer scale stacking, wherein wafer scale is known to reduce cost; inability to overcome yield issues on wafer scale thus reverting to chip scale; limitation of the number of layers, thus to form higher number stacks, stacks must be stacked on other stacks; overall yield is decreased because the number of sequential statistically dependant through interconnects; multiple reflow steps potentially damage other layers;. Functionality drawbacks include lack of diagnostics; lack of interconnect versatility; limited space for interconnects; limited addressability of large stack, particularly memory stack; no ability to integrate noise shielding; no ability to integrate heat dissipation; no ability of ground plane; limitation of the number of layers.

One implementation of 3-dimensional packaging has been undertaken by Irvine Sensors, Irvine, Calif., and IBM. Discrete die have been stacked and interconnected utilizing an edge lift-off process. Known-good-die (KGD) are thinned. Solder bumps at the die edge are used to align and interconnect the stacked die. The die are potted in an epoxy matrix. The epoxy helps to align different sized die, and is used as the interconnect surface. The individual stacking and interconnection of die, along with the requirement for KGD causes this to be a very expensive manufacturing method.

Another implementation of 3-dimensional packaging has been undertaken by Cubic Memory, who manufactures high-density, stacked memory modules by applying gold interconnect traces that are deposited over insulating layers of polyimide on whole wafers. However, stacking and vertical interconnect is still on an individual chip-scale.

A further implementation of 3-dimensional packaging has been undertaken by Tessera, San Jose, Calif., in conjunction with Intel, to develop chip-scale, stacked package by attaching the chips onto flexible substrates via micro-ball grid array bonding, then z-folding the chip-loaded tape onto itself.

Ziptronix is apparently developing wafer-scale stacking of ICs. Considerable challenges with alignment, stress management, thermal management, high density interconnect and yield are still being addressed.

As illustrated above, there are various deficiencies with available vertical integration. One primary deficiency is due to yield loss. All approaches to device stacking that are currently in the marketplace are die-scale. Individual die are prepared, aligned, stacked and connected. The processing is expensive and the yield loss for the stack is the compounded yield loss for each device in the layer. The increased yield loss is sometimes tolerated for inexpensive devices such as SRAM stacks. But when more expensive devices are being stacked, the solution is to use known good die (KGD). For KGD, each unpackaged die undergoes bum-in and test. Furthermore, the stack requires electrical test after the completion of each layer. The process is very expensive and the applications have been limited to high end users, such as military and satellite technology.

Another deficiency of conventional vertical integration is due to the fact that the technology is limited to a die-scale. With the exception of the yet-to-reach-the market approach of Ziptronix, all of the approaches to stacking devices are on die scale. The significant economic advantage of wafer-scale manufacturing is completely unavailable to these technologies. The high cost of handling and testing individual die restricts these methods to high-end applications.

Another problem known throughout conventional manufacturing processes forming circuits is the requirement to support the processing device on a substrate. During processing, the substrate is required to provide mechanical support and thermal stability. The processed substrate, therefore, must be sufficiently thick to withstand the harsh processing environment, including high pressures and temperatures, as well as chemical and energy exposure. Further processing is therefore required if viable thin film devices are sought.

One processing approach, undertaken after a circuit or other structure is formed on a sufficiently thick substrate to withstand processing, is to remove the thickness of the substrate by mechanical methods. These mechanical methods, such as cutting or grinding, waste a tremendous amount of material and labor. The cut or ground material often may not be recycled, or, even if it is recyclable, the material must undergo further processing before reuse. Further, the thinned substrate is generally subjected to polishing or other processes to smooth the surface. Other techniques include formation of an etch stop layer on the substrate prior to device fabrication. However, the substrate is still typically ground or otherwise mechanically removed prior to a selective etching step, which etches the substrate generally to the etch stop layer. All of these techniques result in wasted time and material, as well presenting quality control concerns.

Another technique to form thin film devices utilizes ion implantation methods. A common use of ion implantation is to generally derive thin layers of semiconductor materials. Such methods are disclosed in, for example, EP01045448 and WO00/024059, both entitled "Method of Producing SOI Wafer by Hydrogen Ion Implanting Separation Method and SOI Wafer Produced by the Method," and both incorporated by reference herein. Particularly, ions, such as hydrogen ions or helium ions, are implanted within the top surface of an oxidized silicon wafer. The ions are implanted to a depth within the top surface. Thereafter, a thin layer may be delaminated from the bulk silicon substrate, which is generally subjected to high temperature (greater than about 500° C.) processes. This thin layer may be then supported on an insulator layer and a substrate, and microelectronics or other structures may be formed thereon. The microelectronics, however, must be formed subsequent to delaminating the thin layer, since ion implantation detrimentally affects the microelectronics. Particularly, the thin layer may be warped, the devices may be damaged by the ion implantation, or the device may be damaged during delamination.

Bruel et al. WO 98/33209, entitled "Method For Obtaining A Thin Film, In Particular Semiconductor, Comprising A Protected Ion Zone And Involving An Ion Implantation," discloses an approach to providing a thin film including a metal oxide semiconductor ("MOS"). In general, a MOS transistor is formed on the surface of a semiconductor substrate. The region of the transistor is masked, and surrounding regions are ion implanted to define an intended line of fracture (i.e., where microbubbles develop from the ion implantation step). To separate the thin film having the transistor thereon, cleavage is commencing at the intended line of fracture in the vicinity of the microbubbles, and is propagated through the crystal plane under the transistor (i.e., where no microbubbles exist). While it may be possible to realize thin films having transistors thereon using the teachings of WO 98/33209, the transistors are subjected to undesirable stress in the cleavage propagation, since the crystalline structure of the substrate material must be fractured in the immediate vicinity of the transistor.

Aspar et al. U.S. Pat. No. 6,103,597 entitled "Method Of Obtaining A Thin Film Of Semiconductor Material," generally teaches subjecting a thin film substrate having microelectronics or other structures therein to ion bombardment. Gaseous microbubbles are thus formed at a depth therein defining the thickness of the thin film. However, many types of microelectronics and structures that may be formed on the substrate require a subsequent annealing step, in order to repair damage or other defects imparted to the elements. Thereafter, the thin film layer is taught to be separable from the underlying substrate material by thermal treatment that causes a fracture along the line of the microbubbles.

Sakaguchi et al., U.S. Pat. Nos. 6,221,738 entitled "Substrate And Production Method Thereof" and U.S. Pat. No. 6,100,166 entitled "Process For Producing Semiconductor Article", both of which are incorporated by reference herein, teach bonding a substrate to a porous semiconductor layer. The bonding at the porous layer is taught to be mechanically weaker, thus facilitating removal by application of an external force. U.S. Pat. No. 6,100,166 teaches that a layer may be removed with a force in a peeling direction. However, both of these references disclose use of the weak porous separation mechanism at the entire interface between the layers. This may compromise overall mechanical integrity of the intermediate structure and any semiconductor devices formed on the porous semiconductor material.

Henley et al., U.S. Pat. No. 6,184,111 entitled "Pre-Semiconductor Process Implant And Post-Process Film Separation," which is incorporated by reference herein, discloses use of a stressed layer at a selected depth below a silicon wafer surface. Devices are formed above the stressed layer. Implantation is generally carried out at the same energy level with varying dosage across the diameter of the wafer. Controlled cleavage propagation is initiated to separate a layer above the stressed layer, including any devices thereon. It is noted that processing to form the stressed layer may damage devices formed thereon, thus subsequent repair annealing is typically required. Therefore, conventional ion implantation and delamination methods are lacking in that a thin film including microelectronics or other structures thereon may not be ion implanted without warping or other damage to the thin semiconductor.

Therefore, considering the deficiencies of present circuit processing, it would be desirable to provide a three-dimensional integrated circuit, on a chip or on a wafer scale, which avoids the drawbacks and shortcomings of the conventional approaches.

Accordingly, a primary object of the present invention is to provide a low cost three-dimensional integrated circuit.

A further object of the invention is to provide a multiple layered substrate for fabrication of a useful device.

An additional object of the invention is to provide a multiple layered substrate for fabrication of a useful device including a buried oxide layer therein.

Another object of the present invention is to provide improved alignment techniques, particularly for use with the device layer formation, removal and stacking methods herein.

It is another object of the invention is to provide improved edge interconnections.

Additionally, an object of the invention is to provide improved through interconnections.

An additional object of the invention is to provide a vertically integrated device that is capable of including shielding between layers.

An additional object of the invention is to provide a vertically integrated device that is capable of including heat dissipation between layers.

An additional object of the invention is to provide a vertically integrated device that is capable of very high numbers of interconnections, by virtue of a buffer or congestion layer.

The above and other objects and advantages of this invention will become more readily apparent when the following description is read in conjunction with the accompanying drawings.

SUMMARY OF THE INVENTION

The above-discussed and other problems and deficiencies of the prior art are overcome or alleviated, and the objects of the invention are attained, by the several methods and apparatus of the present invention.

In one aspect, the invention is a method of fabricating a vertical microelectromechanical device, the method comprising the steps of: providing a bulk substrate; selectively creating strong bond regions and weak bond regions on said substrate; providing a first bonded semiconductor layer vertically supported on said substrate; creating an electrode on said first bonded semiconductor layer, said electrodes corresponding to said weak bond regions; creating an actuatable element disposed opposite said electrode; removing said first semiconductor layer from said bulk substrate; and bonding said first semiconductor layer to a second semiconductor layer.

In another aspect, the invention is a vertical MEMs device comprising: a bulk substrate on a wafer; a first selectively bonded semiconductor layer vertically supported on said substrate, said bonded semiconductor layer containing weak bond regions and strong bond regions; a second selectively bonded semiconductor layer vertically supported on said first selectively bonded semiconductor layer; wherein an electrode and an actuatable element are created at or on said weak bond regions; wherein said electrode and said actuatable element are disposed opposite each other, and wherein said electrode and said actuatable element vertically spans said first selectively bonded semiconductor layer and said second selectively bonded semiconductor layer.

In another aspect, the invention is a vertical MEMs device formed on a die comprising: a bulk substrate on a wafer; a first selectively bonded semiconductor layer vertically supported on said substrate, said bonded semiconductor layer containing weak bond regions and strong bond regions; a second selectively bonded semiconductor layer vertically supported on said first selectively bonded semiconductor layer; wherein an element and an actuatable element are created at or on said weak bond regions; wherein said element and said actuatable element vertically spans said first selectively bonded semiconductor layer and said second selectively bonded semiconductor layer, and wherein said die is formed by dicing said bonded semiconductor layers.

In another aspect, the invention is a method of fabricating a multi layer microfluidic device, the method comprising the steps of: providing a bulk substrate; selectively creating strong bond regions and weak bond regions on said substrate; providing a first bonded layer vertically supported on said substrate; creating a port on said first bonded layer, said port corresponding to said weak bond regions; creating a channel mechanically coupled to said port; removing said first layer from said bulk substrate; and bonding said first layer to a second layer.

In another aspect, the invention is a multilayer microfluidic device comprising: a bulk substrate on a wafer; a first selectively bonded layer vertically supported on said substrate, said bonded layer containing weak bond regions and strong bond regions; a second selectively bonded layer vertically supported on said first selectively bonded layer; wherein deconstructed ports and deconstructed channels are created at or on said weak bond regions, and wherein said ports and channels vertically span said first selectively bonded layer and said second selectively bonded layer.

In another aspect, the invention is a multilayer microfluidic device formed on a die comprising: a bulk substrate on a wafer; a first selectively bonded layer vertically supported on said substrate, said bonded layer containing weak bond regions and strong bond regions; a second selectively bonded layer vertically supported on said first selectively bonded layer; wherein deconstructed ports and deconstructed channels are created at or on said weak bond regions; wherein said ports and channels vertically span said first selectively bonded layer and said second selectively bonded layer, and wherein said die is formed by dicing said bonded semiconductor layers.

BRIEF DESCRIPTION OF THE DRAWINGS

The foregoing summary as well as the following detailed description of preferred embodiments of the invention, will be better understood when read in conjunction with the appended drawings. For the purpose of illustrating the invention, there is shown in the drawings embodiments which are presently preferred. It should be understood, however, that the invention is not limited to the precise arrangements and instrumentalities shown. In the drawings, wherein:

FIG. 6 is a schematic cross-section diagram of a selectively bonded multi layer substrate in accordance with the principles of the invention;

FIG. 7 is a schematic cross-section diagram of a selectively bonded multi layer substrate in accordance with the principles of the invention;

FIG. 8 is a schematic cross-section diagram of a selectively bonded multi layer substrate in accordance with the principles of the invention;

FIG. 9 is a schematic cross-section diagram of a selectively bonded multi layer substrate in accordance with the principles of the invention;

FIG. 10 is a schematic cross-section diagram of a selectively bonded multi layer substrate in accordance with the principles of the invention;

FIG. 11 is a schematic cross-section diagram of a selectively bonded multi layer substrate in accordance with the principles of the invention;

FIG. 12 is a schematic cross-section diagram of a selectively bonded multi layer substrate in accordance with the principles of the invention;

FIG. 13 is a schematic cross-section diagram of a selectively bonded multi layer substrate in accordance with the principles of the invention;

FIG. 21 is a schematic cross-section diagram of debonding techniques for a wafer in accordance with the principles of the invention;

FIG. 22 is a schematic cross-section diagram of debonding techniques for a wafer in accordance with the principles of the invention;

FIG. 23 is a schematic cross-section diagram of debonding techniques for a wafer in accordance with the principles of the invention;

FIG. 30 is a schematic cross-section diagram of debonding techniques for a wafer in accordance with the principles of the invention;

FIG. 31 is a schematic cross-section diagram of debonding techniques for a wafer in accordance with the principles of the invention;

FIG. 32 is a schematic cross-section diagram of debonding techniques for a wafer in accordance with the principles of the invention;

FIG. 46 is a schematic cross-section diagram of circuit portions in accordance with the principles of the invention;

FIG. 47 is a schematic cross-section diagram of circuit portions in accordance with the principles of the invention;

FIG. 48 is a schematic cross-section diagram of circuit portions in accordance with the principles of the invention;

FIG. 49 is a schematic cross-section diagram of circuit portions in accordance with the principles of the invention;

FIG. 50 is a schematic cross-section diagram of circuit portions and conductors aligned and stacked in accordance with the principles of the invention;

FIG. 53 is a schematic cross-section diagram of circuit portions and conductors aligned and stacked in accordance with the principles of the invention;

FIG. 54 is a schematic cross-section diagram of circuit portions and conductors aligned and stacked in accordance with the principles of the invention;

FIG. 55 is a schematic cross-section diagram of circuit portions and conductors aligned and stacked in accordance with the principles of the invention;

FIG. 56 is a schematic cross-section diagram of circuit portions and conductors aligned and stacked in accordance with the principles of the invention;

FIG. 65 is a schematic cross-section diagram of shielding layers provided between adjacent layers in accordance with the principles of the invention;

FIG. 66 is a schematic cross-section diagram of channels provided between layers in accordance with the principles of the invention;

FIG. 67 is a schematic cross-section diagram of heat-conductive channels between layers in accordance with the principles of the invention;

FIG. 68 is a schematic cross-section diagram of the underside of the device layer in accordance with the principles of the invention;

FIG. 72 is a schematic diagram illustrating the alignment of layers in accordance with the principles of the invention;

FIG. 86 is a schematic illustration of the alignment technique in accordance with the principles of the invention;

FIG. 96 is a schematic illustration of a handler in accordance with the principles of the invention;

FIG. 97 is a schematic illustration of a handler in accordance with the principles of the invention;

DETAILED DESCRIPTION OF THE DRAWINGS

The present invention is related to forming three-dimensional integrated circuits. Prior to discussion of specific formation of these three-dimensional integrated circuits, a discussion of the starting substrates is presented, as set forth in Applicant's copending U.S. patent application Ser. No. 09/950,909 filed on Sep. 12, 2001 entitled "Thin films and Production Methods Thereof." This substrate, referred to as a selectively bonded multiple layer substrate, allows for processing of multiple chips on a wafer as is known, but allows the chip layer of the wafer to be readily removed, preferably without mechanical grinding or other etch-back techniques. This chip layer then may be stacked on another chip layer, as described hereinafter, or alternatively, the chip layer may be diced into individual chips and stacked.

Figure 1:
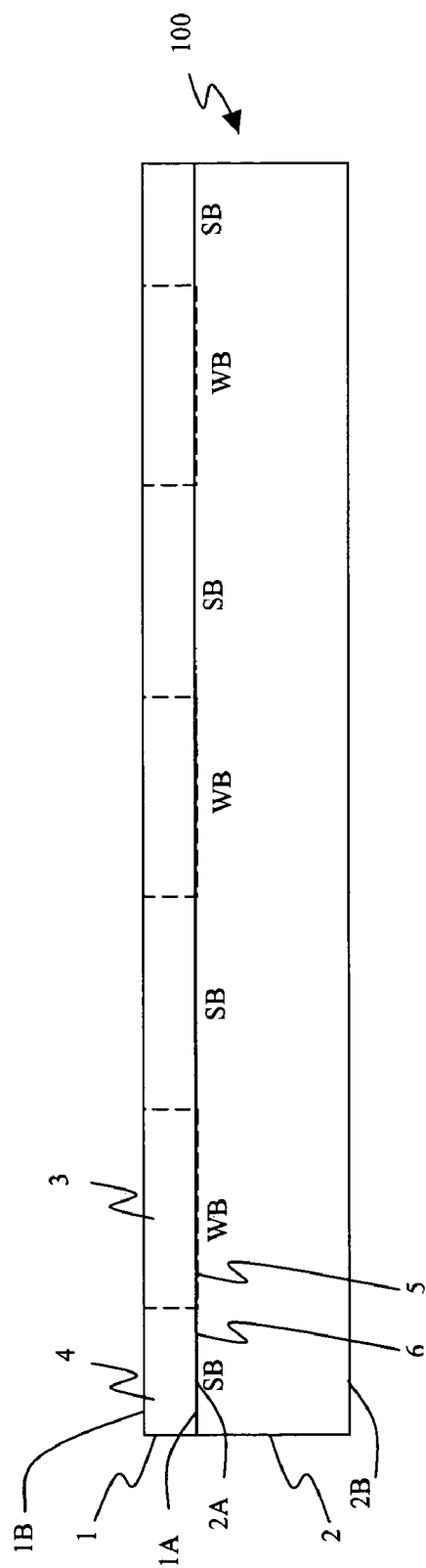
FIG. 1 is a schematic cross-section diagram of a selectively bonded multi layer substrate in accordance with the principles of the invention.

Referring to FIG. 1, a selectively bonded multiple layer substrate 100 is shown. The multiple layer substrate 100 includes a layer 1 having an exposed surface 1 B, and a surface 1A selectively bonded to a surface 2A of a layer 2. Layer 2 further includes an opposing surface 2B. In general, to form the selectively bonded multiple layer substrate 100, layer 1, layer 2, or both layers 1 and 2 are treated to define regions of weak bonding 5 and strong bonding 6, and subsequently bonded, wherein the regions of weak bonding 5 are in a condition to allow processing of a useful device or structure.

Generally, layers 1 and 2 are compatible. That is, the layers 1 and 2 constitute compatible thermal, mechanical, and/or crystalline properties. In certain preferred embodiments, layers 1 and 2 are the same materials. Of course, different materials may be employed, but preferably selected for compatibility.

One or more regions of layer 1 are defined to serve as the substrate region within or upon which one or more structures, such as microelectronics may be formed. These regions may be of any desired pattern, as described further herein. The selected regions of layer 1 may then be treated to minimize bonding, forming the weak bond regions 5. Alternatively, corresponding regions of layer 2 may be treated (in conjunction with treatment of layer 1, or instead of treatment to layer 1) to minimize bonding. Further alternatives include treating layer 1 and/or layer 2 in regions other than those selected to form the structures, so as to enhance the bond strength at the strong bond regions 6.

After treatment of layer 1 and/or layer 2, the layers may be aligned and bonded. The bonding may be by any suitable method, as described further herein. Additionally, the alignment of the layers may be mechanical, optical, or a combination thereof. It should be understood that the alignment at this stage may not, be critical, insomuch as there are generally no structures formed on layer 1. However, if both layers 1 and 2 are treated, alignment may be required to minimize variation from the selected substrate regions.

The multiple layer substrate 100 may be provided to a user for processing of any desired structure in or upon layer 1. Accordingly, the multiple layer substrate 100 is formed such that the user may process any structure or device using conventional fabrication techniques, or other techniques that become known as the various related technologies develop. Certain fabrication techniques subject the substrate to extreme conditions, such as high temperatures, pressures, harsh chemicals, or a combination thereof. Thus, the multiple layer substrate 100 is preferably formed so as to withstand these conditions.

Useful structures or devices may be formed in or upon regions 3, which partially or substantially overlap weak bond regions 5. Accordingly, regions 4, which partially or substantially overlap strong bond regions 6, generally do not have structures therein or thereon. After a user has formed useful devices within or upon layer 1 of the multiple layer substrate 100, layer 1 may subsequently be debonded. The debonding may be by any known technique, such as peeling, without the need to directly subject the useful devices to detrimental delamination techniques. Since useful devices are not generally formed in or on regions 4, these regions may be subjected to debonding processing, such as ion implantation, without detriment to the structures formed in or on regions 3.

To form weak bond regions 5, surfaces 1A, 2A, or both may be treated at the locale of weak bond regions 5 to form substantially no bonding or weak bonding. Alternatively, the weak bond regions 5 may be left untreated, whereby the strong bond region 6 is treated to induce strong bonding. Region 4 partially or substantially overlaps strong bond region 6. To form strong bond region 4, surfaces 1A, 2A, or both may be treated at the locale of strong bond region 6. Alternatively, the strong bond region 6 may be left untreated, whereby the weak bond region 5 is treated to induce weak bonding. Further, both regions 5 and 6 may be treated by different treatment techniques, wherein the treatments may differ qualitatively or quantitatively. After treatment of one or both of the groups of weak bond regions 5 and strong bond regions 6, layers 1 and 2 are bonded together to form a substantially integral multiple layer substrate 100. Thus, as formed, multiple layer substrate 100 may be subjected to harsh environments by an end user, e.g., to form structures or devices therein or thereon, particularly in or on regions 3 of layer 1.

For purposes of this specification, the phrase "weak bonding" or "weak bond" generally refers to a bond between layers or portions of layers that may be readily overcome, for example by debonding techniques such as peeling, other mechanical separation, heat, light, pressure, or combinations comprising at least one of the foregoing debonding techniques. These debonding techniques minimally defect or detriment the layers 1 and 2, particularly in the vicinity of weak bond regions 5.

The treatment of one or both of the groups of weak bond regions 5 and strong bond regions 6 may be effectuated by a variety of methods. The important aspect of the treatment is that weak bond regions 5 are more readily debonded (in a subsequent debonding step as described further herein) than the strong bond regions 6. This minimizes or prevents damage to the regions 3, which may include useful structures thereon, during debonding. Further, the inclusion of strong bond regions 6 enhances mechanical integrity of the multiple layer substrate 100 especially during structure processing. Accordingly, subsequent processing of the layer 1, when removed with useful structures therein or thereon, is minimized or eliminated.

The ratio of the bond strengths of the strong bond regions to the weak bond regions (SB/WB) in general is greater than 1. Depending on the particular configuration of the strong bond regions and the weak bond regions, and the relative area sizes of the strong bond regions and the weak bond regions, the value of SB/WB may approach infinity. That is, if the strong bond areas are sufficient in size and strength to maintain mechanical and thermal stability during processing, the bond strength of the weak bond areas may approach zero. However, the ratio SB/WB may vary considerably, since strong bonds strengths (in typical silicon and silicon derivative, e.g., $SiO_2$, wafers) may vary from about 500 millijoules per squared meter ($mj/m^2$) to over 5000 $mj/m^2$ as is taught in the art (see, e.g., Q. Y. Tong, U. Goesle, Semiconductor Wafer Bonding, Science and Technology, pp. 104–118, John Wiley and Sons, New York, N.Y. 1999, which is incorporated herein by reference). However, the weak bond strengths may vary even more considerably, depending on the materials, the intended useful structure (if known), the bonding and debonding techniques selected, the area of strong bonding compared to the area of weak bonding, the strong bond and weak bond configuration or pattern on the wafer, and the like. For example, where ion implantation is used as a step to debond the layers, a useful weak bond area bond strength may be comparable to the bond strength of the strong bond areas after ion implantation and/or related evolution of microbubbles at the implanted regions. Accordingly, the ratio of bond strengths SB/WB is generally greater than 1, and preferably greater than 2, 5, 10, or higher, depending on the selected debonding techniques and possibly the choice of the useful structures or devices to be formed in the weak bond regions.

The particular type of treatment of one or both of the groups of weak bond regions 5 and strong bond regions 6 undertaken generally depends on the materials selected. Further, the selection of the bonding technique of layers 1 and 2 may depend, at least in part, on the selected treatment methodology. Additionally, subsequent debonding may depend on factors such as the treatment technique, the bonding method, the materials, the type or existence of useful structures, or a combination comprising at least one of the foregoing factors. In certain embodiments, the selected combination of treatment, bonding, and subsequent debonding (i.e., which may be undertaken by an end user that forms useful structures in regions 3 or alternatively, as an intermediate component in a higher level device) obviates the need for cleavage propagation to debond layer 1 from layer 2 or mechanical thinning to remove layer 2, and preferably obviates both cleavage propagation and mechanical thinning. Accordingly, the underlying substrate may be reused with minimal or no processing, since cleavage propagation or mechanical thinning damages layer 2 according to conventional teachings, rendering it essentially useless without further substantial processing.

Figure 2:
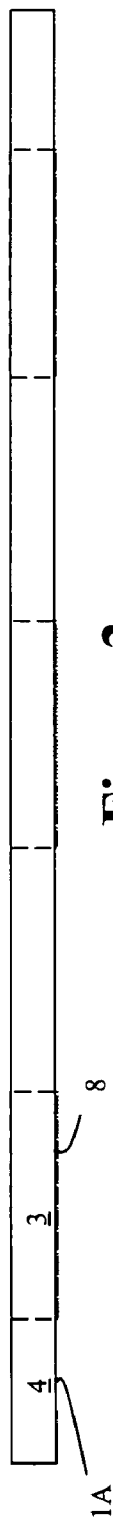
FIG. 2 is a schematic cross-section diagram of a selectively bonded multi layer substrate in accordance with the principles of the invention.
Figure 3:
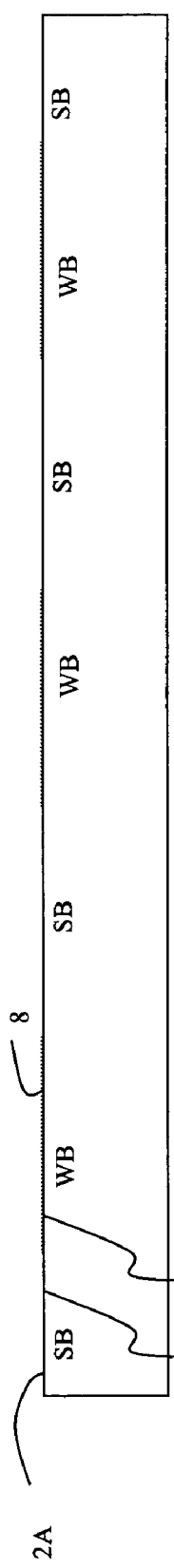
FIG. 3 is a schematic cross-section diagram of a selectively bonded multi layer substrate in accordance with the principles of the invention.

Referring to FIGS. 2 and 3, wherein similarly situated regions are referenced with like reference numerals, one treatment technique includes use of a slurry containing a solid component and a decomposable component on surface 1A, 2A, or both 1A and 2A. The solid component may be, for example, alumina, silicon oxide (SiO(x)), other solid metal or metal oxides, or other material that minimizes bonding of the layers 1 and 2. The decomposable component may be, for example, polyvinyl alcohol (PVA), or another suitable decomposable polymer. Generally, a slurry 8 is applied in weak bond region 5 at the surface 1A (FIG. 2), 2A (FIG. 3), or both 1A and 2A. Subsequently, layers 1 and/or 2 may be heated, preferably in an inert environment, to decompose the polymer. Accordingly, porous structures (comprised of the solid component of the slurry) remain at the weak bond regions 5, and upon bonding, layers 1 and 2 do not bond at the weak bond regions 5.

Figure 4:
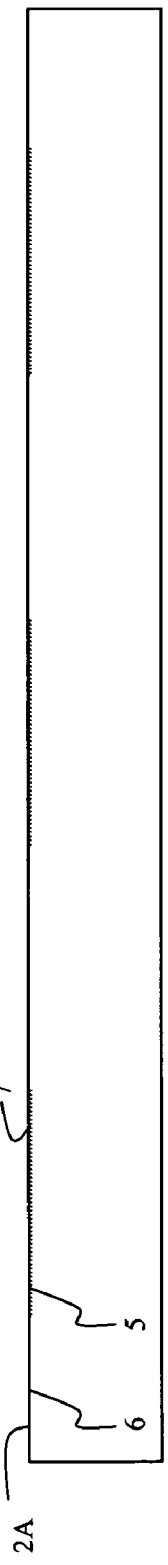
FIG. 4 is a schematic cross-section diagram of a selectively bonded multi layer substrate in accordance with the principles of the invention.
Figure 5:
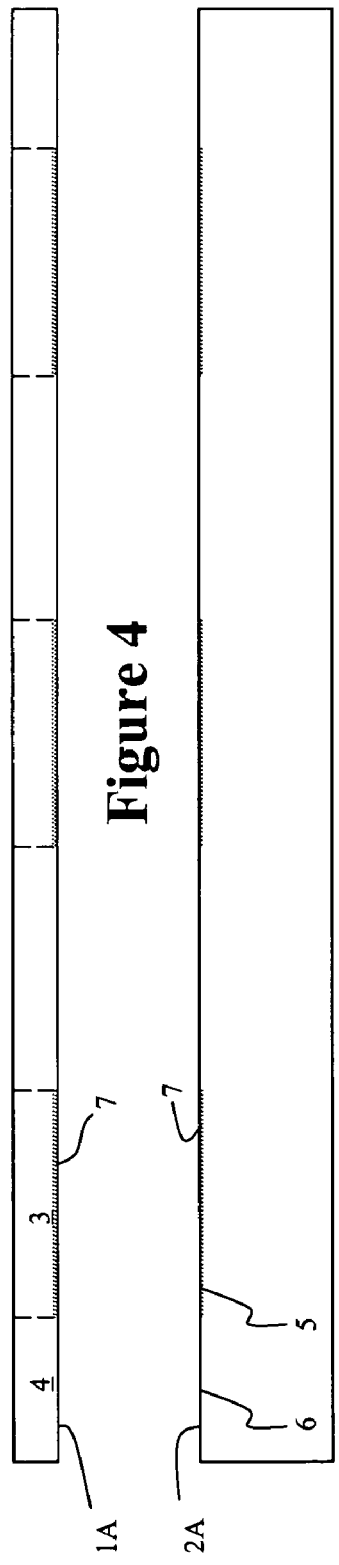
FIG. 5 is a schematic cross-section diagram of a selectively bonded multi layer substrate in accordance with the principles of the invention.
Figure 14:
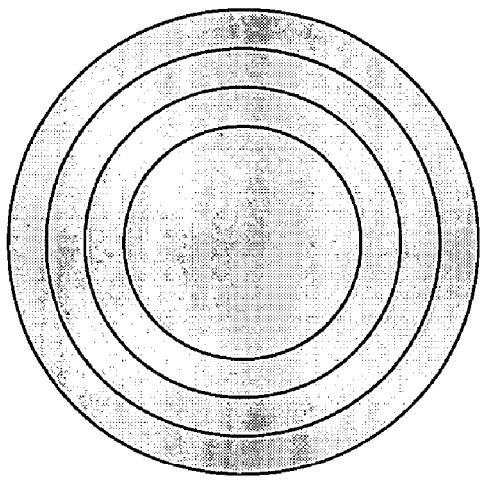
FIG. 14 is a horizontal cross-section diagram of the geometry of the bond regions of a wafer in accordance with the principles of the invention.
Figure 15:
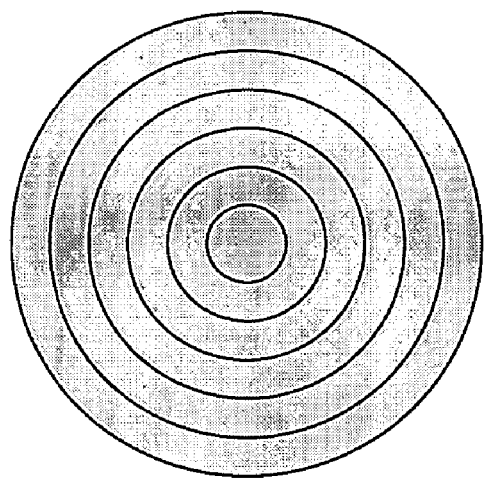
FIG. 15 is a horizontal cross-section diagram of the geometry of the bond regions of a wafer in accordance with the principles of the invention.
Figure 16:
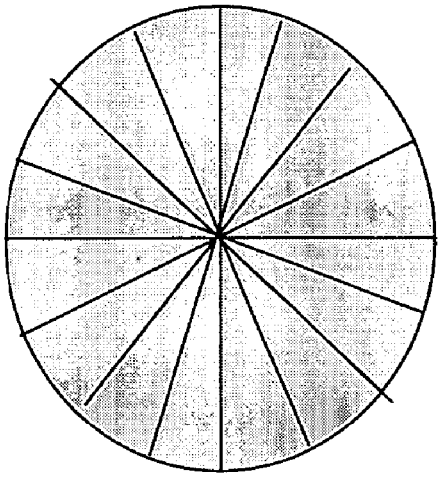
FIG. 16 is a horizontal cross-section diagram of the geometry of the bond regions of a wafer in accordance with the principles of the invention.
Figure 17:
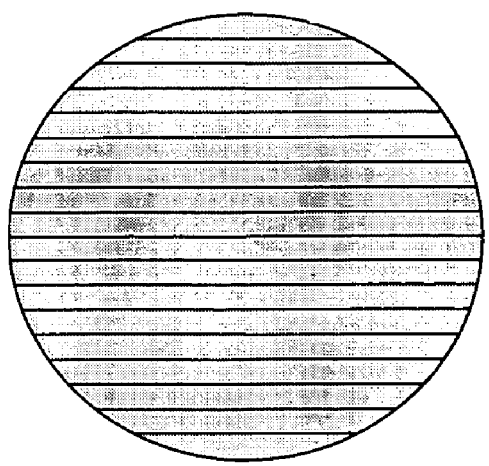
FIG. 17 is a horizontal cross-section diagram of the geometry of the bond regions of a wafer in accordance with the principles of the invention.
Figure 19:
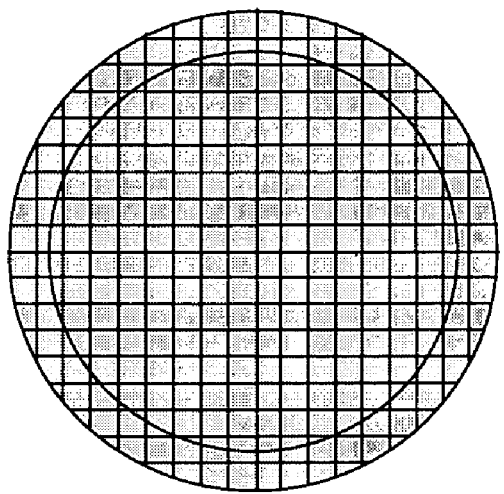
FIG. 19 is a horizontal cross-section diagram of the geometry of the bond regions of a wafer in accordance with the principles of the invention.
Figure 20:
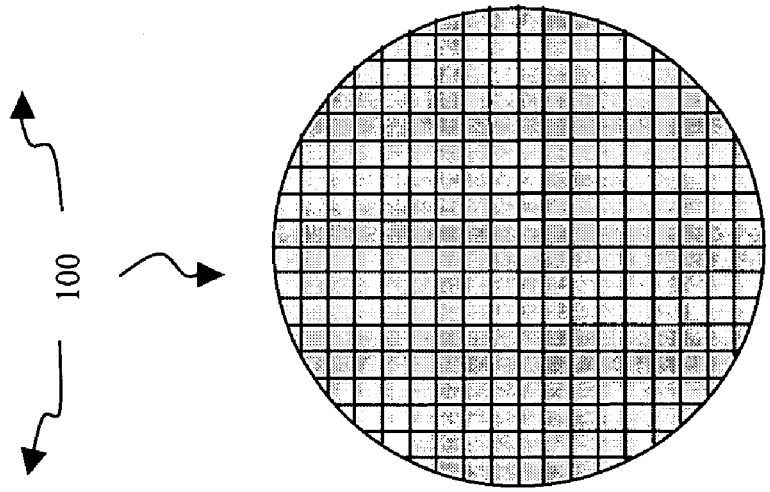
FIG. 20 is a horizontal cross-section diagram of the geometry of the bond regions of a wafer in accordance with the principles of the invention.

Referring to FIGS. 4 and 5, another treatment technique may rely on variation in surface roughness between the weak bond regions 5 and strong bond regions 6. The surface roughness may be modified at surface 1A (FIG. 4), surface 2A (FIG. 5), or both surfaces 1A and 2A. In general, the weak bond regions 5 have higher surface roughness 7 (FIGS. 4 and 5) than the strong bond regions 6. In semiconductor materials, for example the weak bond regions 5 may have a surface roughness greater than about 0.5 nanometer (nm), and the strong bond regions 4 may have a lower surface roughness, generally less than about 0.5 nm. In another example, the weak bond regions 5 may have a surface roughness greater than about 1 nm, and the strong bond regions 4 may have a lower surface roughness, generally less than about 1 nm. In a further example, the weak bond regions 5 may have a surface roughness greater than about 5 nm, and the strong bond regions 4 may have a lower surface roughness, generally less than about 5 nm. Surface roughness can be modified by etching (e.g., in KOH or HF solutions) or deposition processes (e.g., low pressure chemical vapor deposition ("LPCVD") or plasma enhanced chemical vapor deposition ("PECVD")). The bonding strength associated with surface roughness is more fully described in, for example, Gui et al., "Selective Wafer Bonding by Surface Roughness Control", *Journal of The Electrochemical Society*, 148 (4) G225–G228 (2001), which is incorporated by reference herein.

In a similar manner (wherein similarly situated regions are referenced with similar reference numbers as in FIGS. 4 and 5), a porous region 7 may be formed at the weak bond regions 5, and the strong bond regions 6 may remain untreated. Thus, layer 1 minimally bonds to layer 2 at locale of the weak bond regions 5 due to the porous nature thereof. The porosity may be modified at surface 1A (FIG. 4), surface 2A (FIG. 5), or both surfaces 1A and 2A. In general, the weak bond regions 5 have higher porosities at the porous regions 7 (FIGS. 4 and 5) than the strong bond regions 6.

Another treatment technique may rely on selective etching of the weak bond regions 5 (at surfaces 1A (FIG. 4), 2A (FIG. 5), or both 1A and 2A), followed by deposition of a photoresist or other carbon containing material (e.g., including a polymeric based decomposable material) in the etched regions. Upon bonding of layers 1 and 2, which is preferably at a temperature sufficient to decompose the carrier material, the weak bond regions 5 include a porous carbon material therein, thus the bond between layers 1 and 2 at the weak bond regions 5 is very weak as compared to the bond between layers 1 and 2 at the strong bond region 6. One skilled in the art will recognize that depending on the circumstances, a decomposing material will be selected that will not out-gas, foul, or otherwise contaminate the substrate layers 1 or 2, or any useful structure to be formed in or upon regions 3.

A further treatment technique may employ irradiation to attain strong bond regions 6 and/or weak bond regions 5. In this technique, layers 1 and/or 2 are irradiated with neutrons, ions, particle beams, or a combination thereof to achieve strong and/or weak bonding, as needed. For example, particles such as $He^+$, $H^+$, or other suitable ions or particles, electromagnetic energy, or laser beams may be irradiated at the strong bond regions 6 (at surfaces 1A (FIG. 10), 2A (FIG. 11), or both 1A and 2A). It should be understood that this method of irradiation differs from ion implantation for the purpose of delaminating a layer, generally in that the doses and/or implantation energies are much less (e.g., on the order of $1/100^{th}$ to $1/1000^{th}$ of the dosage used for delaminating).

Referring to FIGS. 8 and 9, a still further treatment technique involves etching the surface of the weak bond regions 5. During this etching step, pillars 9 are defined in the weak bond regions 5 on surfaces 1A (FIG. 8), 2A (FIG. 9), or both 1A and 2A. The pillars may be defined by selective etching, leaving the pillars behind. The shape of the pillars may be triangular, pyramid shaped, rectangular, hemispherical, or other suitable shape. Alternatively, the pillars may be grown or deposited in the etched region. Since there are less bonding sites for the material to bond, the overall bond strength at the weak bond region 5 is much weaker then the bonding at the strong bond regions 6.

Yet another treatment technique involves inclusion of a void area 10 (FIGS. 12 and 13), e.g., formed by etching, machining, or both (depending on the materials used) at the weak bond regions 5 in layer 1 (FIG. 12), 2 (FIG. 13). Accordingly, when the first layer 1 is bonded to the second layer 2, the void areas 10 will minimize the bonding, as compared to the strong bond regions 6, which will facilitate subsequent debonding.

Referring again to FIGS. 2 and 3, another treatment technique involves use of one or more metal regions 8 at the weak bond regions 5 of surface 1A (FIG. 2), 2A (FIG. 3), or both 1A and 2A. For example, metals including but not limited to Cu, Au, Pt, or any combination or alloy thereof may be deposited on the weak bond regions 5. Upon bonding of layers 1 and 2, the weak bond regions 5 will be weakly bonded. The strong bond regions may remain untreated (wherein the bond strength difference provides the requisite strong bond to weak bond ratio with respect to weak bond layers 5 and strong bond regions 6), or may be treated as described above or below to promote strong adhesion.

A further treatment technique involves use of one or more adhesion promoters 11 at the strong bond regions 6 on surfaces 1A (FIG. 10), 2A (FIG. 11), or both 1A and 2A. Suitable adhesion promoters include, but are not limited to, TiO(x), tantalum oxide, or other adhesion promoter. Alternatively, adhesion promoter may be used on substantially all of the surface 1A and/or 2A, wherein a metal material is be placed between the adhesion promoter and the surface 1A or 2A (depending on the locale of the adhesion promoter) at the weak bond regions 5. Upon bonding, therefore, the metal material will prevent strong bonding a the weak bond regions 5, whereas the adhesion promoter remaining at the strong bond regions 6 promotes strong bonding.

Yet another treatment technique involves providing varying regions of hydriphobicity and/or hydrophillicity. For example, hydrophilic regions are particularly useful for strong bond regions 6, since materials such as silicon may bond spontaneously at room temperature. Hydrophobic and hydrophilic bonding techniques are known, both at room temperature and at elevated temperatures, for example, as described in Q. Y. Tong, U. Goesle, *Semiconductor Wafer Bonding, Science and Technology*, pp. 49–135, John Wiley and Sons, New York, N.Y. 1999, which is incorporated by reference herein.

A still further treatment technique involves one or more exfoliation layers that are selectively irradiated. For example, one or more exfoliation layers may be placed on the surface 1A and/or 2A. Without irradiation, the exfoliation layer behaves as an adhesive. Upon exposure to irradiation, such as ultraviolet irradiation, in the weak bond regions 5, the adhesive characteristics are minimized. The useful structures may be formed in or upon the weak bond regions 5, and a subsequent ultraviolet irradiation step, or other debonding technique, may be used to separate the layers 1 and 2 at the strong bond regions 6.

Referring to FIGS. 6 and 7, an additional treatment technique includes an implanting ions 12 (FIGS. 6 and 7) to allow formation of a plurality of microbubbles 13 in layer 1 (FIG. 6), layer 2 (FIG. 7), or both layers 1 and 2 in the weak regions 3, upon thermal treatment. Therefore, when layers 1 and 2 are bonded, the weak bond regions 5 will bond less than the strong bond regions 6, such that subsequent debonding of layers 1 and 2 at the weak bond regions 5 is facilitated.

Another treatment technique includes an ion implantation step followed by an etching step. In one embodiment, this technique is carried out with ion implantation through substantially all of the surface 1B. Subsequently, the weak bond regions 5 may be selectively etched. This method is described with reference to damage selective etching to remove defects in Simpson et al., "Implantation Induced Selective Chemical Etching of Indium Phosphide", *Electrochemical and Solid-State Letters*, 4(3) G26–G27, which is herein incorporated by reference.

A still further treatment technique realizes one or more layers selectively positioned at weak bond regions 5 and/or strong bond regions 6 having radiation absorbing and/or reflective characteristics, which may be based on narrow or broad wavelength ranges. For example, one or more layers selectively positioned at strong bond regions 6 may have adhesive characteristics upon exposure to certain radiation wavelengths, such that the layer absorbs the radiation and bonds layers 1 and 2 at strong bond regions 6.

One of skill in the art will recognize that additional treatment technique may be employed, as well as combination comprising at least one of the foregoing treatment techniques. The key feature of any treatment employed, however, is the ability to form one or more region of weak bonding and one or more regions of strong bonding, providing SB/WB bond strength ratio greater than 1.

The geometry of the weak bond regions 5 and the strong bond regions 6 at the interface of layers 1 and 2 may vary depending on factors including, but not limited to, the type of useful structures formed on or in regions 3, the type of debonding/ bonding selected, the treatment technique selected, and other factors. Referring to FIGS. 14–20, the multiple layer substrate 100 may have weak bond and strong bond regions which may be concentric (FIGS. 14, 16 and 18), striped (FIG. 1-5), radiating (FIG. 17), checkered (FIG. 20), a combination of checkered and annular (FIG. 19), or any combination thereof. Of course, one of skill in the art will appreciate that any geometry may be selected. Furthermore, the ratio of the areas of weak bonding as compared to areas of strong bonding may vary. In general, the ratio provides sufficient bonding (i.e., at the strong bond regions 6) so as not to comprise the integrity of the multiple layer structure 100, especially during structure processing. Preferably, the ratio also maximizes useful regions (i.e., weak bond region 5) for structure processing.

After treatment of one or both of the surfaces 1A and 2A in substantially the locale of weak bond regions 5 and/or strong bond regions 6 as described above, layers 1 and 2 are bonded together to form a substantially integral multiple layer substrate 100. Layers 1 and 2 may be bonded together by one of a variety of techniques and/or physical phenomenon, including but not limited to, eutectic, fusion, anodic, vacuum, Van der Waals, chemical adhesion, hydrophobic phenomenon, hydrophilic phenomenon, hydrogen bonding, coulombic forces, capillary forces, very short-ranged forces, or a combination comprising at least one of the foregoing bonding techniques and/or physical phenomenon. Of course, it will be apparent to one of skill in the art that the bonding technique and/or physical phenomenon may depend in part on the one or more treatments techniques employed, the type or existence of useful structures formed thereon or therein, anticipated debonding method, or other factors.

Alternatively, a buried oxide layer may be formed at the bottom surface of the device layer. The oxide layer may be formed prior to selective bonding of the device layer to the bulk substrate. Further, the oxide layer may be formed by oxygen implanting to a desired buried oxide layer depth.

There are various techniques for forming an oxide layer on the multiple layer substrate. A first technique consists of forming the buried $SiO_2$ layer in a silicon substrate by implanting oxygen at high dose followed by annealing at a temperature greater than 1300° C. Through ion implantation, desired thicknesses of buried $SiO_2$ layer can be formed.

An alternate technique for forming a buried oxide layer consists of forming a thin $SiO_2$ film on a surface of the multiple layer substrate, then bonding the substrate to a second silicon substrate by means of the $SiO_2$ film. Known mechanical grinding and polishing processes are then used to form a desired thickness silicon layer above the buried silicon oxide layer. The silicon oxide layer on the multiple layer substrate is formed by successively oxidizing the surface followed by etching the oxide layer formed in order to obtain the desired thickness.

Another technique for forming a buried oxide layer consists of forming, by oxidation, a thin silicon oxide layer on a first multiple layer substrate, then implanting $H^+$ ions in the first multiple layer substrate in order to form a cavity plane under the thin silicon oxide layer. Subsequently, by means of the thin silicon oxide layer, this first body is bonded to a second multiple layer substrate and then the entire assembly is subjected to thermal activation in order to transform the cavity plane into a cleaving plane. This makes it possible to recover a usable SOI substrate.

Multiple layer substrate 100 thus may be provided to an end user (with or without a buried oxide layer). Alternatively, certain patterns of conductors may be formed integral with the multiple layer substrate. The end user may subsequently form one or more useful structures (not shown) in or upon regions 3, which substantially or partially overlap weak bond regions 5 at the interface of surfaces 1A and 2A. The useful structures may include one or more active or passive elements, devices, implements, tools, channels, other useful structures, or any combination comprising at least one of the foregoing useful structures. For instance, the useful structure may include an integrated circuit or a solar cell. Of course, one of skill in the art will appreciate that various microtechnology and nanotechnology based device may be formed.

For instance, active devices may be formed on the multiple layer SOI wafer or substrate. These active devices are formed in the monocrystalline silicon active layer on the buried oxide film of the SOI substrate. The thickness of the silicon active layer is dependent on the purpose of the active devices formed therein. If the SOI elements are CMOS elements operating at high speed and low power consumption, the thickness of the active layer is about 50 to 100 nm. If the SOI elements are high breakdown voltage elements, the thickness of the active layer may be several micrometers. An example of an active device is a protective diode. A protective diode is a semiconductor element provided to a semiconductor device, to guide an over current from a connection pin to a substrate and to the outside of the semiconductor device, to thereby protecting an internal circuit of the semiconductor device.

It will be apparent to one skilled in the art that other active devices may be fabricated with selective doping and masking of active regions of the either the monocrystalline silicon substrate or SOI substrate. These active devices may include, but are not limited to, bipolar junction transistors, metal-oxide-semiconductor transistors, field effect transistors, diodes, insulated gate bipolar transistors, and the like.

Another active device which may be fabricated on the multiple layer substrate are MEMS devices. Generally, MEMS devices have comprise electrodes and actuatable elements disposed opposite electrodes fabricated on a substrate. The actuatable elements transfer controls from the electrodes to provide electrical control over machine structures. One technique for manufacturing MEMS devices is by bulk micromachining the substrate using deep etch processing, which is considered a subtractive fabrication technique because it involves etching away material from a single substrate layer to form the MEMS structure. The substrate layer can be relatively thick, on the order of tens of microns, and the sophistication of this process allows for the micromachining of different structures in the substrate such as cantilevers, bridges, trenches, cavities, nozzles and membranes.

Another technique for manufacturing MEMS devices on the multiple layer substrate is by surface micromachining techniques. It is considered an additive process because alternate structural layers and sacrificial spacer layers are "built-up" to construct the MEMS structure with the necessary mechanical and electrical characteristics. Polycrystalline silicon (polysilicon) is the most commonly used structural material and silicon oxide glass is the most commonly used sacrificial material. In traditional micromachining processes, these layers are formed in polysilicon/oxide pairs on a silicon substrate isolated with a layer of silicon nitride. The layers are patterned using photolithography technology to form intricate structures such as motors, gears, mirrors, and beams. As the layers are built up, cuts are made through the oxide layers and filled with polysilicon to anchor the upper structural layers to the substrate or to the underlying structural layer.

After one or more structures have been formed on one or more selected regions 3 of layer 1, layer 1 may be debonded by a variety of methods. It will be appreciated that since the structures are formed in or upon the regions 4, which partially or substantially overlap weak bond regions 5, debonding of layer 1 can take place while minimizing or eliminating typical detriments to the structures associated with debonding, such as structural defects or deformations.

Debonding may be accomplished by a variety of known techniques. In general, debonding may depend, at least in part, on the treatment technique, bonding technique, materials, type or existence of useful structures, or other factors.

Referring in general to FIGS. 21–32, debonding techniques may be based on implantation of ions or particles to form microbubbles at a reference depth, generally equivalent to thickness of the layer 1. The ions or particles may be derived from oxygen, hydrogen, helium, or other particles 14. The impanation may be followed by exposure to strong electromagnetic radiation, heat, light (e.g., infrared or ultraviolet), pressure, or a combination comprising at least one of the foregoing, to cause the particles or ions to form the microbubbles 15, and ultimately to expand and delaminate the layers 1 and 2. The implantation and optionally heat, light, and/or pressure may also be followed by a mechanical separation step (FIGS. 23, 26, 29, 32), for example, in a direction normal to the plane of the layers 1 and 2, parallel to the plane of the layers 1 and 2, at another angle with to the plane of the layers 1 and 2, in a peeling direction (indicated by broken lines in FIGS. 23, 26, 29, 32), or a combination thereof. Ion implantation for separation of thin layers is described in further detail, for example, in Cheung, et al. U.S. Pat. No. 6,027,988 entitled "Method Of Separating Films From Bulk Substrates By Plasma Immersion Ion Implantation", which is incorporated by reference herein.

Referring particularly to FIGS. 21–23 and 24–26, the interface between layers 1 and 2 may be implanted selectively, particularly to form microbubbles 17 at the strong bond regions 6. In this manner, implantation of particles 16 at regions 3 (having one or more useful structures therein or thereon) is minimized, thus reducing the likelihood of repairable or irreparable damage that may occur to one or more useful structures in regions 3. Selective implantation may be carried out by selective ion beam scanning of the strong bond regions 4 (FIGS. 24–26) or masking of the regions 3 (FIGS. 21–23). Selective ion beam scanning refers to mechanical manipulation of the structure 100 and/or a device used to direct ions or particles to be implanted. As is known to those skilled in the art, various apparatus and techniques may be employed to carry out selective scanning, including but not limited to focused ion beam and electromagnetic beams. Further, various masking materials and technique are also well known in the art.

Figures 27, 28, 29:
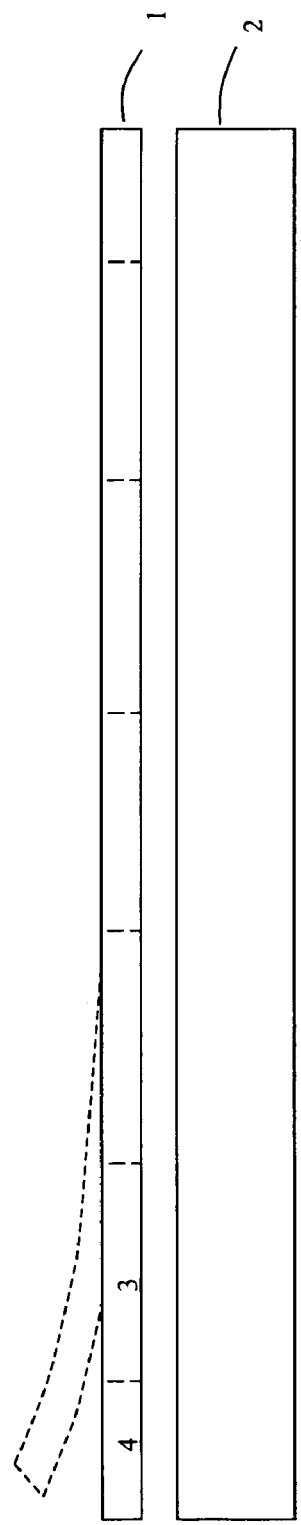
FIG. 27 is a schematic cross-section diagram of debonding techniques for a wafer in accordance with the principles of the invention.
FIG. 28 is a schematic cross-section diagram of debonding techniques for a wafer in accordance with the principles of the invention.
FIG. 29 is a schematic cross-section diagram of debonding techniques for a wafer in accordance with the principles of the invention.

Referring to FIGS. 27–29, the implantation may be effectuated substantially across the entire the surface 1B or 2B. Implantation is at suitable levels depending on the target and implanted materials and desired depth of implantation. Therefore, where layer 2 is much thicker than layer 1, it may not be practical to implant through surface 2B; however, if layer 2 is a suitable implantation thickness (e.g., within feasible implantation energies), it may be desirable to implant through the surface 2B. This minimizes or eliminates possibility of repairable or irreparable damage that may occur to one or more useful structures in regions 3.

Figure 18:
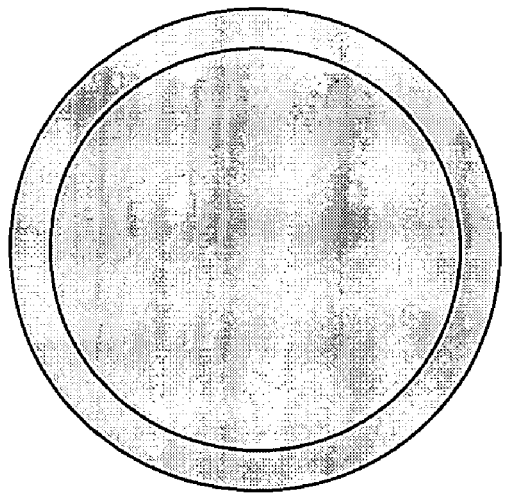
FIG. 18 is a horizontal cross-section diagram of the geometry of the bond regions of a wafer in accordance with the principles of the invention.
Figure 24:
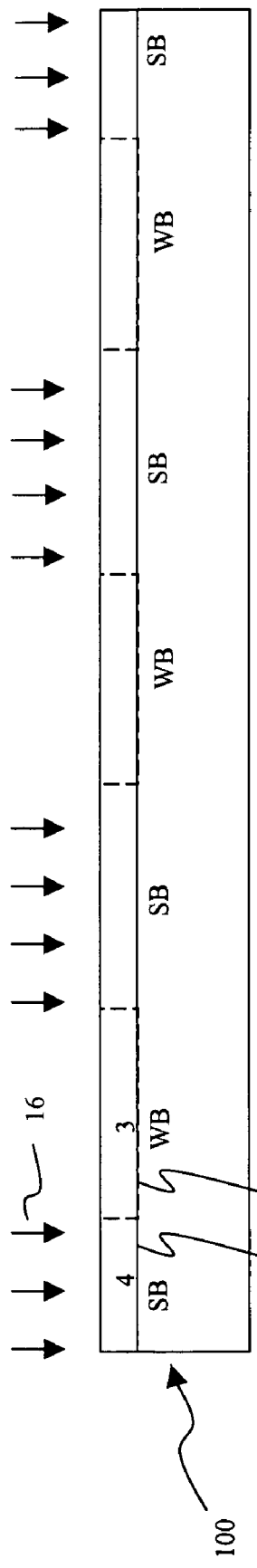
FIG. 24 is a schematic cross-section diagram of debonding techniques for a wafer in accordance with the principles of the invention.
Figure 25:
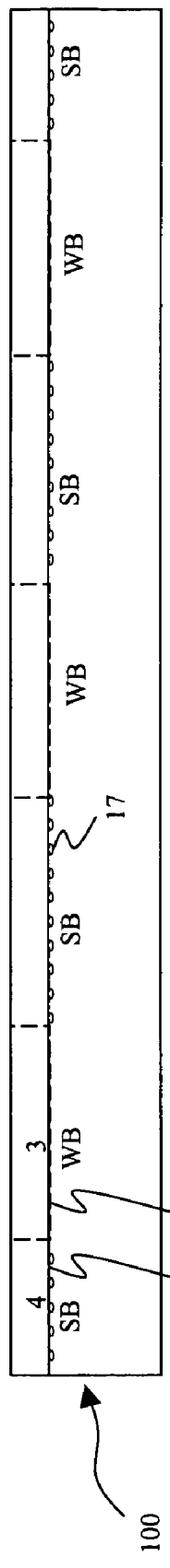
FIG. 25 is a schematic cross-section diagram of debonding techniques for a wafer in accordance with the principles of the invention.
Figure 26:
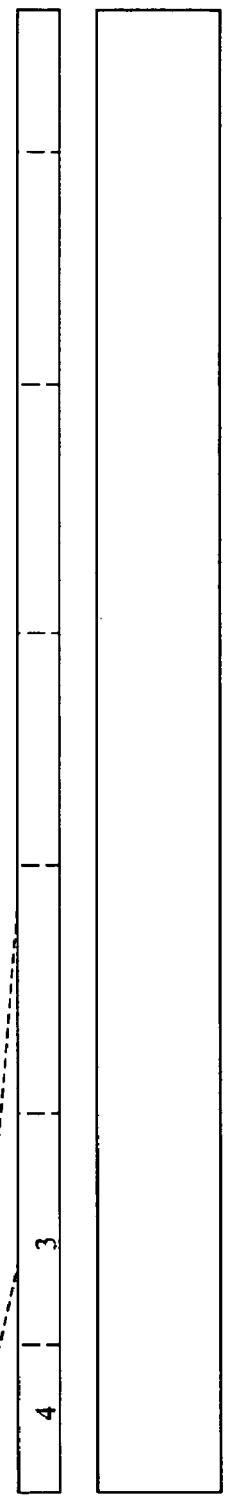
FIG. 26 is a schematic cross-section diagram of debonding techniques for a wafer in accordance with the principles of the invention.

In one embodiment, and referring to FIGS. 30–32 in conjunction with FIG. 18, strong bond regions 6 are formed at the outer periphery of the interface between layers 1 and 2. Accordingly, to debond layer 1 form layer 2, ions 18 may be implanted, for example, through region 4 to form microbubbles at the interface of layers 1 and 2. Preferably, selective scanning is used, wherein the structure 100 may be rotated (indicated by arrow 20), a scanning device 21 may be rotated (indicated by arrow 22), or a combination thereof. In this embodiment, a further advantage is the flexibility afforded the end user in selecting useful structures for formation therein or thereon. The dimensions of the strong bond region 6 (i.e., the width) are suitable to maintain mechanical and thermal integrity of the multiple layer substrate 100. Preferably, the dimension of the strong bond region 6 is minimized, thus maximizing the area of weak bond region 5 for structure processing. For example, strong bond region 6 may be about one (1) micron on an eight (8) inch wafer.

Further, debonding of layer 1 from layer 2 may be initiated by other conventional methods, such as etching (parallel to surface), for example, to form an etch through strong bond regions 6. In such embodiments, the treatment technique is particularly compatible, for example wherein the strong bond region 6 is treated with an oxide layer that has a much higher etch selectivity that the bulk material (i.e., layers 1 and 2). The weak bond regions 5 preferably do not require etching to debond layer 1 from layer 2 at the locale of weak bond regions 5, since the selected treatment, or lack thereof, prevented bonding in the step of bonding layer 1 to layer 2.

Alternatively, cleavage propagation may be used to initiate debonding of layer 1 from layer 2. Again, the debonding preferably is only required at the locale of the strong bond regions 6, since the bond at the weak bond regions 5 is limited. Further, debonding may be initiated by etching (normal to surface), as is conventionally known, preferably limited to the locales of regions 4 (i.e., partially or substantially overlapping the strong bond regions 6).

Figure 85:
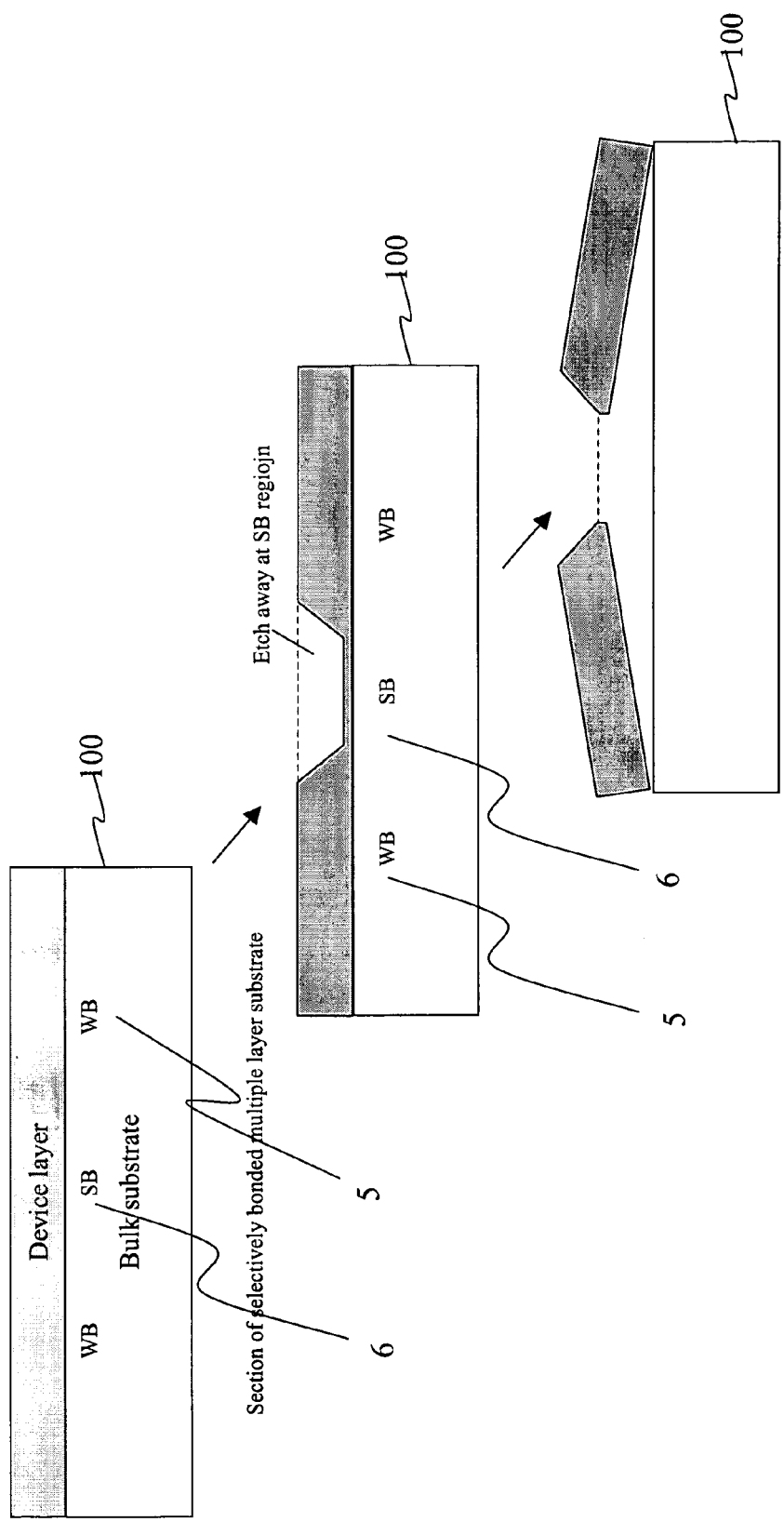
FIG. 85 is a schematic illustration of the debonding technique in accordance with the principles of the invention.

In another embodiment, and referring now to FIG. 85, a method of debonding is shown. The method includes providing a multiple layered substrate 100; processing one or more useful structures (not shown) in the WB regions 5; etching away at the SB regions 6, preferably at a tapered angle (e.g., 45 degrees); subjecting the device layer, preferably only the etched SB region 6, to low energy ion implantation; and peeling or otherwise readily removing the device layer portions at the WB region. Note that while two device layer portions at the WB layer are shown as being removed, it is understood that this may be used to facilitate release on one device layer portion. The tapered edge of the WB region mechanically facilitates removal. Beneficially, much lower ion implant energy may be used as compared to implant energy required to penetrate the original device layer thickness.

Layers 1 and 2 may be the same or different materials, and may include materials including, but not limited to, plastic (e.g., polycarbonate), metal, semiconductor, insulator, monocrystalline, amorphous, noncrystalline, biological (e.g., DNA based films) or a combination comprising at least one of the foregoing types of materials. For example, specific types of materials include silicon (e.g., monocrystalline, polycrystalline, noncrystalline, polysilicon, and derivatives such as $Si_3N_4$, SiC, $SiO_2$), GaAs, InP, CdSe, CdTe, SiGe, GaAsP, GaN, SiC, GaAlAs, InAs, AlGaSb, InGaAs, ZnS, AlN, TiN, other group IIIA–VA materials, group IIB materials, group VIA materials, sapphire, quartz (crystal or glass), diamond, silica and/or silicate based material, or any combination comprising at least one of the foregoing materials. Of course, processing of other types of materials may benefit from the process described herein to provide multiple layer substrates 100 of desired composition. Preferred materials which are particularly suitable for the herein described methods include semiconductor material (e.g., silicon) as layer 1, and semiconductor material (e.g., silicon) as layer 2, other combinations include, but are not limited to; semiconductor (layer 1) or glass (layer 2); semiconductor (layer 1) on silicon carbide (layer 2) semiconductor (layer 1) on sapphire (layer 2); GaN (layer 1) on sapphire (layer 2); GaN (layer 1) on glass (layer 2); GaN (layer 1) on silicon carbide (layer 2); plastic (layer 1) on plastic (layer 2), wherein layers 1 and 2 may be the same or different plastics; and plastic (layer 1) on glass (layer 2).

Layers 1 and 2 may be derived from various sources, including wafers or fluid material deposited to form films and/or substrate structures. Where the starting material is in the form of a wafer, any conventional process may be used to derive layers 1 and/or 2. For example, layer 2 may consist of a wafer, and layer 1 may comprise a portion of the same or different wafer. The portion of the wafer constituting layer 1 may be derived from mechanical thinning (e.g., mechanical grinding, cutting, polishing; chemical-mechanical polishing; polish-stop; or combinations including at least one of the foregoing), cleavage propagation, ion implantation followed by mechanical separation (e.g., cleavage propagation, normal to the plane of structure 100, parallel to the plane of structure 100, in a peeling direction, or a combination thereof), ion implantation followed by heat, light, and/or pressure induced layer splitting), chemical etching, or the like. Further, either or both layers 1 and 2 may be deposited or grown, for example by chemical vapor deposition, epitaxial growth methods, or the like.

An important benefit of the instant method and resulting multiple layer substrate, or thin film derived from the multiple layer substrate is that the structures are formed in or upon the regions 3, which partially or substantially overlap the weak bond regions 5. This substantially minimizes or eliminates likelihood of damage to the useful structures when the layer 1 is removed from layer 2. The debonding step generally requires intrusion (e.g., with ion implantation), force application, or other techniques required to debond layers 1 and 2. Since, in certain embodiments, the structures are in or upon regions 3 that do not need local intrusion, force application, or other process steps that may damage, reparably or irreparable, the structures, the layer 1 may be removed, and structures derived therefrom, without subsequent processing to repair the structures. The regions 4 partially or substantially overlapping the strong bond regions 6 do generally not have structures thereon, therefore these regions 4 may be subjected to intrusion or force without damage to the structures.

The layer 1 may be removed as a self supported film or a supported film. For example, handles are commonly employed for attachment to layer 1 such that layer 1 may be removed from layer 2, and remain supported by the handle. Generally, the handle may be used to subsequently place the film or a portion thereof (e.g., having one or more useful structures) on an intended substrate, another processed film, or alternatively remain on the handle.

One benefit of the instant method is that the material constituting layer 2 is may be reused and recycled. A single wafer may be used, for example, to derive layer 1 by any known method. The derived layer 1 may be selectively bonded to the remaining portion (layer 2) as described above. When the thin film is debonded, the process is repeated, using the remaining portion of layer 2 to obtain a thin film to be used as the next layer 1. This may be repeated until it no longer becomes feasible or practical to use the remaining portion of layer 2 to derive a thin film for layer 1.

Having thus described in detail formation of a selectively bonded multiple layer substrate, formation of three-dimensional integrated circuits now will be described using the selectively bonded multiple layer substrate.

Figure 80:
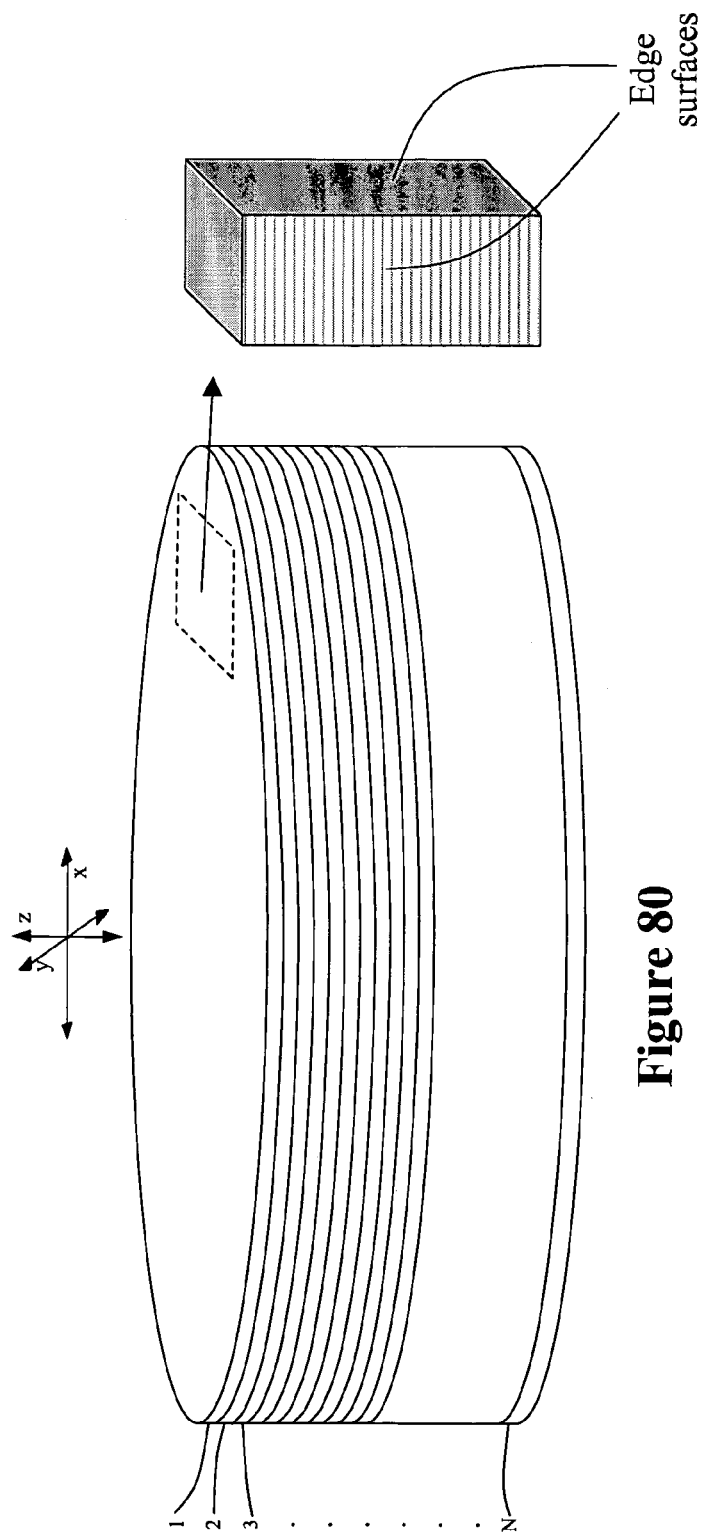
FIG. 80 is an isometric schematic of a stack of layers in accordance with the principles of the invention.

Referring to FIG. 80, an isometric schematic of a stack of 1 ... N wafers and a die cut therefrom is shown. For clarity, coordinates and definitions will be provided. The die and the stack of wafers generally have top and bottom surfaces, and interlayers, extending in the x and y coordinate directions, generally referred to herein as planar directions. Note that the planar directions include any direction extending on the surfaces or interlayers. The several layers are stacked in the z direction, generally referred to herein as vertically or in three dimensions. After die cutting, the die has, in addition to the interlayers and top and bottom surfaces, four edge surfaces extending generally in the z direction.

Figure 33:
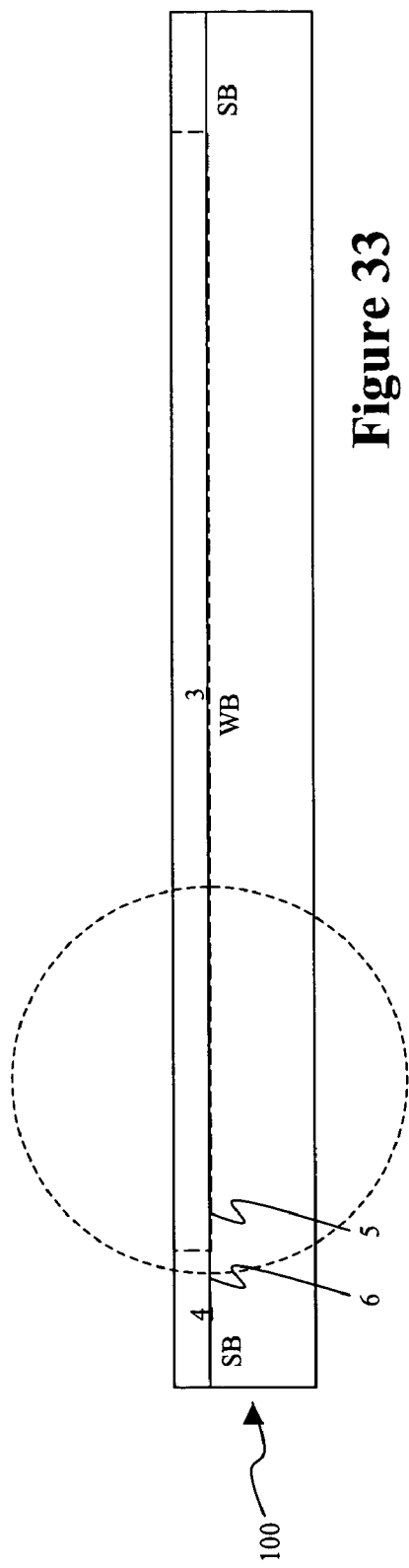
FIG. 33 is a schematic cross-section diagram of debonding techniques for a wafer in accordance with the principles of the invention.

Referring now to FIG. 33, a selectively bonded substrate 100 is provided, having strongly bonded regions 3 and weakly bonded regions 4, as described above. Although the embodiment shown has the strong bonding pattern generally of FIG. 18, it is understood that any pattern of strong bond regions 3 and weak bond regions 4 may be utilized, wherein the circuitry or other useful devices are formed at the weak bond regions as described and mentioned above.

Notably, the present invention is advantageous over aforementioned IBM U.S. Pat. No. 6,355,501 in that various additional functionality may be provided, as well as performance enhancement, while reducing the number of sequential processing steps.

For exemplary purposes, a region is shown with a dashed circle, and alternatives of this region will be described in various exploded views to explain formation of circuit regions suitable for three-dimensional stacking.

Figure 34:
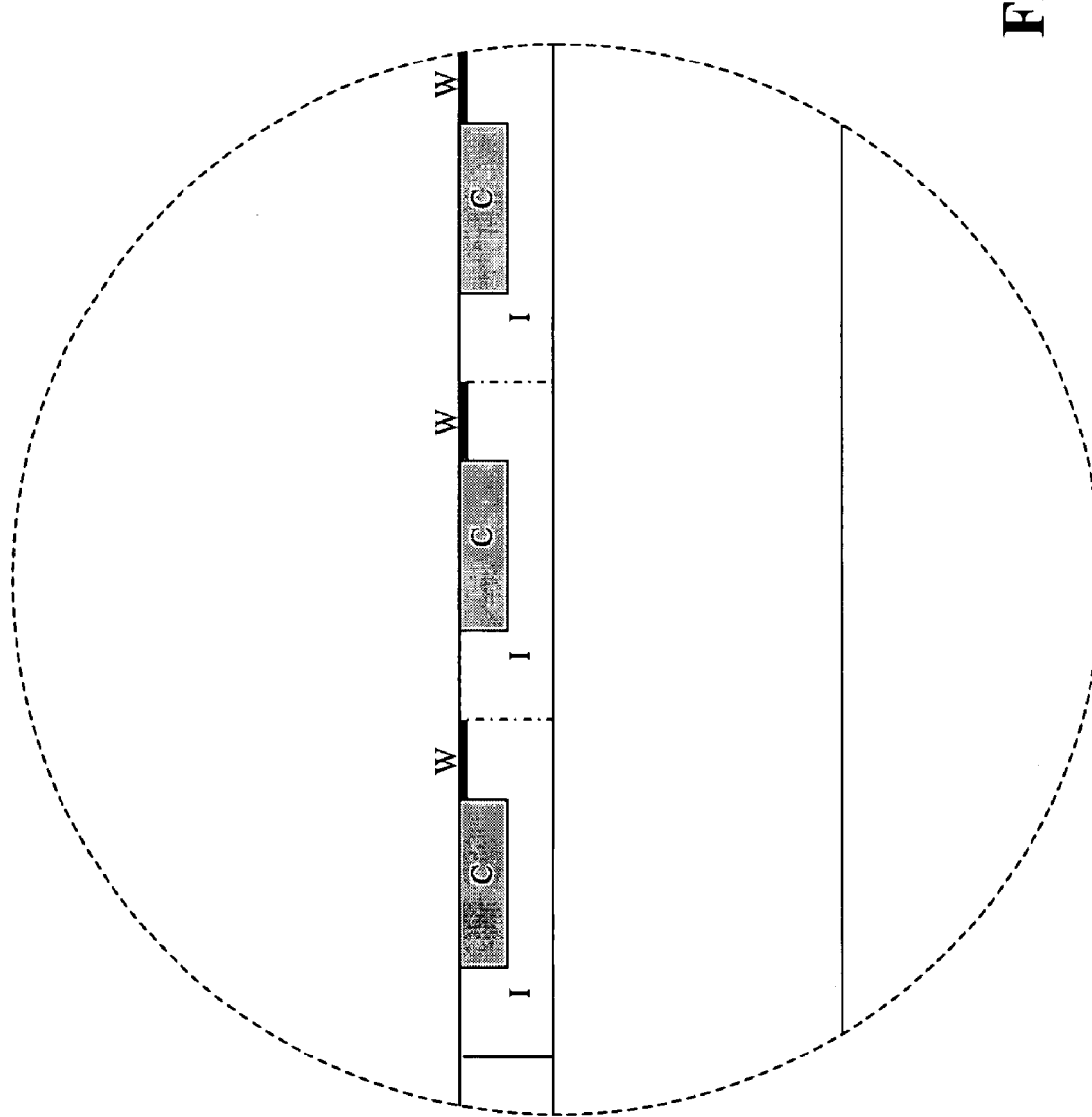
FIG. 34 is a schematic cross-section of a circuit portion in accordance with the principles of the invention.

Referring to FIG. 34, one example of a circuit portion is shown having chip edge interconnect architecture suitable for three-dimensional integration. Further details for edge interconnect architectures may be found in Faris U.S. Pat. Nos. 5,786,629 and 6,355,976, both of which are incorporated by reference herein.

A circuit portion C is formed within an insulating region I of the device layer of the selectively bonded layered substrate. A conductor W, which may be an electrical or an optical conductor, is formed, operably originating at the circuit portion and extending to the edge of the circuit package, represented by the dash-dot lines. The conductor W may extend in any direction generally in the x-y plane. The bulk region serves as mechanical and thermal support during processing of the circuit portion and the conductor.

It should be appreciated that while only a single conductor is shown (in all of the embodiments hereinbefore and hereinafter), a plurality of conductors may be provided associated with each circuit portion extending in any direction generally in the x-y plane. The conductors These conductors may serve to encode each circuit portion with its own address; receive address information from external address lines; bring data and power to each circuit portion; receive data from circuit portions (memory); or other desired functionality. When multiple conductors are used, they may be independent or redundant.

In one embodiment, particularly wherein several independent conductors are formed, overlapping regions are insulated as is known in semiconductor processing.

The circuit portions may be the same or different, and may be formed from various transistor and diode arrangements. These devices include (within the same vertically integrated circuit) the same or different microprocessors (electrical or optical) (bipolar circuits, CMOS circuits, or any other processing circuitry), memory circuit portions such as one-device memory cells, DRAM, SRAM, Flash, signal receiving and/or transmission circuit functionality, or the like. Thus, various products may be formed with the present methods. Integrated products may include processors and memory, or processors, memory signal receiving and/or transmission circuit functionality, for a variety of wired and wireless devices. By integrating vertically (in the z direction), extremely dense chips may improve processing speed or memory storage by a factor of up to N (N representing the total number of integrated layers, and may be in the 10s, 100s or even 1000s in magnitude).

Figure 35:
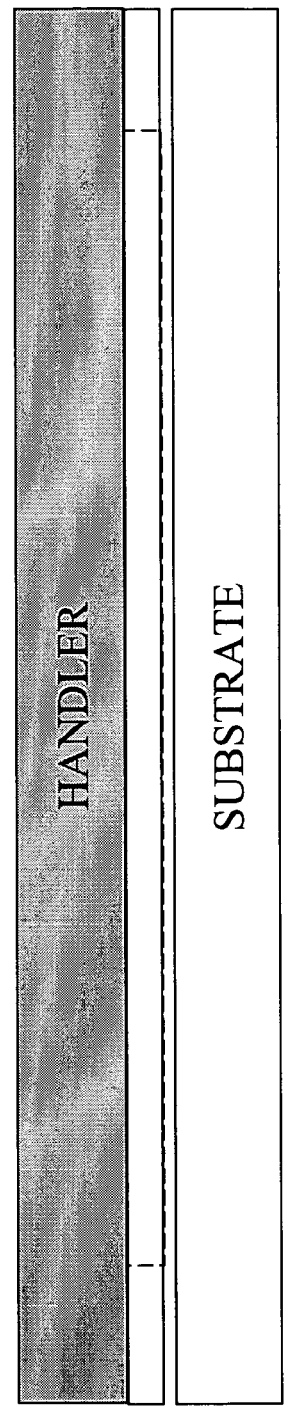
FIG. 35 is a schematic cross-section of a substrate and handler in accordance with the principles of the invention.

Referring to FIG. 35, a handler is used to assist in removal of the device layer. As described above, the strong bond regions generally are subjected to steps to facilitate debonding, such as ion implantation. The device layer may then readily be removed as described above (e.g., with respect to FIGS. 23, 26, 29 and 32) without conventional grinding and other etch-back steps. Since the circuit portions and conductors are formed in weak bond regions, these are generally not damaged during this removal step. In one preferred embodiment, the handler used is that described in PCT patent application Ser. PCT/US/02/31348 filed on Oct. 2, 2002 and entitled "Device And Method For Handling Fragile Objects, And Manufacturing Method Thereof," which is incorporated by reference herein in its entirety.

Figure 36:
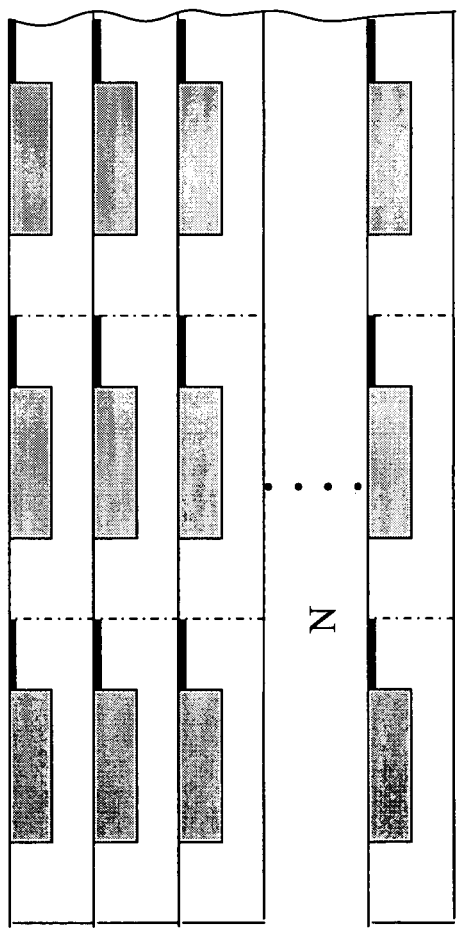
FIG. 36 is a schematic cross-section diagram of circuit portions and conductors aligned and stacked in accordance with the principles of the invention.

The device layer having plural circuit portions and edge extending conductors are then aligned and stacked as shown in FIG. 36 and described in further detail herein. The layers are aligned and stacked such that plural circuit portions form a vertically integrated stack. Depending on the desired vertically integrated device, the circuit portions for each layer may be the same or different.

In a preferred embodiment, the N layers are stacked, and subsequently all N layers are bonded in a single step. This may be accomplished, for example, by using UV or thermal cured adhesive between the layers. Note that, since interconnects are at the edges of each chip, in certain embodiments it may not be detrimental to expose the circuit portion itself to adhesive, though not required, which may reduce processing steps and ultimately cost.

Figure 37:
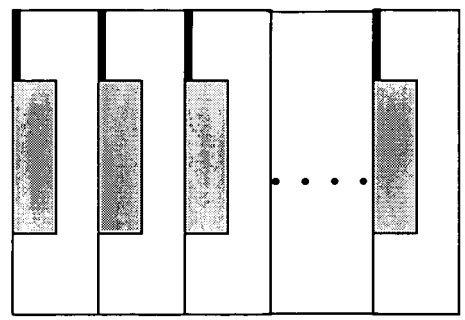
FIG. 37 is a schematic cross-section diagram of circuit portions and conductors aligned and stacked in accordance with the principles of the invention.

Referring now to FIG. 37, each stack of circuit portions are diced according to known techniques. In the event that the dicing does not provide a smooth, planar edge, the wiring edge may be polished to expose the conductors for each circuit portion.

Figure 38:
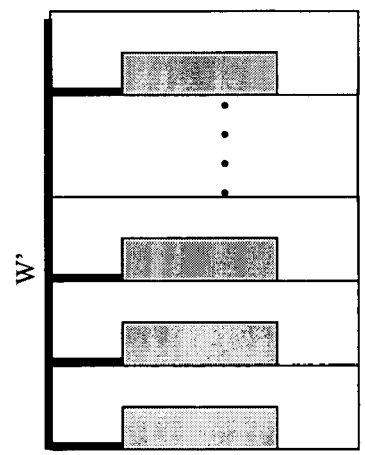
FIG. 38 is a schematic cross-section diagram of circuit portions and conductors aligned and stacked in accordance with the principles of the invention.

FIG. 38 shows edge interconnection of the plural circuit portions with a conductor W' (electrical or optical). This may be accomplished by masking and etching a deposited thin-film of conducting material in a well known manner to electrically contact the conductor of each circuit portion. Other interconnection schemes are described in more detail in the aforementioned U.S. Pat. Nos. 5,786,629 and 6,355,976.

Of notable importance is that the edge interconnects can provide functionality during processing of the vertically integrated chip and in the end product (the vertically integrated chip). During processing, the edge interconnects may be used for diagnostic purposes. Malfunctioning circuit portions may then be avoided during interconnection of the plural circuit portions. Alternatively, such malfunctioning circuit portions may be repaired. As a still further alternative, a stack of N circuit portions may be reduced (i.e., cut horizontally along the plane of the circuit portion) to eliminate the malfunctioning circuit portion, providing two or more stacks less than N. This may dramatically increase overall yield of known good dies (KGD), as instead of discarding a stack N with one or more malfunctioning circuit portions, two or more stacks each having less than N circuit portion layers may be used for certain applications.

Referring back to FIG. 38, in an alternative embodiment, a vertically integrated stack of edge interconnects can provide vertical integration with a second vertically integrated chip of the invention. As can be seen in FIG. 38, the integrated stack of edge interconnects is rotated about its vertical axis to form, in effect, a wiring stack. By bonding the rotated integrated stack of edge interconnects to the second vertically integrated chip, wiring flexibility can be achieved. For instance, the rotated integrated stack of edge interconnects can provide more than one layer of wiring flexibility on a horizontal scale. This is useful, for instance, with control circuitry needed for a massive data storage chip where multiple address lines and control circuitry is required for addressability and control.

In a further embodiment, edge interconnects may be used for massive storage addressing (MSA), for example as described in aforementioned U.S. Pat. No. 6,355,976.

Figure 39:
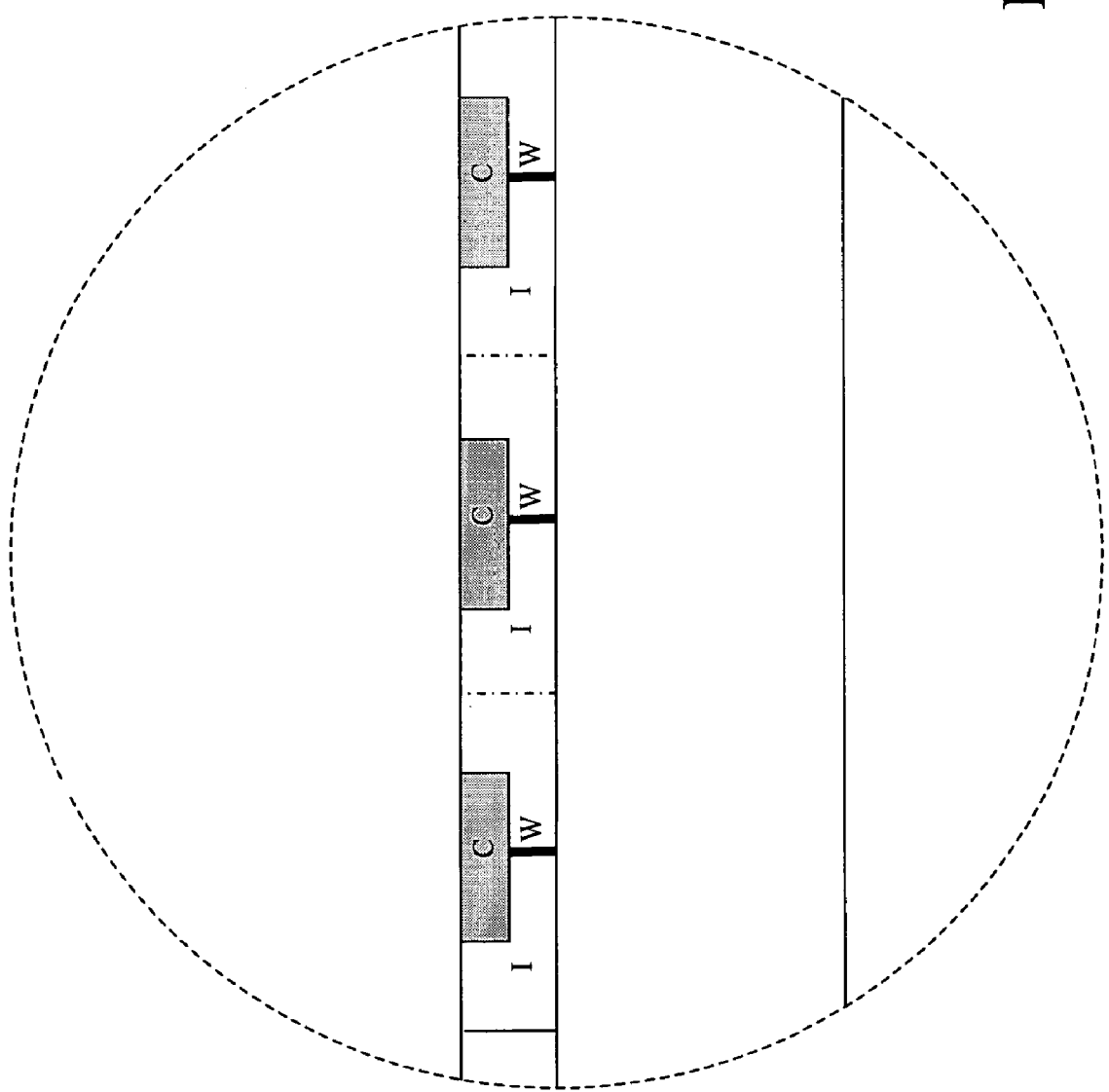
FIG. 39 is a schematic cross-section diagram of circuit portions in accordance with the principles of the invention.

Referring to FIG. 39, another example of a circuit portion is shown, having through interconnect architecture suitable for three-dimensional integration. A circuit portion C is formed within an insulating region I of the device layer of the selectively bonded layered substrate. A conductor W, which may be an electrical or an optical conductor, is formed, operably originating at the circuit portion and extending to the bottom of the device layer of the multiple layer substrate. Each circuit package is represented by the dash-dot lines. The bulk region serves as mechanical and thermal support during processing of the circuit portion and the conductor. The conductors W (a plurality of which may be associated with each circuit portion, as mentioned above) may extend to the edge of the bottom of the device layer, or alternatively may extend in the direction of the edge of the bottom of the device layer, whereby polishing steps are performed to expose the conductors for vertical interconnect.

A handler then may be utilized to remove the device layer, generally as shown in FIG. 35.

Figure 40:
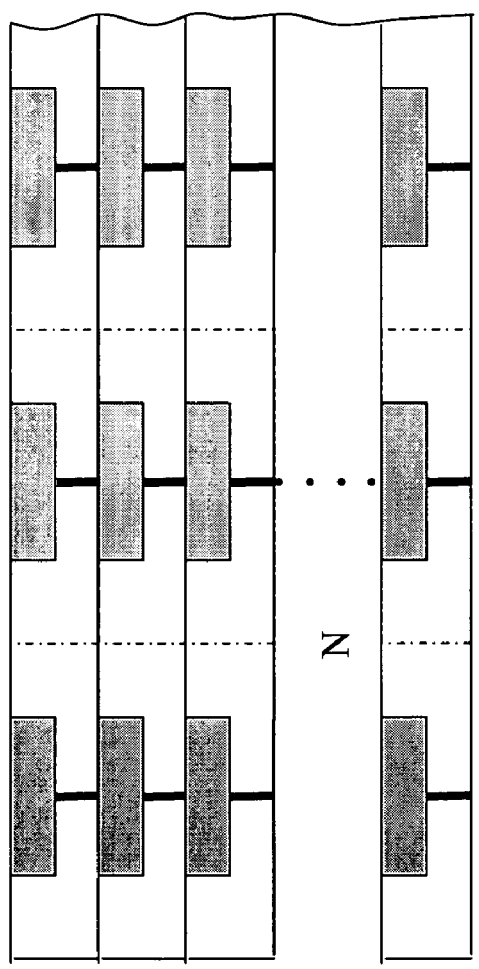
FIG. 40 is a schematic cross-section diagram of circuit portions and conductors aligned and stacked in accordance with the principles of the invention.

The device layer having plural circuit portions and through conductors are then aligned and stacked as shown in FIG. 40 and described in further detail herein. The layers are aligned and stacked such that plural circuit portions form a vertically integrated stack. Depending on the desired vertically integrated device, the circuit portions for each layer may be the same or different.

In a preferred embodiment, the N layers are stacked, and subsequently all N layers are bonded in a single step. This may be accomplished, for example, by using UV or thermal cured adhesive between the layers. To avoid contact problems between vertical layers, adhesive at the contacts should be avoided.

Figure 41:
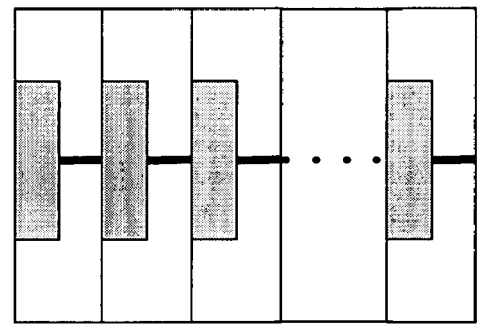
FIG. 41 is a schematic cross-section diagram of circuit portions and conductors aligned and stacked in accordance with the principles of the invention;.

As best shown in FIG. 41, each stack of circuit portions is diced according to known techniques.

Figure 42:
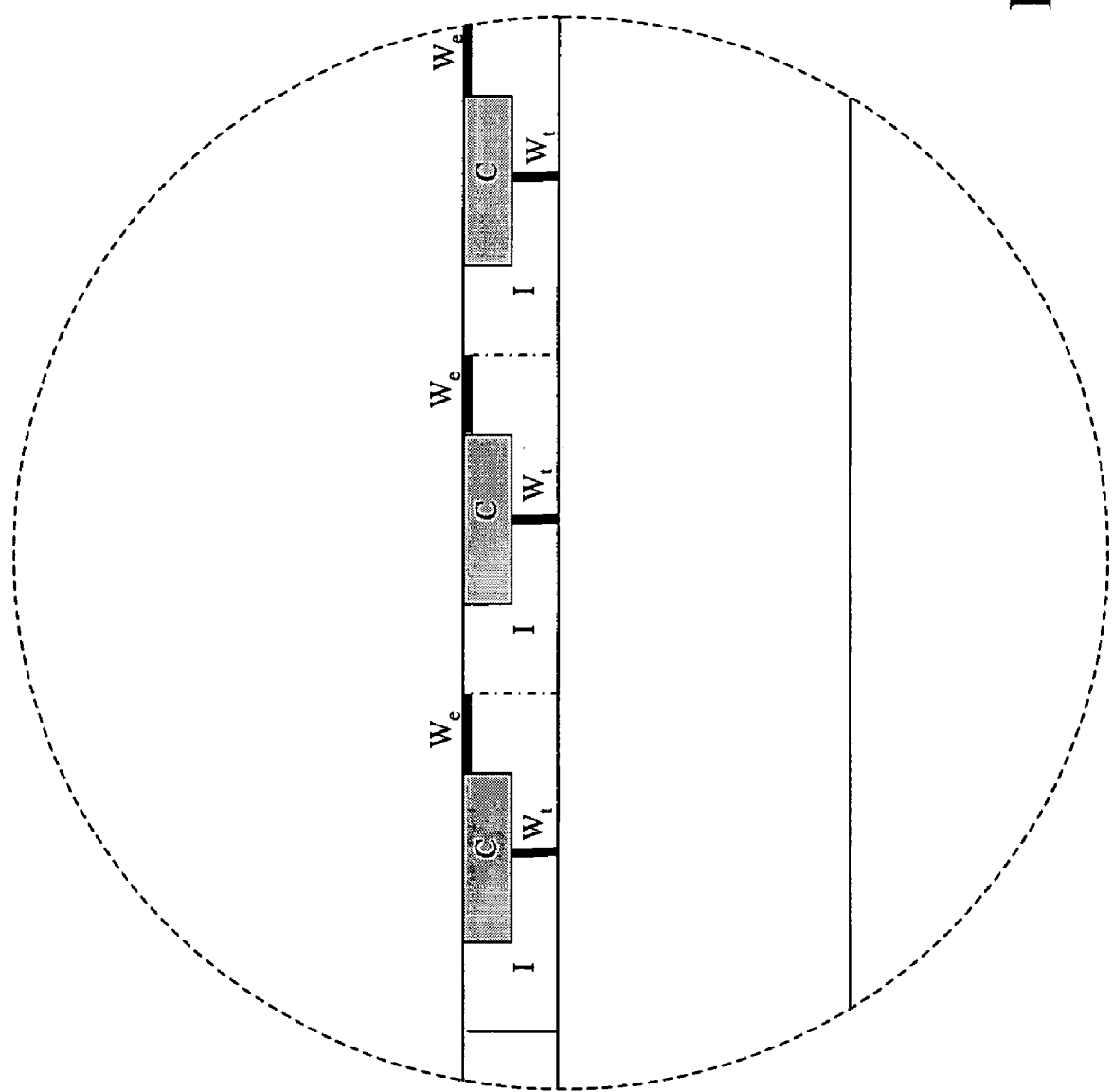
FIG. 42 is a schematic cross-section diagram of circuit portions in accordance with the principles of the invention.

Referring to FIG. 42, another example of a circuit portion is shown, having a hybrid edge interconnect and through interconnect architecture suitable for three-dimensional integration. A circuit portion C is formed within an insulating region I of the device layer of the selectively bonded layered substrate. A conductor $W_t$, which may be an electrical or an optical conductor, is formed, operably originating at the circuit portion and extending to the bottom of the device layer of the multiple layer substrate. It will be understood that $W_t$ may also be a mechanical coupler for use in, for example, a MEMS device. Another conductor $W_e$ is provided operably originating at the circuit portion and extending to the edge of the circuit package, represented by the dash-dot lines. The bulk region serves as mechanical and thermal support during processing of the circuit portion and the conductor. The conductors $W_t$ (a plurality of which may be associated with each circuit portion, as mentioned above) may extend to the edge of the bottom of the device layer, or alternatively may extend in the direction of the edge of the bottom of the device layer, whereby polishing steps are performed to expose the conductors for vertical interconnect. It will be understood that the $W_t$ and $W_e$ can be fabricated to predetermined locations along the wafer so that edge extending conductors can be fabricated anywhere along the wafer edge.

Figure 43:
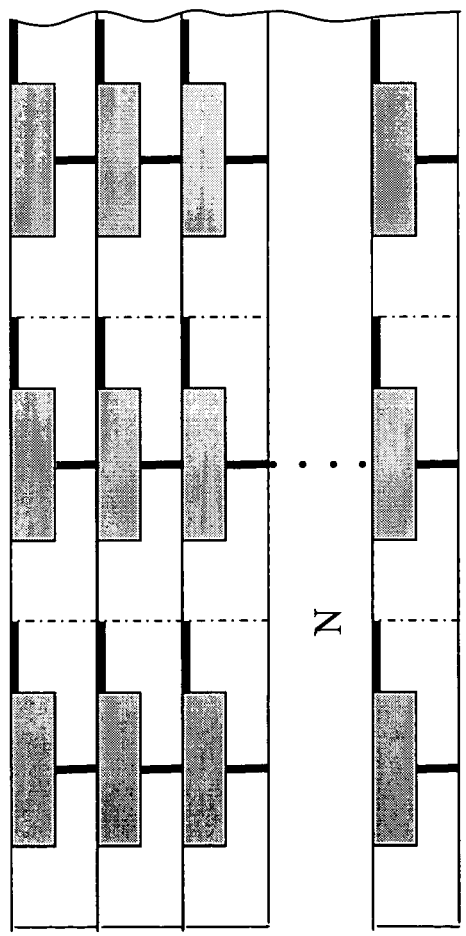
FIG. 43 is a schematic cross-section diagram of circuit portions and conductors aligned and stacked in accordance with the principles of the invention.

A handler then may be utilized to remove the device layer, generally as shown in FIG. 35. The device layer having plural circuit portions and edge extending conductors are then aligned and stacked as shown in FIG. 43 and described in further detail herein. The layers are aligned and stacked such that plural circuit portions form a vertically integrated stack. Depending on the desired vertically integrated device, the circuit portions for each layer may be the same or different.

In a preferred embodiment, the N layers are stacked, and subsequently all N layers are bonded in a single step bonded. This may be accomplished, for example, by using UV or thermal cured adhesive between the layers.

Figure 44:
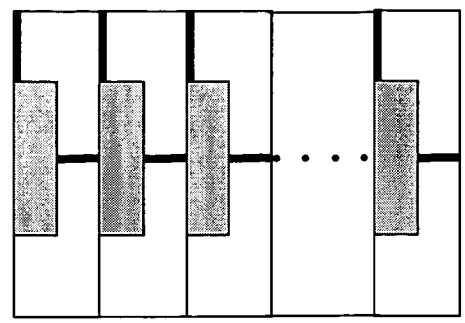
FIG. 44 is a schematic cross-section diagram of circuit portions and conductors aligned and stacked in accordance with the principles of the invention.

Referring now to FIG. 44, each stack of circuit portions are diced according to known techniques. In the event that the dicing does not provide a smooth, planar edge, the wiring edge may be polished to expose the conductors $W_e$ for each circuit portion.

Figure 45:
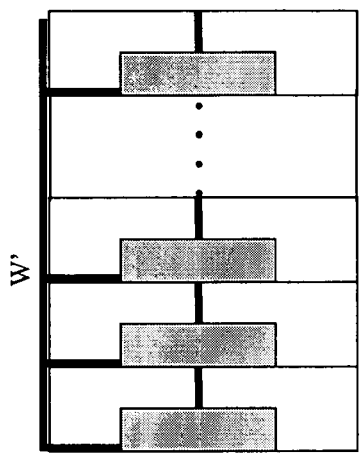
FIG. 45 is a schematic cross-section diagram of circuit portions and conductors aligned and stacked in accordance with the principles of the invention.

FIG. 45 shows one aspect of the overall interconnection, the edge interconnection of the plural circuit portions with a conductor W' (electrical or optical). This may be accomplished by masking and etching a deposited thin-film of conducting material in a well known manner to electrically contact a conducting portion of each circuit portion. Other interconnection schemes are described in more detail in the aforementioned U.S. Pat. Nos. 5,786,629 and 6,355,976. Note that when both edge and through interconnects are used, one or both types may be used to interconnect the circuit portions. The different interconnects may be redundant or independent. Alternatively, the edge interconnects may be provided mainly for diagnostic purposes, as described above. In a further alternative embodiment, both types of interconnect may be used to provide redundancy, thereby reducing the likelihood of vertically integrated chip malfunctions due to interconnect between chip portions.

To form the through conductors (as shown in FIGS. 39 and 42), each through conductor for each chip portion may first be formed (e.g., by etching a hole and filling the hole with conductive material), and the circuit portion subsequently formed atop the conductor.

Alternatively, and referring to FIG. 46, the circuit portion C may be formed first on or in the device layer, and the through conductor W extending from the top of the circuit portion to the top of the device layer. The region above the circuit portion may be processed to provide the conductor W and insulating material I (e.g., the same material as the insulator for optimal compatibility) as shown.

Referring now to FIG. 47 where like reference characters refer to same structures as in previous FIG. 46, another optional feature to enhance interconnection of the vertical circuit portions is shown. Generally at the top of each circuit portion, a conductor $W_b$ is provided. This conductor $W_b$ serves to optimize conduction from the through conductor $W_t$ of the layer above upon stacking. This conductor may comprise solidified material such that the contact derived upon stacking is sufficient to provide contact between layers. Alternatively, the conductor $W_b$ may comprise a solder bump, such that adjacent conductors may be joined by heating. Further alternatively, the conductor $W_b$ may comprise electrical connection between adjacent circuit portions. Still further, the conductor $W_b$ may comprise optical waveguides for purely optical connections. The joinder of the conductors may be accomplished as each layer is stacked, or preferably after all N layers have been stacked so as to minimize detriment to conducting connections caused by several reflow operations, as described in the aforementioned IBM U.S. Pat. No. 6,355,501.

In another method to form the through conductors (shown in FIGS. 39 and 42), and referring now FIGS. 48–50, separate device layers may form the circuit portion layer. Referring to FIG. 48 there is shown a device layer having circuit portions each having a conductor $W_b$ intended for contact with another device layer having the through contacts. The conductor $W_b$ may have a solder bump or a solidified permanent conductor. Note that a second conductor $W_b$ portion may be provided as described hereinabove with reference to FIG. 47 for conduction from the through conductor $W_t$ of the layer above upon stacking. FIG. 49 shows a device layer having through connects $W_t$. The layers may be stacked, bonded, and electrical contacts joined, as shown in FIG. 50 to provide a sub-stack comprising the circuit portion layer and the conductor layer.

Figure 51:
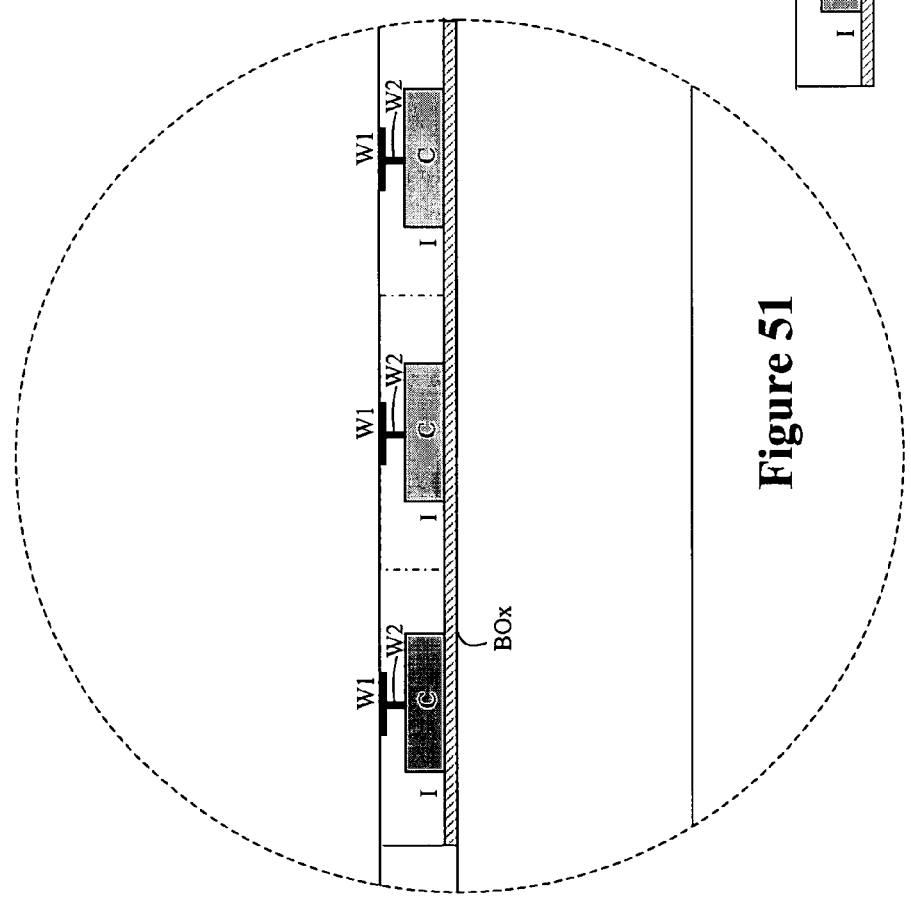
FIG. 51 is a schematic cross-section diagram of circuit portions and conductors aligned and stacked in accordance with the principles of the invention.

Referring now to FIG. 51, an alternative circuit portion layer is shown. A buried oxide layer (BOx) is formed in the device layer generally at the interface of the bulk substrate and the device layer. This buried oxide layer may be formed by various methods known in the art, such as ion implantation of $O^+$ ions. Further, the buried oxide layer may be formed before or after the device layer is selectively bonded to the bulk substrate.

In embodiments where the buried oxide layer is formed before the device layer is selectively bonded to the bulk substrate, a $SiO_x$ layer may be formed at the surface of the device layer prior to selective bonding to the bulk substrate. The device layer is then selectively bonded to the bulk substrate. Note that it may be desirable to treat the oxide layer prior to bonding to enhance strong bonding.

In embodiments where the buried oxide layer is formed after the device layer is selectively bonded to the bulk substrate, the device layer may be, for example, oxygen implanted to form the oxide layer at the desired depth, i.e., at the interface of the bulk substrate and the device layer. It may be desirable to mask the intended strong bond regions of the device layer to locally prevent oxidation of the strong bond regions.

After formation of the buried oxide layer, circuit portions C are formed adjacent the buried oxide layer in the weak bond region of the device layer. Conductors W2 are formed (e.g., deposited) in electrical or optical contact with the circuit portions, and conductors W1 are in electrical or optical contact with the conductors W2. Note that conductors W1 and W2 may be formed in one step, or in plural steps. Also, while the conductors W1 and W2 are shown to form a T shape, these conductors (or a single conductor serving the same purpose) may be L-shaped, rectangular, or any other suitable shape.

Figure 52:
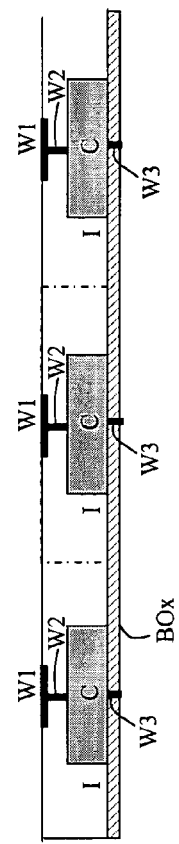
FIG. 52 is a schematic cross-section diagram of circuit portions and conductors aligned and stacked in accordance with the principles of the invention.

After the device layer is removed from the bulk substrate (as described above), the buried oxide layer is then exposed. As shown in FIG. 52, a region of the buried oxide layer may be etched away, and a through conductor W3 formed therein. This conductor W3 serves to interconnect with a conductor W1 of an adjacent device layer upon stacking.

While the described method is similar in some aspects to those taught in aforementioned IBM U.S. Pat. No. 6,335,501 on a chip scale, the present method has several advantages. In the aforementioned IBM U.S. Pat. No. 6,335,501, the removal of the bulk substrate is exclusively by grinding and etch back, whereas in the present method, peeling or other easy removal methods are possible due to the formation of the circuit portions on the weak bond regions and the existence of the strong bonding regions for supporting the layer to the bulk support substrate, as described above. Further, the present method is attainable on a wafer scale. Satisfactory yields may result by testing the layers, and subsequently utilizing the stacks of N layers, and those stacks having less than N layers, as described above.

Referring now to FIG. 53, an embodiment of an alternative circuit portion layer and associated conductors is shown. A buried oxide layer (BOx) is formed in the device layer generally at the interface of the bulk substrate and the device layer. A conductor is formed on the BOx at the region where the circuit portion is to be formed. The circuit region is formed, and conductors W2 and W3 (or an integral conductor) is formed atop the circuit portion. Note that the conductor (or conductor portion) W1 is formed with tapered edges and a protruding ventral portion.—this serves to, among other things, facilitate alignment and enhance mechanical integrity of the conductor.

Referring now to FIG. 54, after the device layer is removed from the bulk substrate (as described above, preferably by peeling), the buried oxide layer is then exposed (e.g., etched away) to form W3 regions. Preferably, these regions match the shape and size of the tapered edged conductor or conductor portion W1.

As shown in FIG. 55, a solder plug is provided to ultimately form the conductor W3, in the W3 region. This conductor W3 serves to interconnect with a conductor W1 of an adjacent device layer upon stacking, as shown in FIG. 56.

In one embodiment, the stacked layers may be reflowed as the layers are stacked. In a preferred embodiment, the entire stack is subject to reflow processing after N layers are formed. In still another embodiment, the stack may be reflowed in sections.

It will be noted that the shape and taper of the conductors W1 and W3 of separate layers further serve to assist in mechanically aligning the stacked layers.

Figure 64:
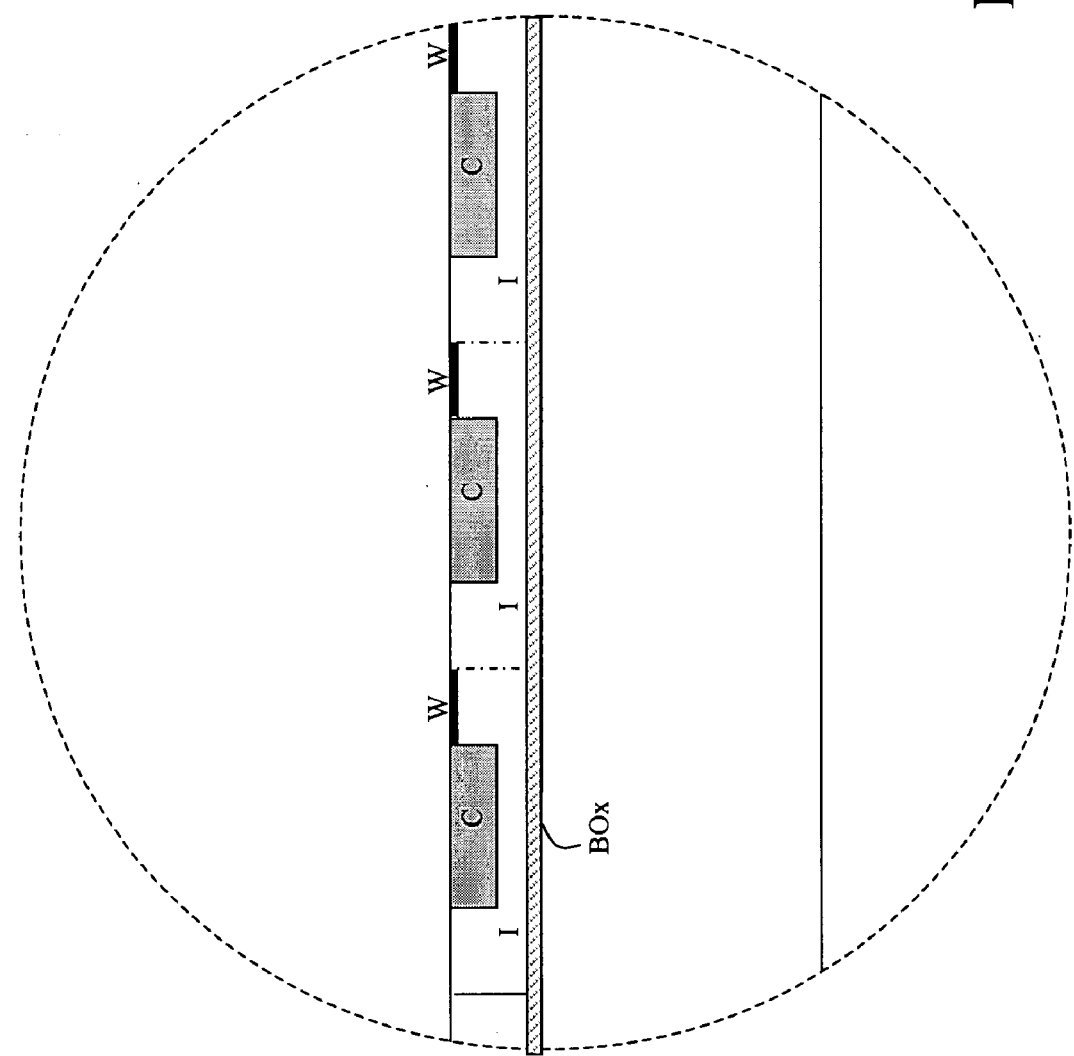
FIG. 64 is a schematic cross-section diagram of circuit portions aligned and stacked in accordance with the principles of the invention.

Referring now to FIG. 64, a further embodiment of a device layer for forming a three-dimensional circuit or memory device is shown. A buried oxide layer (BOx) is formed in the device layer generally at the interface of the bulk substrate and the device layer. This buried oxide layer may be formed by various methods known in the art. Further, the buried oxide layer may be formed before or after the device layer is selectively bonded to the bulk substrate. Note that the device layer having the BOx layer may be removed as described above to derive a "raw" SOI wafer layer that may be provided to a customer or stored for later processing. In embodiments where the buried oxide layer is formed before the device layer is selectively bonded to the bulk substrate, an a $SiO_2$ layer may be formed at the surface of the device layer prior to selective bonding to the bulk substrate. The device layer is then selectively bonded to the bulk substrate. Note that it may be desirable to treat the oxide layer prior to bonding to enhance strong bonding, or to mask the intended strong bond regions of the device layer to locally prevent oxidation.

In embodiments where the buried oxide layer is formed after the device layer is selectively bonded to the bulk substrate, the device layer may be, for example, oxygen implanted to form the oxide layer at the desired depth, i.e., at the interface of the bulk substrate and the device layer.

After formation of the buried oxide layer, circuit portions C are formed adjacent the buried oxide layer in the weak bond region of the device layer. One or more conductors W are formed (e.g., deposited) in electrical or optical contact with the circuit portions, and may extend to any dimensional edge of the chip, as described above.

After the device layer is removed from the bulk substrate (as described above), the buried oxide layer is then exposed. The BOx layer may serve as a transparent insulator layer, and may serve to shield one layer from another when layers are stacked, as described herein. Further, the Box layer provides a ready insulator for use in isolating circuit portions or to provide noise shielding among the conductors. Further, holes may be etched in the BOx layer, as described above with reference to, e.g., FIGS. 52 and 54, and as described in the aforementioned IBM U.S. Pat. No. 6,355,501.

Figure 57:
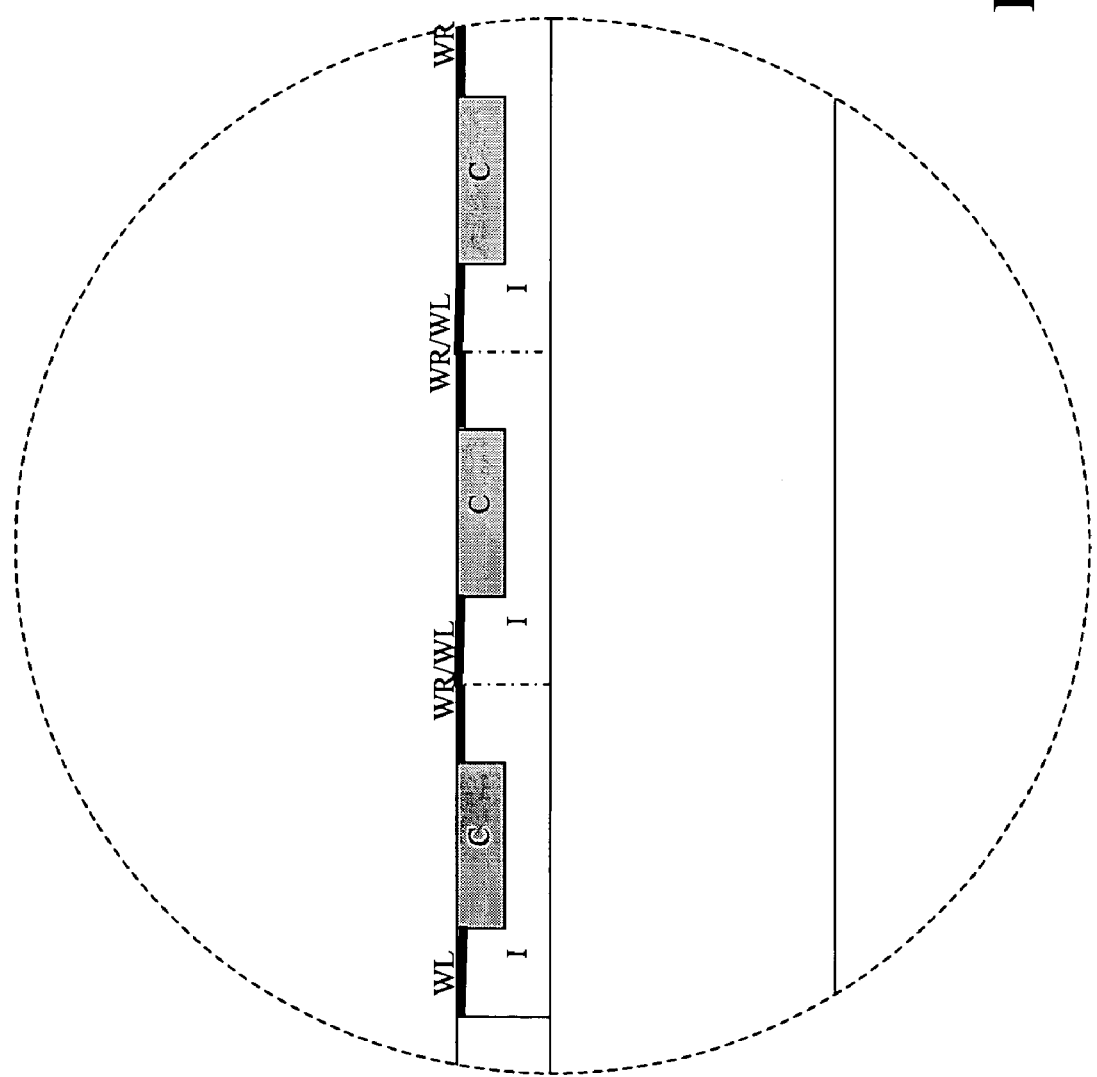
FIG. 57 is a schematic cross-section diagram of circuit portions and conductors aligned and stacked in accordance with the principles of the invention.

Referring back to FIG. 57, another example of a circuit portion is shown having chip edge interconnect architecture suitable for three-dimensional integration. Further details for edge interconnect architectures may be found in the aforementioned Faris U.S. Pat. Nos. 5,786,629 and 6,355,976. In this embodiment, a circuit portion C is formed within an insulating region I of the device layer of the selectively bonded layered substrate. Here, conductors are formed on multiple edges of each circuit portion, represented as WL, WR and WR/WL. Note, however, that conductors may also or optionally extend in directions perpendicular to the layer in all directions (e.g., to all four major edges of the circuit portion).

Figure 58:
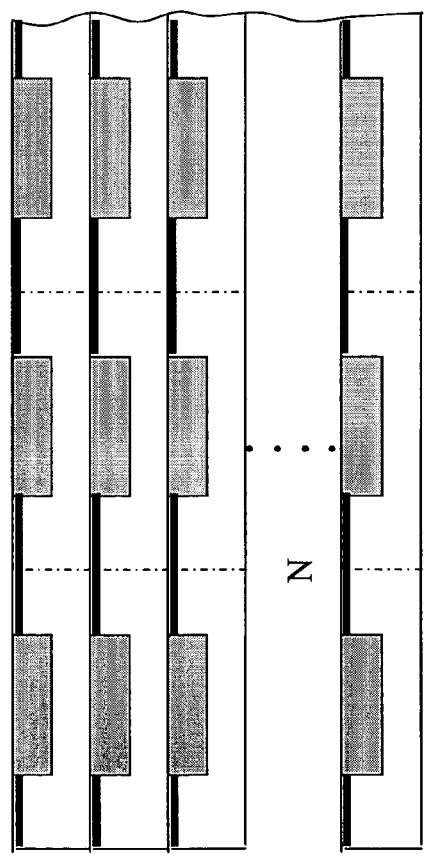
FIG. 58 is a schematic cross-section diagram of circuit portions aligned and stacked in accordance with the principles of the invention.

The device layer having plural circuit portions and multiple edge extending conductors are then aligned and stacked as shown in FIG. 58. The layers are aligned and stacked such that plural circuit portions form a vertically integrated stack. Depending on the desired vertically integrated device, the circuit portions for each layer may be the same or different. Further, although edge interconnects are shown on each layer, it is contemplated that certain layers may have one, two, three or four edge interconnects. It is further contemplated that some layers may have only through interconnects (one or more). It is still further contemplated that some layers may have one, two, three or four edge interconnects and one or more through interconnects. In a preferred embodiment, the N layers are stacked, and subsequently all N layers are bonded in a single step. This may be accomplished, for example, by using UV or thermal cured adhesive between the layers. Note that, since interconnects are generally at the edges of each chip, in certain embodiments it may not be detrimental to expose the circuit portion itself to adhesive, though not required, which may reduce processing steps and ultimately cost.

Figure 59:
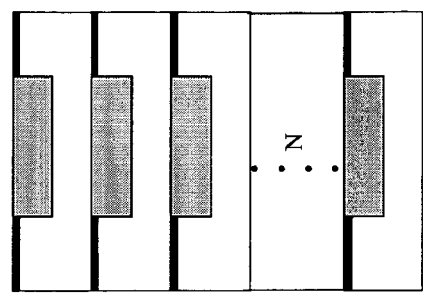
FIG. 59 is a schematic cross-section diagram of circuit portions aligned and stacked in accordance with the principles of the invention.

Referring now to FIG. 59, each stack of circuit portions are diced according to known techniques. In the event that the dicing does not provide a smooth, planar edge, the wiring edge may be polished to expose the conductors for each circuit portion.

Figure 60:
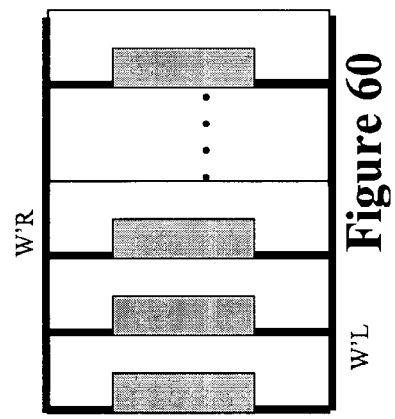
FIG. 60 is a schematic cross-section diagram of edge interconnections and circuit portions in accordance with the principles of the invention.

Referring to FIG. 60 there is shown edge interconnection of the plural circuit portions with conductors W'R and W'L (electrical or optical), although it is contemplated that some or all layers may also have edge interconnects perpendicular to the page (to and/or fro). This may be accomplished by masking and etching a deposited thin-film of conducting material in a well known manner to electrically contact the conductor of each circuit portion. Other interconnection schemes are described in more detail in the aforementioned U.S. Pat. Nos. 5,786,629 and 6,355,976.

Of importance is that the edge interconnects can provide functionality during processing of the vertically integrated chip and in the end product (the vertically integrated chip). During processing, the edge interconnects may be used for diagnostic purposes. Various options are available. For example, one or more of the edge interconnects may be for diagnosis and the other(s) for power, data, memory access, or other functionality of the individual circuit portion. One or more of the edge interconnects may be redundant, to improve device yield. The edge interconnects may independently access different areas of the circuit portion for increased functionality. Massive storage addressing is also capable, as customized interconnects may be provided in high density storage devices.

Figure 62:
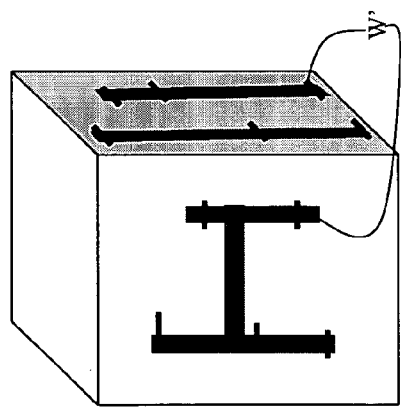
FIG. 62 is a schematic cross-section of edge interconnections in accordance with the principles of the invention.
Figure 61:
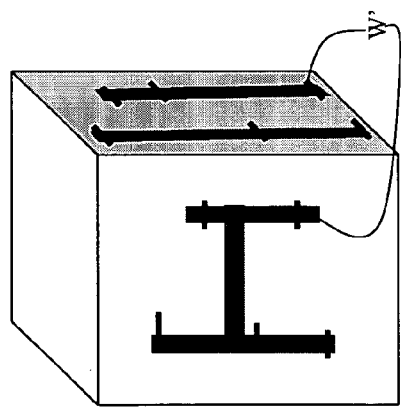
FIG. 61 is a schematic cross-section of edge interconnections in accordance with the principles of the invention.

FIG. 61 shows an isometric view of a vertically integrated chip, shown without interconnects W'. FIG. 62 shows a possible vertically integrated chip shown with interconnects W. Note that various combinations of interconnections W' may be provided, depending on the desired functionality. The use of one, two, three or four edges, as well as optional through conductors (e.g., at the top and bottom layers of the stack), further allows for orders of magnitude more interconnect locations (as compared to through interconnects alone) and very high traffic interconnect, using up to all 6 sides (or more if other geometries are provided) of the three dimensional vertically integrated chip. Further, multiple conductors may extend from each edge, e.g., associated with different portions of the circuit portion at the particularly layer, or redundant.

Figure 63:
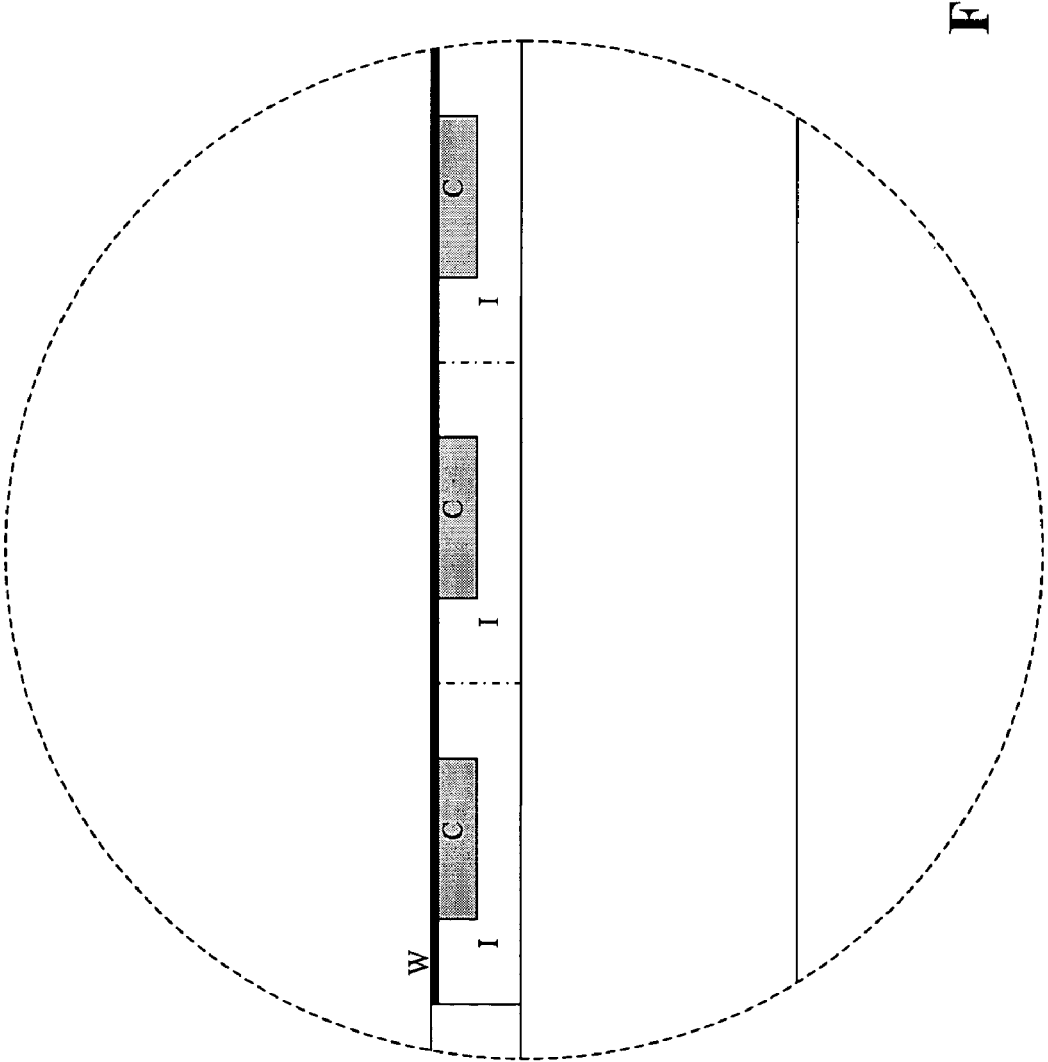
FIG. 63 is a schematic cross-section diagram of circuit portions aligned and stacked in accordance with the principles of the invention.

Referring to FIG. 63, another example of a circuit portion is shown having chip edge interconnect architecture suitable for three-dimensional integration. In this embodiment, a circuit portion C is formed within an insulating region I of the device layer of the selectively bonded layered substrate. Here, one or more conductors are formed across the surface of the device layer atop the circuit portions. Generally, the portions extending (right and left as shown in the FIG. 63) across the chip portion are provided for redundancy, to increase yield in the event that one side malfunctions or is not able to be interconnected in fabrication of the vertically integrated chip. Note that, as described above, multiple conductors may be provided across the wafer, e.g., to access different regions of the circuit portions.

Figure 82:
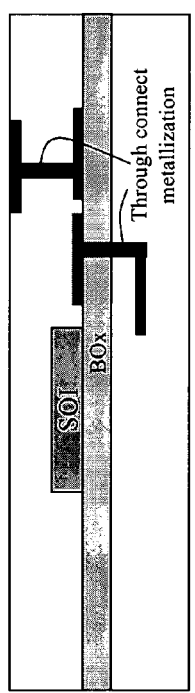
FIG. 82 is a schematic isometric illustration of the metalization in the prior art.
Figure 81:
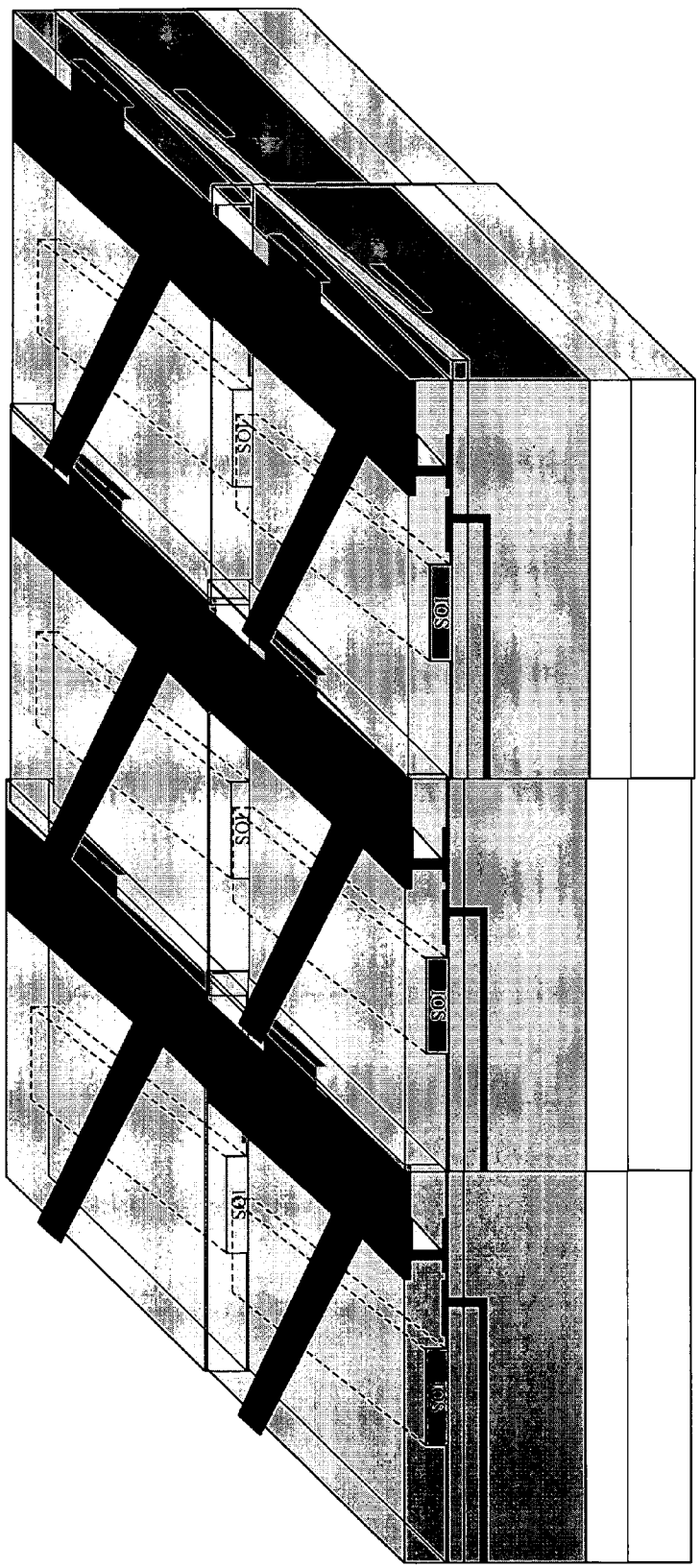
FIG. 81 is a schematic isometric illustration of the metalization in accordance with the principles of the invention.

Referring now to FIGS. 81 and 82, a comparison of the present invention (FIG. 81) with the method disclosed of aforementioned IBM Patent No. 6,355,501 (FIG. 82). FIG. 82 (IBM) shows a SOI device on a BOx layer. Metalization is provided only in the Z direction, i.e., vertical through connects, at the top and bottom of the SOI device. Notably, with the present invention, edge interconnect is provided as shown, and, as described above, inter alia, provides enhanced device efficiency, reduces overall processing steps, and allows for improved functionality such as diagnostic and enhanced and simplified interconnections.

In certain embodiments, it may be desirable to enhance the interconnect of wafer scale or chip scale stacked devices described herein, by increasing size (contact area), conductivity (reducing resistivity), or both.

Figure 83:
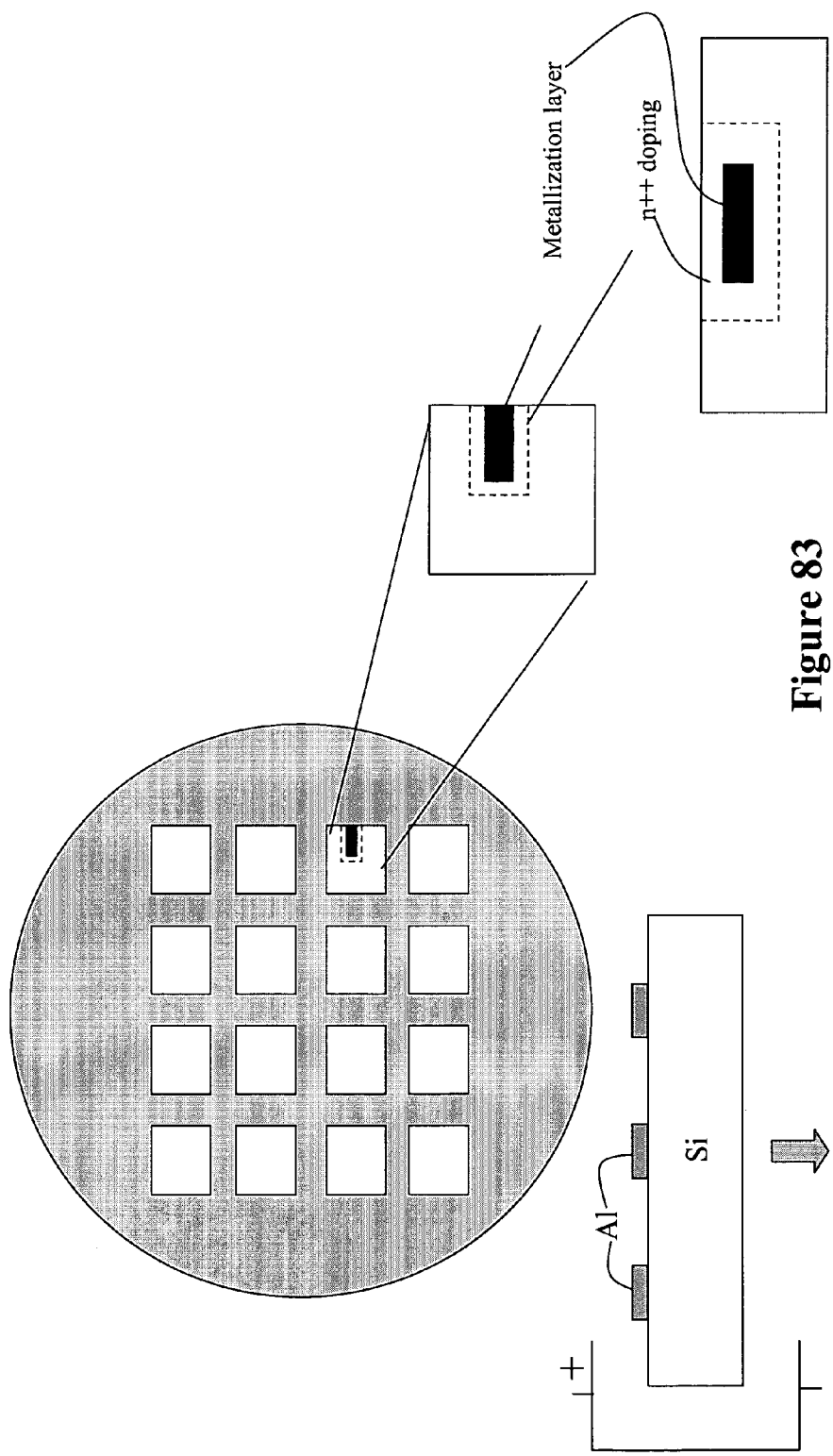
FIG. 83 is a schematic illustration of the metalization in accordance with the principles of the invention.
Figure 84:
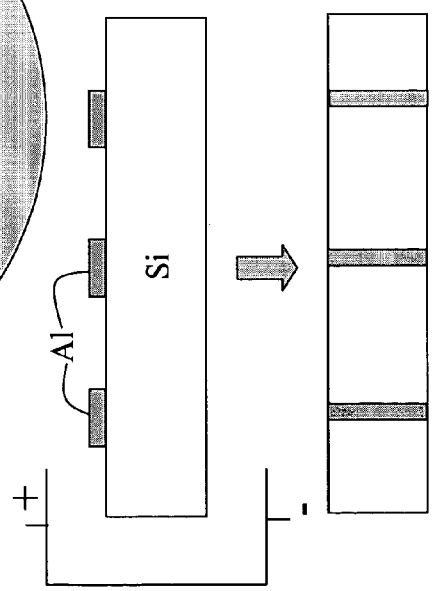
FIG. 84 is a schematic illustration of the metalization in accordance with the principles of the invention.

Referring now to FIG. 83, one embodiment of enhancing edge interconnect conductivity is shown. In general, ion implantation provide excessive doping (n++ or p++) in the region of the (e.g., under) metalization layer. Such n++or p++doping is known in the art. Thus, interconnects provided in this manner enhance overall conductivity, e.g., for connecting to edge exposed conductors. This step may occur before or after metalization, and generally before the device layer including circuit portions having metalization is removed (or before individual devices are removed).

In another method to form interconnects, particularly through interconnects, thermo-electric migration processing may be used. Aluminum or other suitable conductive metal capable of thermo-electric migration is deposited on top of a silicon layer. Upon application of an electrical field at elevated temperatures (e.g., above 200 C), aluminum migrates through the substrate providing a conductive path. This process may be used to form through interconnects of at least up to 10 micrometers in thickness (migration direction). The thermo-electric migration processing is performed on a device layer of a multiple layer substrate, leaving through interconnects for circuit portions to be formed on the device layer. Alternatively, the layer may be subject to thermoelectric migration prior to selectively bonding the device layer to the bulk layer.

Figure 88:
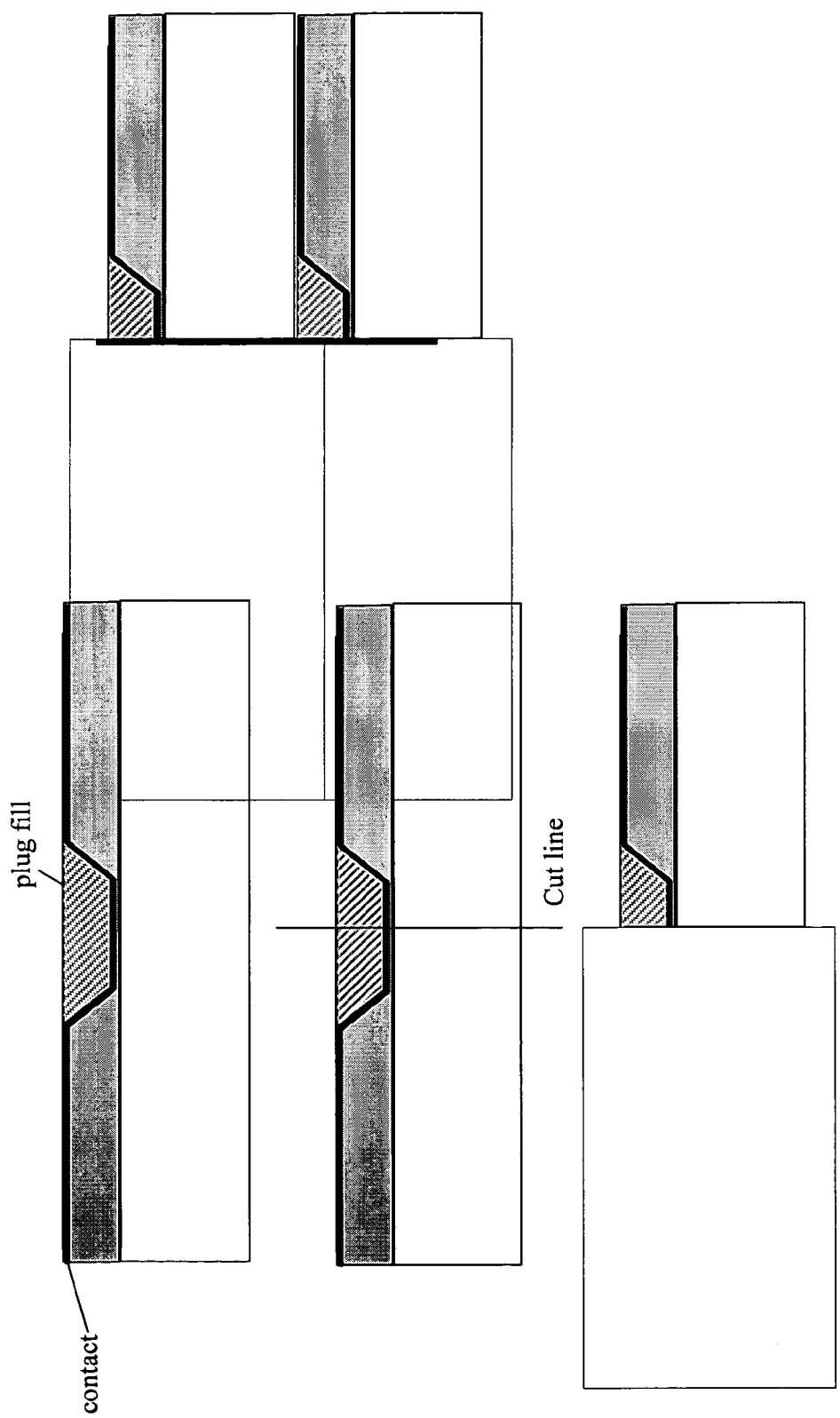
FIG. 88 is a schematic illustration of a plug fill method in accordance with the principles of the invention.

Referring to FIG. 88, a plug fill method of enhancing contact area and conductivity is shown. A tapered etch, e.g., generally at a 45 degree angle for preferential etching, is formed in the substrate. A conductor is formed across the top of the substrate, and traversed into the tapered etched region. Note that small angles (preferably less than 60, more preferably less than 45 degrees) are desired to minimize the likelihood of mechanical failure of the conductor. The tapered etched region is then plug filled with suitable conductive material.

This tapered etched portion is preferably located at edges dies as will be apparent. The plug is cut along the cut line, exposing the conductive plug material and the conductor. Several layers may be stacked and edge connected, whereby contact resistance is significantly minimized by the existence of the conductive plug portions.

Figure 89:
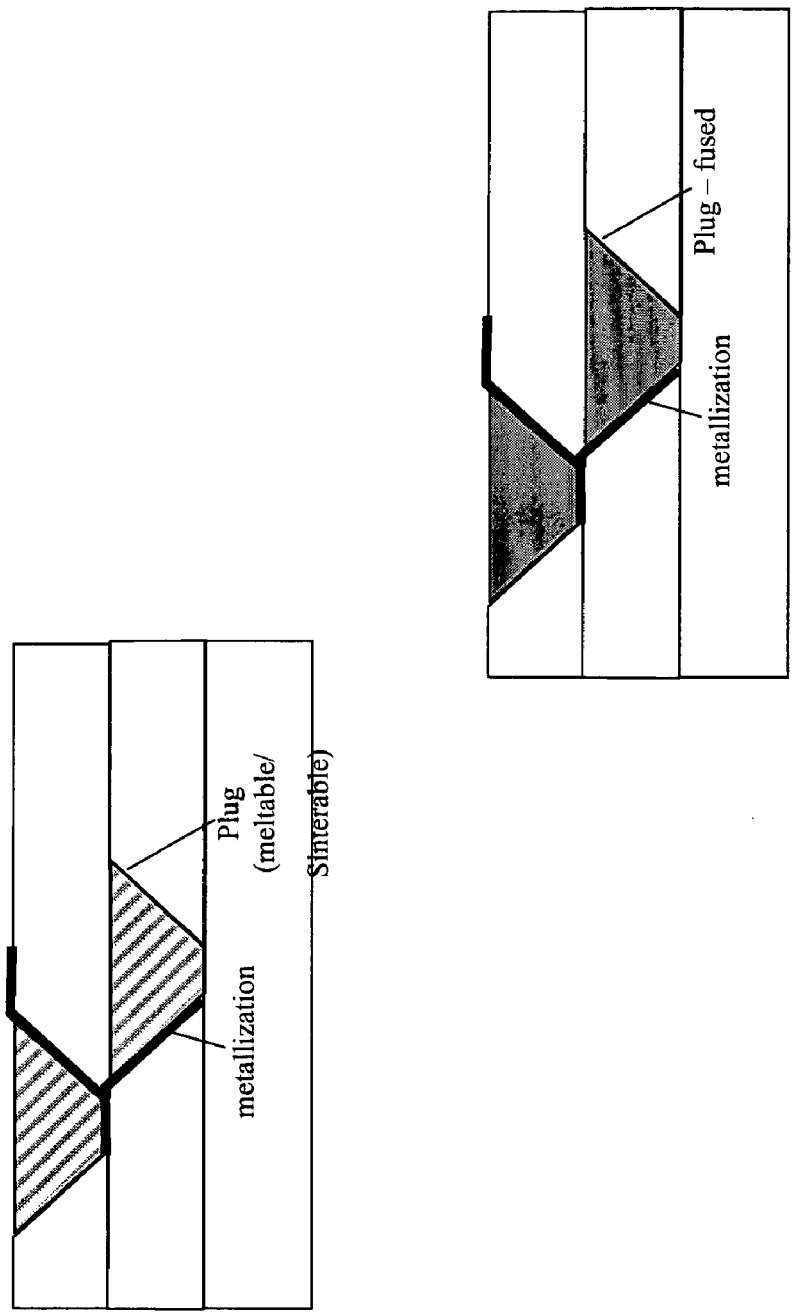
FIG. 89 is a schematic illustration of through interconnects in accordance with the principles of the invention.

Via holes may be etched (e.g., preferably a tapered etch of about 45 degrees) for access to formed metalization. The via hole is plugged with meltable or sinterable conductive material. Referring to FIG. 89, a through interconnect formed with the present method is described. Note that the metalization extending in the x-y plane may extend as edge connects. A tapered via hole is etched in the lower layer. Metalization is formed therein, and the via is plug filled with meltable or sinterable material. A subsequent layer is formed atop the first layer. A tapered via hole is etched in the upper layer. Metalization is formed on the top layer, and the via is plug filled with meltable or sinterable material.

In one embodiment, the conductive plug material is sintered or melted as the layers are stacked. This may further serve for alignment bonding, i.e., not temporary bonding, in that it will not be removed as the joint is a contact, and not always sufficient bond strength to serve as the sole permanent bond.

Preferably, the meltable or sinterable conductive material is not melted or sintered until the final bonding step, preferably fusion or other bonding suitable to also melt or sinter the conductive plug material. The customer may be provided with the layered devices after fusion and conductive melting/sintering, or before fusion and conductive melting/sintering.

By providing one or more edge interconnects, as compared to only through interconnects as described in the aforementioned IBM U.S. Pat. No. 6,355,501 various additional features may be provided that would not be feasible with through interconnects. For example, referring back to FIG. 65, shielding layers may be provided between adjacent layers. This prevents cross noise between circuit portion layers.

With through connects, noise radiates from one layer to the next. This is a known problem in vertically stacked circuits. Because preferred embodiments of the present invention rely on edge connects, a shielding layer is provided. The shielding layer is formed of a material such as copper, tungsten, molybdenum, or other conductive material. In certain embodiments, this shielding layer further serves to remove heat. The shielding layer and the adjacent metalization layers are suitably insulated as is known in the art. Beneficially, any noise created by one layer is not transmitted to adjacent layers. This is particularly desirable for mixed vertically integrated circuits, including combinations selected from the group of useful devices consisting of power, analog, RF, digital, optical, photonic, MEMs, microfluidics, and combinations comprising at least one of the foregoing types of useful devices. The shielding layer may further be used in optical connected circuits so as to form cladding layers.

This shielding layer may also serve as a ground plane to create ultra high speed and ultra wide bandwidth transmission lines as is well known in the art. Note that IBM U.S. Pat. No. 6,355,501 may not include such shielding layers, as the methods therein teach only through connects.

Referring to FIG. 66, channels may be provided between layers, to allow for heat dissipation. The channels for heat removal may carry fluid (liquid or gas) for heat removal. For example, the channels may allow for passive air or other separate cooling fluid to flow through the layers for cooling. Alternatively, microfluidics pumps or other devices may be included to provided air or other optional fluid cooling as discreet layer.

Generally, for purposes of this discussion, it will be understood that in the multilayer structure of the invention, microfluidic devices can additionally be fabricated on the multilayer substrate. It will be understood that interconnects and via holes serve similar electrical functions to grooves, wells and channels of microfluidic devices. Aside from some electrokinetic microfluidic devices which required electrical or optical controls, most microfluidic devices are mechanical devices composed of microscale structures, with fabrication techniques commonly used in integrated circuit fabrication. Therefore, one skilled in the art will understand that, as used herein, terms such as interconnects, conductors, electrodes and via holes may refer to ports, grooves, wells, and microchannels in the case of microfluidic devices.

For both MEMs devices and microfluidic devices, there must be a deconstruction of the desired device into a series of thin horizontal slices. Generally, the desired thickness is anywhere between 2 and 10 microns. Each of these slices is created on a silicon wafer using one of the many MEMS or microfluidic known wafer processing techniques. Once the MEMS or microfluidic slice has been created on the top surface of a wafer, the slice is peeled off the wafer and stacked on the top of the other slices making up the MEMS or microfluidic structure. Through this successive peeling and stacking, a MEMS or microfluidic device up to a centimeter high, having complex internal structure and geometry, can be created.

Referring to FIG. 67, these channels may include heat conductive portion (i.e., deposited metal) to further assist in heat dissipation. Alternatively, these channels may be formed as a waffle like structure, for example, as described in aforementioned U.S. Pat. No. 6,355,976.

Referring now to FIG. 68, the channels or other heat conductive portions associated with each circuit portion may be formed on the underside of the device layer when it is maintained by the handler.

These channels may be formed after formation of the circuit portions and conductors as described above. The shielding layer may optionally be formed directly on these channels to form the structures shown in FIGS. 66 and 67.

Alternatively, the shield and/or heat conductive portions may be formed on the underside of the device layer prior to selective bonding of the device layer to the bulk substrate. Further, the shield and/or heat conductive portions may be formed as one or more separate layers that are aligned, stacked and bonded to form the structures shown in FIGS. 64–66.

In another embodiment, the channels may be formed prior to selectively bonding the device layer to the bulk substrate. For example, as described above, one treatment technique for forming the weak bond regions involves etching the surface of the weak bond regions 5. During this etching step, pillars 9 are defined in the weak bond regions 5 on surfaces 1A (FIG. 8), 2A (FIG. 9), or both 1A and 2A. The pillars may be defined by selective etching, leaving the pillars behind. The shape of the pillars may be triangular, pyramid shaped, rectangular, hemispherical, or other suitable shape. Alternatively, the pillars may be grown or deposited in the etched region. Another aforementioned treatment technique involves inclusion of a void area 10 (FIGS. 12 and 13), e.g., formed by etching, machining, or both (depending on the materials used) at the weak bond regions 5 in layer 1 (FIG. 12), 2 (FIG. 13). Accordingly, when the first layer 1 is bonded to the second layer 2, the void areas 10 will minimize the bonding, as compared to the strong bond regions 6, which will facilitate subsequent debonding. For selective bonding purposes, both for the pillars and the void areas, since there is less bonding surface area for the material to bond, the overall bond strength at the weak bond region 5 is much weaker then the bonding at the strong bond regions 6. For heat dissipation, these pillars or void areas also define channels. Optionally, these channels may include heat conducting materiel deposited therein as described above.

Note that these features of FIGS. 65–67 cannot be effectively formed using through connectors according to the teachings of the aforementioned IBM U.S. Pat. No. 6,355, 501. As described above, the conductors may be formed by depositing suitable conducting material in operable electrical or optical contact with the circuit portion. In addition, or alternatively, conductors may be formed inherently in the process of forming the selectively bonded device layer.

As described above, one of the treatment techniques for forming the strong bond region involves use of one or more metal regions 8 at the weak bond regions 5 of surface 1A (FIG. 2) or both 1A and 2A. For example, metals including but not limited to Cu, Au, Pt, or any combination or alloy thereof may be deposited on the weak bond regions 5. Upon bonding of layers 1 and 2, the weak bond regions 5 will be weakly bonded. The strong bond regions may remain untreated (wherein the bond strength difference provides the requisite strong bond to weak bond ratio with respect to weak bond layers 5 and strong bond regions 6), or may be treated as described above or below to promote strong adhesion.

With the conducting layer preformed at the weakly bonded side of the device layer, it is ready for processing of the circuit portion. In certain embodiments, the circuit portion may be formed to a depth sufficient to contact the preformed conducting layer. In certain other embodiments, the preformed conducting layer may serve as at least a portion of the conductor for the subsequent level. It will be appreciated that the preformed conducting layer may be left as is, or may be etched to form a desired conducting patter.

Alternatively, instead of forming a metal layer for weak bonding purposes at the underside of the device layer, plural treatment techniques may be used to form the metal layer in the desired pattern of the conducting layer. Metal layers may be formed after one or more other treatment techniques (e.g., roughening). Further, metal layers may be formed prior to one or more other treatment techniques.

In a further embodiment, a separate layer of the stack may be provided devoted to interconnection. This layer operably allows for routing and bridging to avoid congestion while minimizing the need for overlaid (insulated) edge wires. For example, the horizontal (x direction) connection on FIG. 62 may be formed inside the layer if that layer was a congestion layer as described herein.

The various methods described herein are preferably carried out as described on a wafer scale. However, it is contemplated that many of the features are very useful even for vertically integrated chip fabrication on a chip scale.

Figure 70:
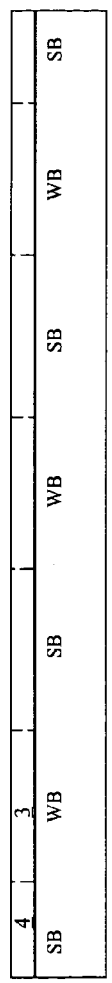
FIG. 70 is a schematic side-view of selectively bonded circuit portions in accordance with the principles of the invention.
Figure 71:
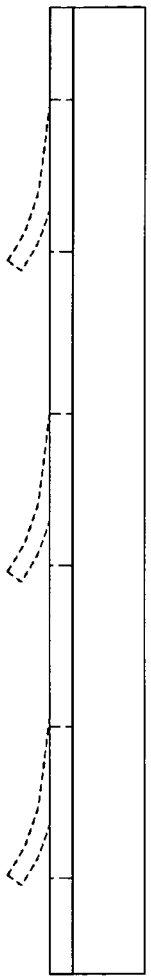
FIG. 71 is a schematic cross-section diagram illustrating the debonding technique in accordance with the principles of the invention.
Figure 69:
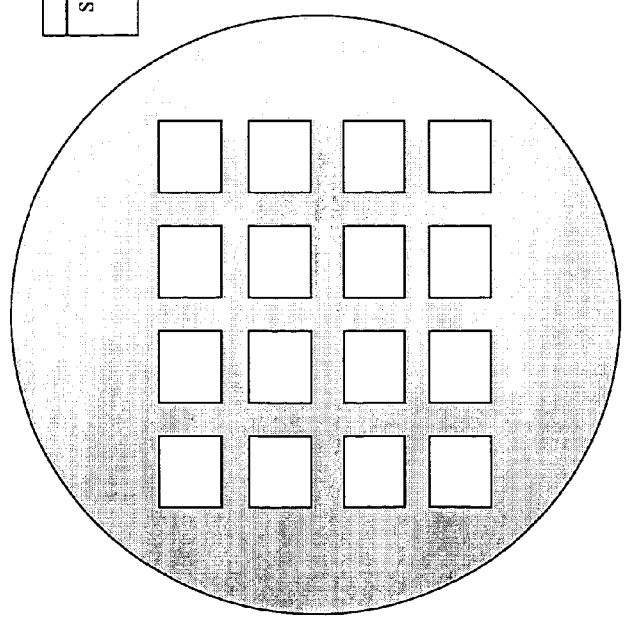
FIG. 69 is a schematic cross-section diagram showing circuit forming regions in accordance with the principles of the invention.

Referring now to FIG. 69, a selectively bonded multiple layer substrate having plural selectively bonded circuit forming regions (shown white) is depicted. Note that only a few representative circuit regions are shown for clarity, and that 100s or 1000s of circuit portions may be provided on a single wafer. The remaining shaded portions of the selectively bonded multiple layer substrate is generally bonded by strong bonds, as described above. FIG. 70 shows a side view of this series of selectively bonded circuit portions. These strong bond regions generally resemble moats of strong bond regions to maintain the structural integrity of the circuit or device portion during processing and/or peeling. To remove the selectively bonded circuit portions (e.g., after circuit processing), each circuit portion may be removed as schematically shown in FIG. 71 and as described above with reference to the debonding techniques. Note that the device layer may have a BOx layer therein, as described above, at the WB or both WB and SB regions, to provide SOI chips.

The alignment of the several stacked layers may be accomplished by known alignment techniques. For example, as described in the aforementioned IBM U.S. Pat. No. 6,355,501, optical alignment may be used, whereby reference marks on adjacent layers (e.g., associated with transparent regions) are aligned with each other using known optical means. That reference also discloses a self aligned plug in method, whereby mechanical interconnection (e.g., as shown herein with reference to FIGS. 53–56) is used.

Figure 90:
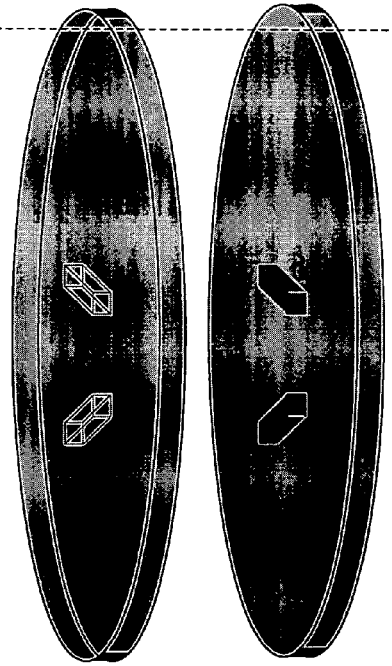
FIG. 90 is a schematic illustration of mechanical alignment in accordance with the principles of the invention.

In another embodiment, and referring to FIG. 90, another mechanical alignment method is provided for use in conjunction with the device layer wafer stacking. Mechanical protrusions or posts are provided on one layer, and receiving holes are provided on the other layer. When they mechanically fit, alignment is achieved.

In another embodiment, alignment may be performed with the method disclosed in aforementioned U.S. Pat. No. 6,355,976. As shown therein, a fixed reference is used at an alignment station, the layers are aligned with comparison to a reference, UV curable adhesive applied, and the layer is stacked on the previously stacked layers (or a substrate) maintain precise alignment based on the fixed reference, as compared to referencing marks on previous layers, which induces cumulative error build-up. UV light is applied as each layer is stacked.

A method and system for of aligning plural layers generally utilizes a projected image of the layer to be aligned, wherein the projected image may be aligned with an alignment reference apart from the layer or stack of layers to be aligned, thereby eliminating inter-layer alignment induced error amplification described above.

The method includes placing a first layer on a mechanical substrate. Between the first layer and the mechanical substrate, in a preferred embodiment, a low viscosity adhesive materials is included. This low viscosity adhesive material is preferably polymerizable (e.g., upon exposure to UV radiation), and optionally, this adhesive material may be decomposable, wherein alternative adhesives may be used to permanently bond a multitude of layers together after they have been formed according to the steps described herein.

The system further includes a polarizing reflector generally aligned at a 45-degree angle with respect to the first layer. A source of light is directed towards the polarizing reflector and is directed toward the first layer. Additionally, a quarter wave phase retarder is placed between the polarizing reflector and the first layer. This quarter wave phase retarder is optional, so that polarized light reflected from the reflector may subsequently reflect from layer one and transmit through the polarizing reflector, since the polarization state is reversed by the quarter wave phase retarder.

Layer one further includes one or more alignment markings. These alignment markings may be etched regions, materials applied to the layer, shaped regions, or other known alignment markings. When polarized or unpolarized light is transmitted toward the polarizing reflector, light reflects from these alignment markings, and, in certain embodiments, back through the quarter wave phase retarder and subsequently through the polarizing reflector to project an image of the positions of the alignment marks.

The image of the position of the alignment markings is compared with an alignment reference. This alignment reference includes alignment marks that correspond to the alignment marks on the first layer. If the first layer is properly aligned, as determined, for example, by a comparator, no further action is required. However, in the event that the layer is not aligned, light will pass through the alignment reference can be detected by a comparator or a detector, and an appropriate X-Y-theta subsystem system will serve to reposition the first layer in the x direction, the y direction, and/or the angular direction until the alignment markings in the alignment reference from the reflected light reflected through the polarizing reflector are aligned. When the detector detects a null value (i.e., the light from the first layer in alignment with the alignment markings on the alignment reference) the layers are aligned.

Alternatively, the alignment markings may be such that polarized light does not reflect, and a certain wavelength of polarized light is chosen that does reflect from the remaining unmarked portions of the layer. Thus, a null value will be attained when light is reflected at all portions except at the position of the alignment mark on the alignment reference.

In a preferred embodiment, the null detector or comparator is operably coupled to the X-Y-theta subsystem, such that an automated alignment process may be attained. That is, if the null detector detects light, the X-Y-theta subsystem will be adjusted until a null value is detected. In further alternative embodiments, instead of detecting a null value when alignment is correct, light may be transmitted through, for example, an aperture or transparent portion (with respect to the light used) in the alignment reference corresponding to the alignment marking may be provided, wherein light passes through only when alignment is proper.

The described process may be repeated for a second layer, a third layer, etc. through an Nth layer. One alternative projecting system may including a scanning process, whereby the surface is scanned by a laser beam which has been reflected by the reflected been may be processed through appropriate software or through another comparator to an alignment reference. This may include use of known Fourier optics and other scanning and detection systems.

An important benefit of this system is that error due to error in the proceeding layer(s) is eliminating, since the alignment reference remains constant or known throughout the alignment and stacking operation. The N layers will all have been individually aligned with the alignment reference, thus the desired end product having a stack of N layers will be in proper alignment. With this method, extreme accuracies may be attained, since each individual layer is aligned with respect to a known or constant reference, as opposed to being aligned with respect to the preceding layer. Therefore, extreme accuracy may be attained, since, in the worst-case, alignment may be off due to a single error as opposed to an error multiplied for each of up to N layers.

When N layers have been stacked in aligned, they may be bonded together by the adhesives described above, and as mentioned, those adhesives may also be decomposed and substituted with another adhesive.

Referring to FIG. 72, an exemplary system and method is described. The method includes placing a first layer 150 including an alignment marking 170 on a mechanical substrate 102. The alignment marking 170 may comprise a dot, line, curve, shape, or other marking formed on or within the layer by depositing, etching, or the like. As described further, the alignment marking 170 generally reflects light of a certain polarization.

The system further includes a polarizing reflector 104, generally aligned at a 45-degree angle with respect to the first layer 150. A source of light 106 is directed towards the polarizing reflector 104 and is polarized light 108 is directed toward the alignment marking 170 on the first layer 150. Additionally, a quarter wave phase retarder 110 is placed between the polarizing reflector 104 and the first layer 150. This quarter wave phase retarder 110 allows polarized light 108 reflected from the reflector 104 may subsequently reflect back 112 from alignment marking 170 and transmit through the polarizing reflector 104, as the polarization state is reversed by the quarter wave phase retarder 110.

When polarized light 108 transmitted from the polarizing reflector 104 having a first polarization state, polarized light with the same first polarization state reflects from these alignment markings through the quarter wave phase retarder 110, where the light is converted to a second polarization state, enabling the light reflected from the alignment markings to be transmitted through the polarizing reflector 104 to project an image 112 of the positions of the alignment marks.

The image 112 of the position of the alignment markings is compared with an alignment reference 114. This alignment reference 114 includes alignment marks that correspond to the alignment marks on the first layer. If the first layer is properly aligned, as determined, for example, by a null value within a comparator or detected 116, no further action is required. However, in the event that the layer is not aligned, light that passes through the alignment reference 114 can be detected by the comparator or a detector 116, and mechanical alignment of the layer 150 is required.

Figure 73:
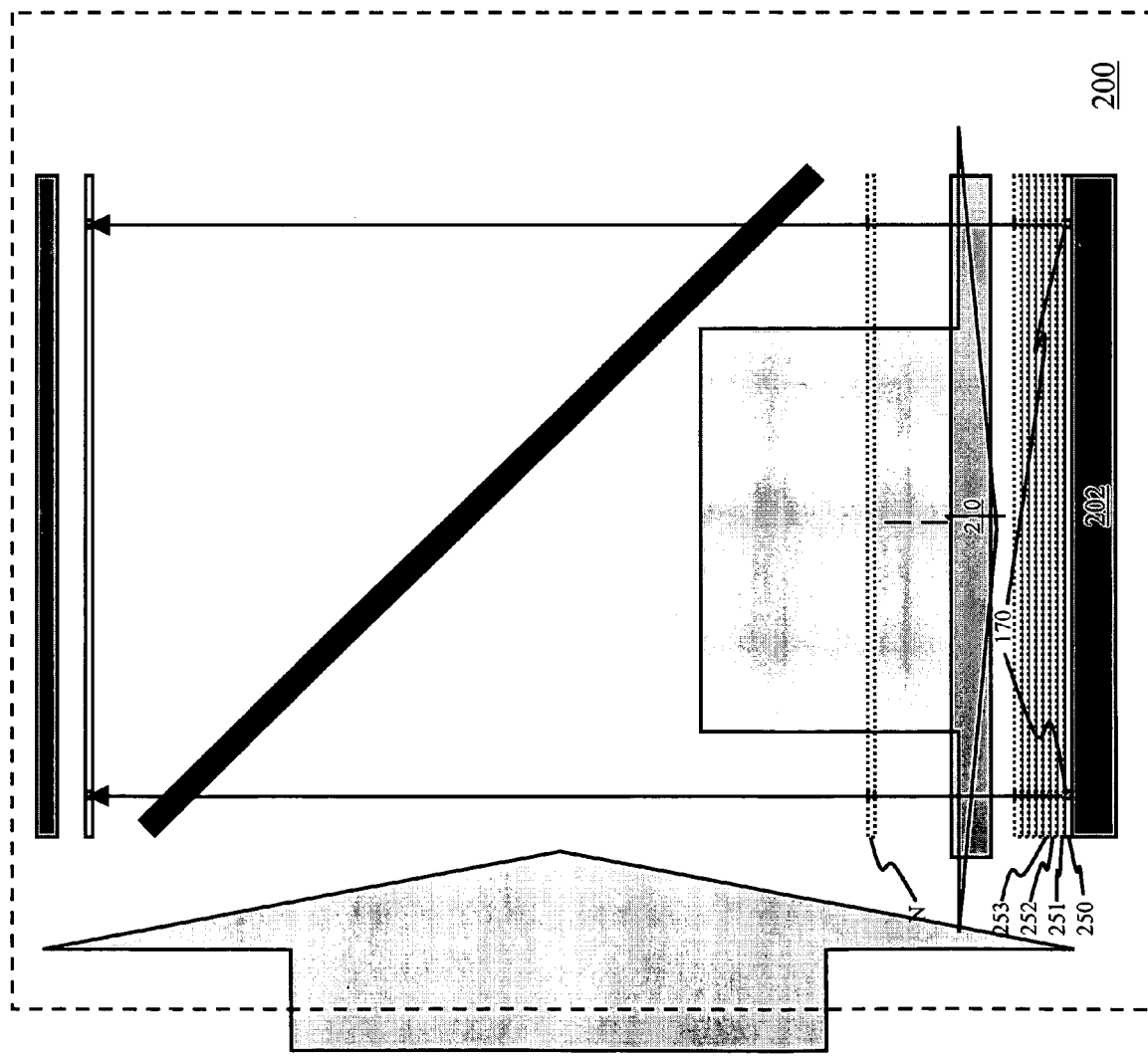
FIG. 73 is a schematic diagram illustrating the alignment of layers in accordance with the principles of the invention.

Referring to FIG. 73, a pair of alignment markings 270 may be provided to increase accuracy.

Figure 74:
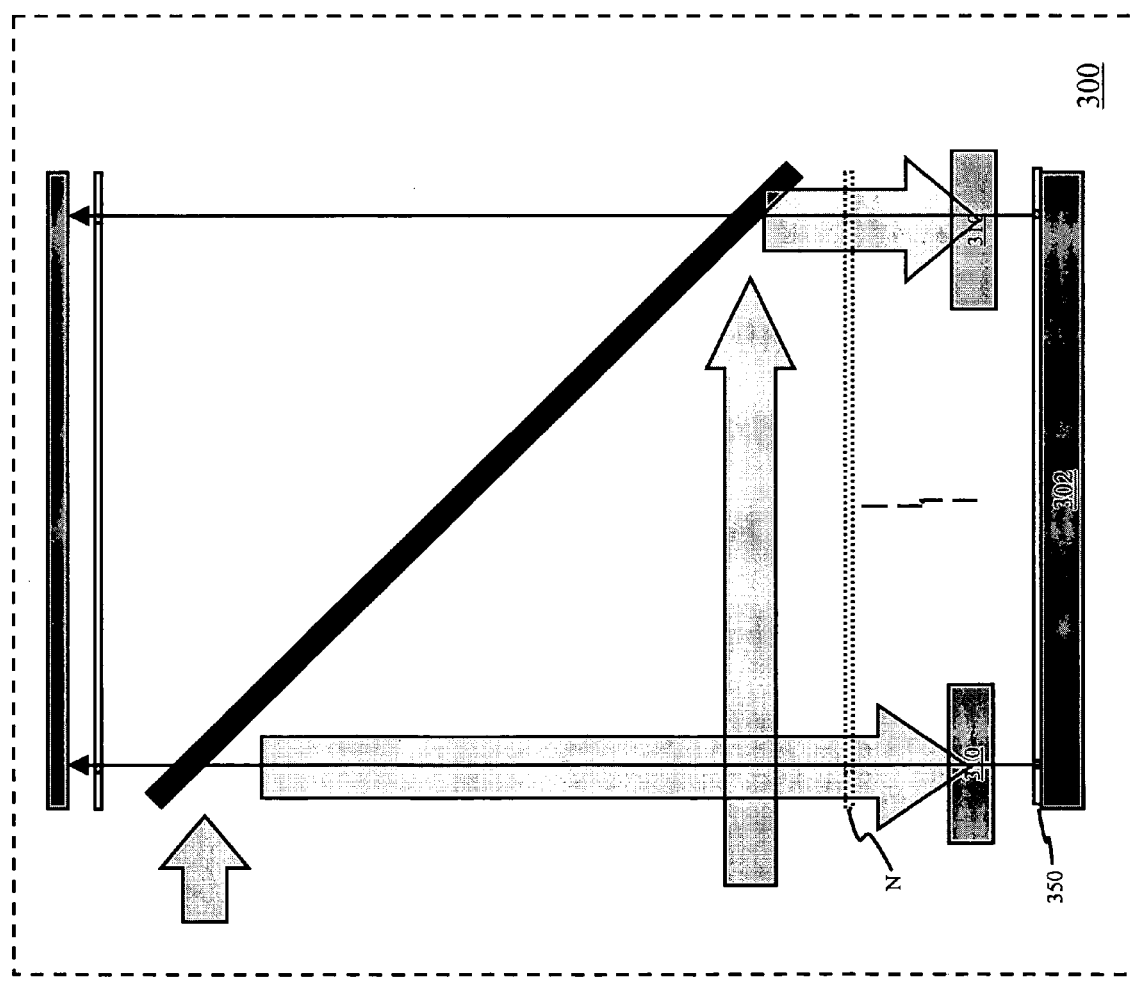
FIG. 74 is a schematic diagram illustrating the alignment of layers in accordance with the principles of the invention.

Referring to FIG. 74, a pair of light sources may be directed to the polarizing reflector to decrease energy, each light source being directed to an area where the alignment marking is estimated to be accounting for expected alignment error.

Figure 75:
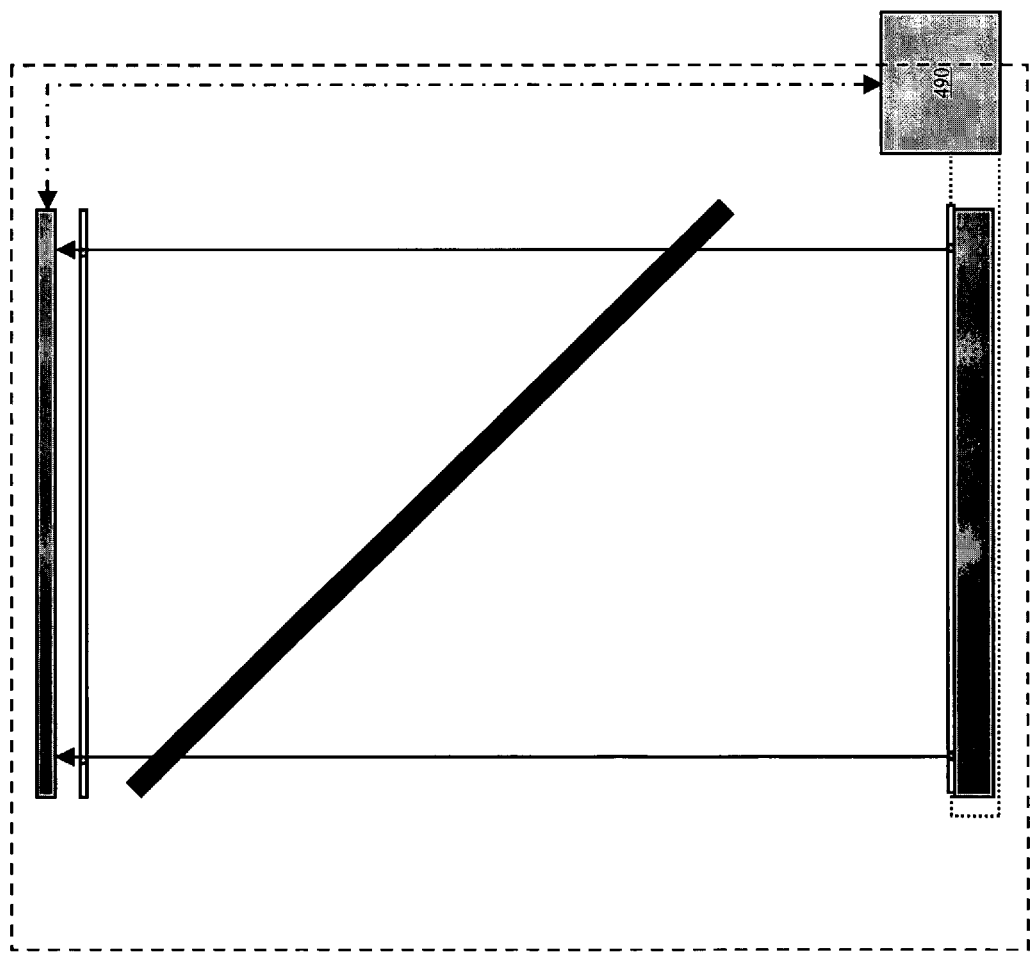
FIG. 75 is a schematic diagram illustrating the alignment of layers in accordance with the principles of the invention.
Figure 76:
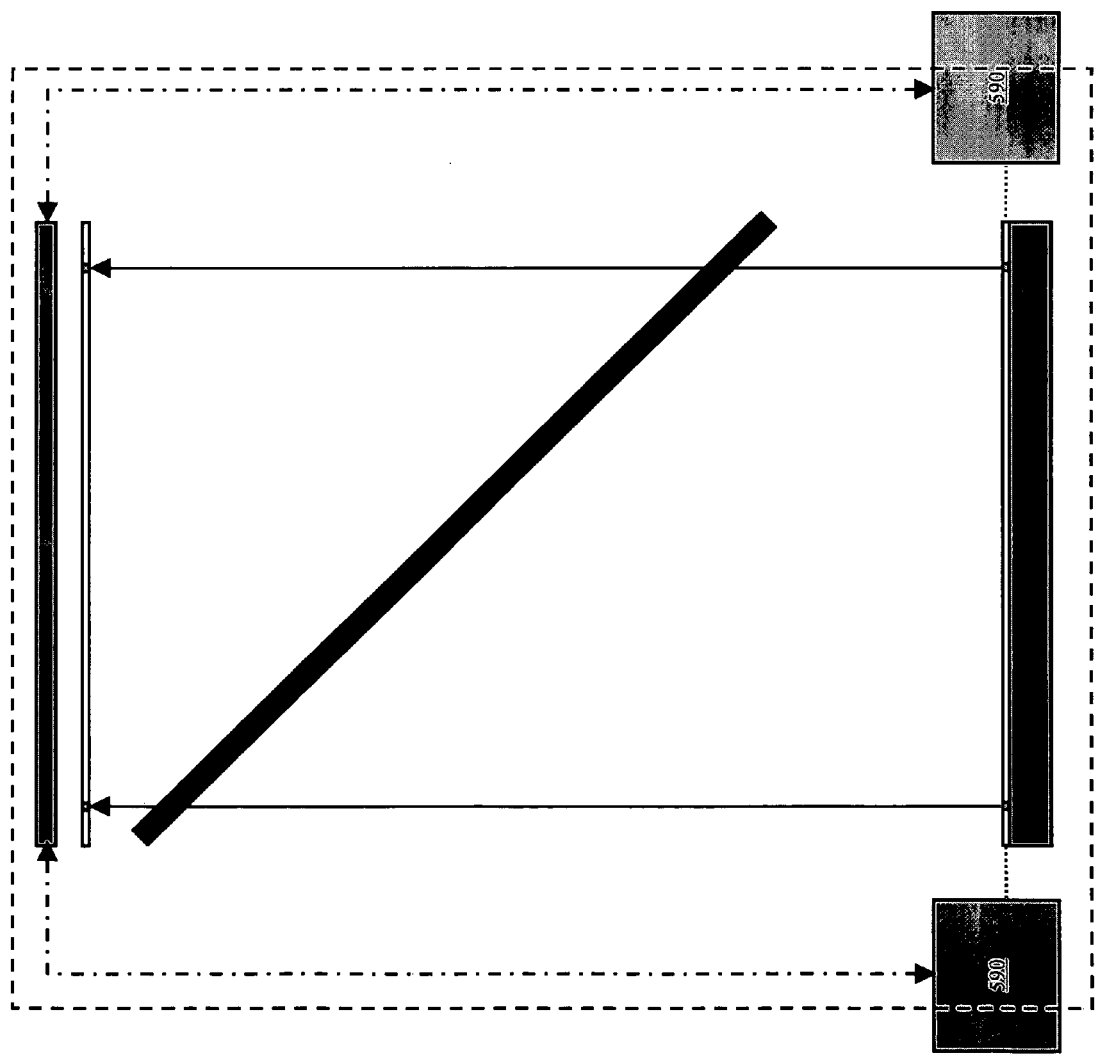
FIG. 76 is a schematic diagram illustrating the alignment of layers in accordance with the principles of the invention.

Referring to FIGS. 75 in conjunction with FIG. 76, X-Y-theta subsystems 490 and 590 are provided, which are controllable coupled to the detector or comparator. The X-Y-theta subsystem repositions the first layer in the x direction, the y direction, and/or the angular direction until the alignment markings in the alignment reference from the reflected light reflected through the polarizing reflector are aligned, as indicated by the detector or comparator. In a preferred embodiment, the null detector or comparator is operably coupled to the X-Y-theta subsystem, such that an automated alignment process may be attained. That is, if the null detector detects light, the X-Y-theta subsystem will be adjusted until a null value is detected.

When a low viscosity, polymerizable adhesive is used to adhere the layer 150 to the substrate (or a subsequent layer atop a preceding layer), the adhesive allows repositioning of the layer by the X-Y-theta subsystem. When alignment is attained, such adhesive material may then be polymerized to "set" the aligned layer in position.

As shown in FIG. 75, X-Y-theta subsystems 490 includes a motion control system coupled to the wafer or to appropriate handles, for example, at the edges of the wafer. The motion control system may comprise one or more vacuum handlers attached to the edges or a designated annular area proximate the edge of the wafer layer, for example. Further, holes may be formed in the wafer to allow for access via an arm from the motion control system.

As shown in FIG. 76, a pair of X-Y-theta subsystems 590 are provided on opposite sides of the layer to be repositioned in response to non-alignment detection by the detector or comparator.

Figure 77:
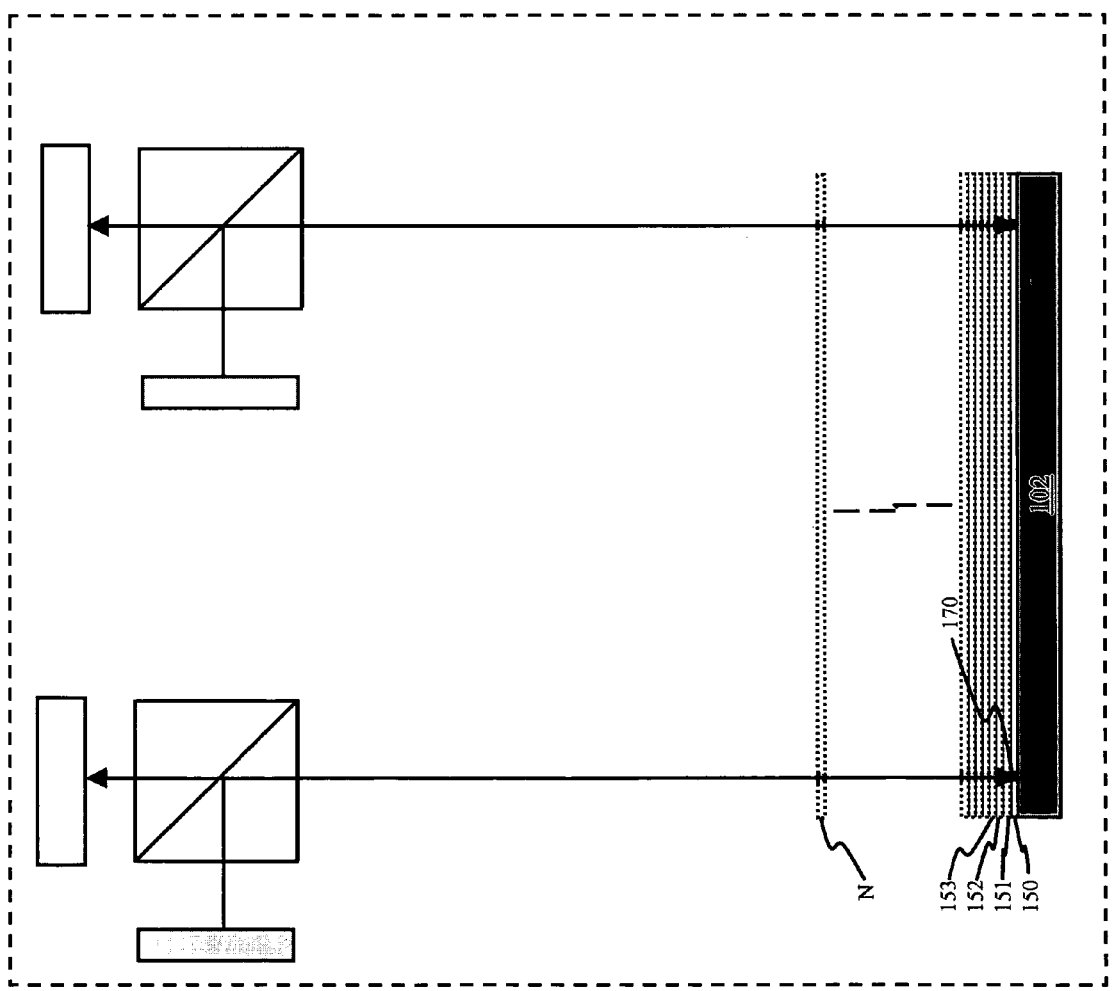
FIG. 77 is a schematic diagram illustrating the alignment of layers in accordance with the principles of the invention.

In another embodiment, and referring now to FIG. 77, plural optics systems (each of which is substantially similar to that of FIG. 72) are provided to coincide with plural alignment marks for increased accuracy.

Figure 78:
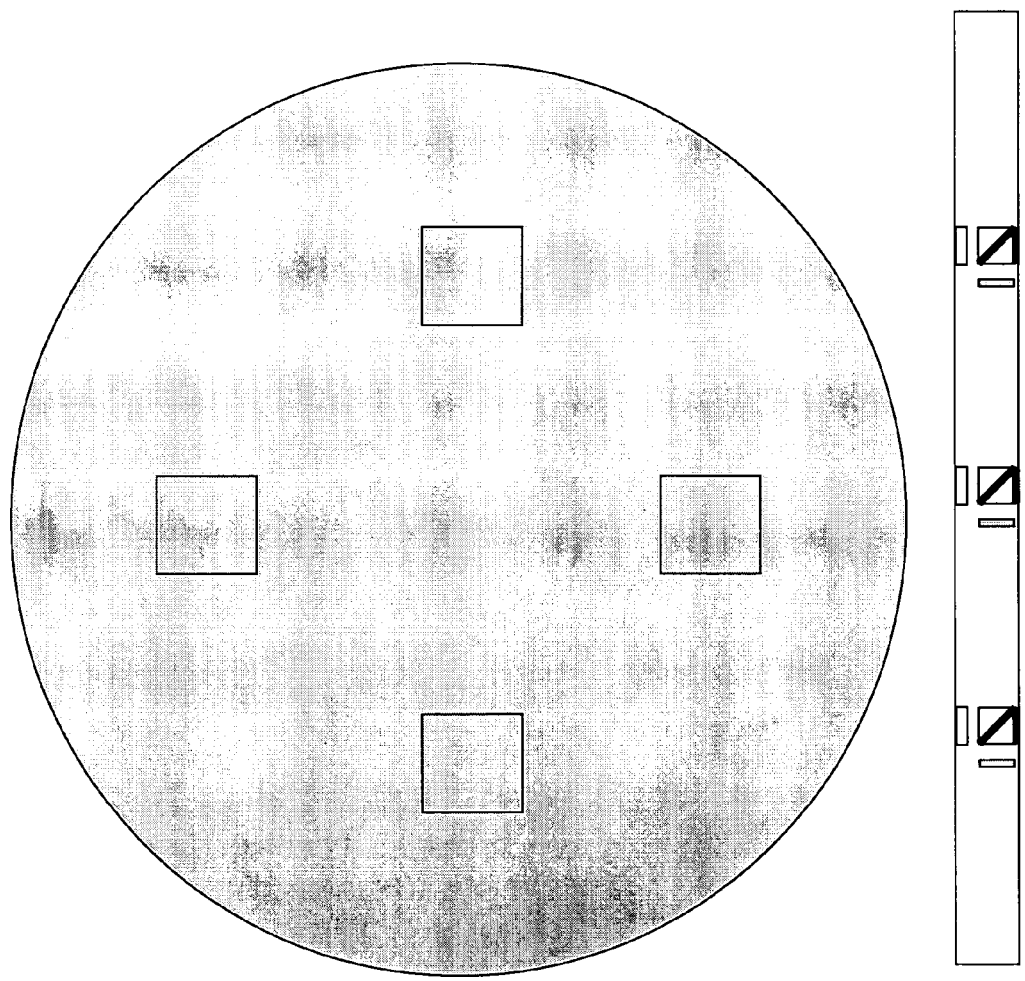
FIG. 78 is a schematic diagram illustrating the alignment of layers in accordance with the principles of the invention.
Figure 79:
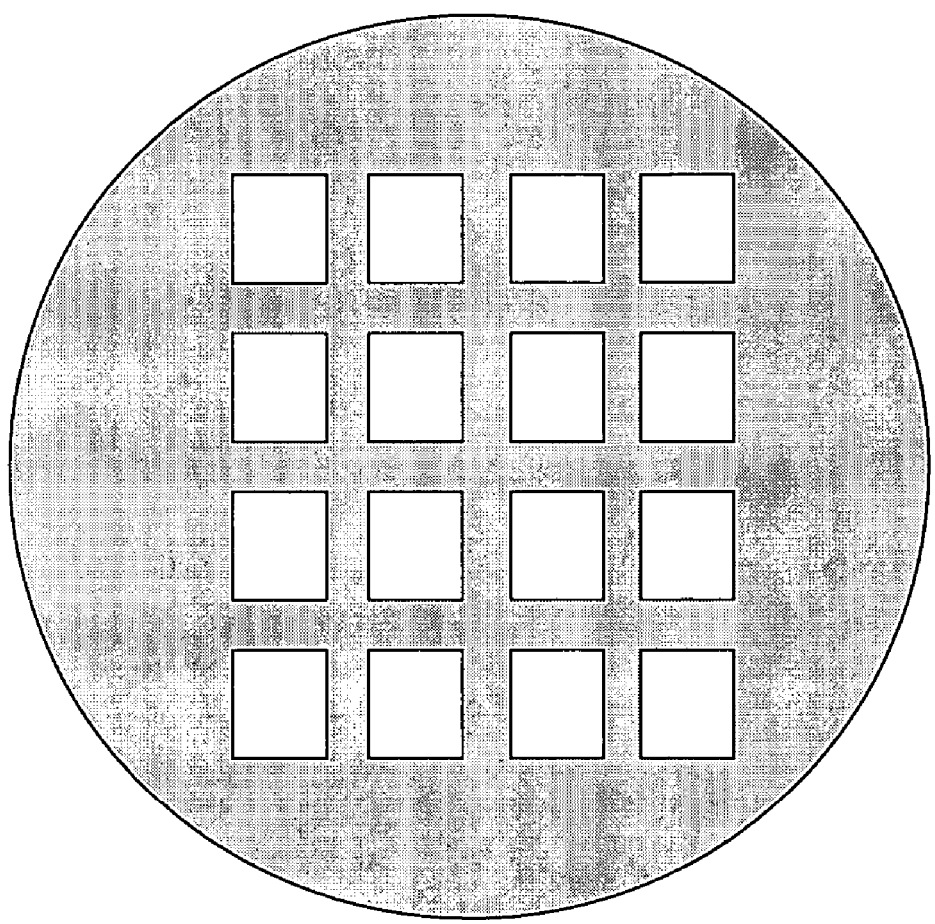
FIG. 79 is a schematic diagram illustrating the alignment of layers in accordance with the principles of the invention.

Referring now to FIG. 78, a device is shown that is suitable for one or more alignment process functionalities. The device includes plural sub-systems therein. In one embodiment, the sub-systems serve single functionality, e.g., to write alignment marks or to detect alignment marks. For example, one device may includes plural sub-systems for writing alignment marks, and another device may include plural sub-systems for detecting alignment marks. To ensure alignment accuracy, such separate devices should be fabricated so that the writing position and the detection reference positions are substantially identical, or at least within the requisite device tolerance.

In one method of aligning using an alignment device, alignment marks may be positioned on a device layer during processing of the circuit portions. Here, alignment marks may be included on one or more of the mask(s) used for circuit portion processing, such that the alignment marks correspond to plural sub-systems for detecting alignment marks in the alignment mark detection device.

In another method of using an alignment mark detection device and a writing device, the devices themselves are positioned in alignment. Further, the devices may be bonded together to ensure accuracy of alignment. The sequence (i.e., relative the layers to be aligned) in insignificant, so long as the device between the other device and the layer to be aligned is transparent to the other device. For example, if the outermost device is the alignment mark detection device, then the writing device should be optically transparent, for example, if optical reference mark detection is used or if other scanning is used. If the outermost device is the writing device, then the alignment device should be transparent to the writing signal, for example, if alignment mark writing is effectuated by exposing the layer to have marks written thereon to certain wavelength of light. Alternatively, mark writing can be at a known angle to allow bypass of the detection device.

In another embodiment, writing and alignment may be performed with the same device. For example, on optical array as described above can be used to both expose the layer to a marking light signal, and to subsequently detect the formed marks.

The alignment mark writing and/or writing and detection device, or an identical copy thereof, may also be used to mark and/or etch alignment marks in the one or more masks used to form circuit portions on each device layer. Conventionally, IC, MEMs, or other useful devices are formed of several different layers whereby the mask for each layer is aligned to previous mask. Here, the mask for the Nth layer is not aligned to the (N−1)th layer, but rather to a common writer/detector. In another embodiment, the writer/aligner may also be integrated into a device having mask writing functionality.

In a further embodiment, a device layer may be provided with alignment marks, prior to circuit portion processing. The same or a substantially identical alignment mark writing device, as described herein, or other writing devices, is used to mark the mask(s) and or exposure devices to be used for forming at least a portion of the circuit, MEMs or other useful device region.

Accurate alignment of first the device layer, then the mask(s) and/or exposure devices, is readily possible using a reference alignment mark detector that is matched with the alignment writer, thereby providing well defined patterns of useful devices on the device layer with matched alignment marks. Alternatively, as described herein, an integral alignment mark writer/detector may be used to ensure alignment accuracy.

Note that the device itself may be formed using the herein described multiple layer substrates to form each layer (not shown), and aligning, stacking and bonding plural layers. The subsystems may include, but are not limited to, polarizing based systems, lens systems, light funnel, STM tip system, electron beam through aperture, cameras, apertures with light source, photodetector, apertures for electrons, ions and x-rays, and combinations comprising at least one of the foregoing.

In a further embodiment, the alignment marks that are written may further include mapping lines or marks surrounding the center, for example. This is particularly desirable when scanning techniques are used, for example, whereby the scanner/comparator may not only detect when there is or is not alignment, but mapping instructions may be provided by detecting the known mapping marks. This, the systems and time requirements to "focus" in on an alignment mark is significantly reduced. For example, the comparator may determine that movement of the X-Y-theta subsystem(s) should position the layer −0.1 microns X and +0.05 microns Y, based on reading the mapping marks.

The above described novel alignment technique may result in aligning N layers with unprecedented nm accuracy. Such an alignment method, incorporated with the other multiple layer processing techniques and exemplary applications described herein, may substantially facilitate a multitude of 3-D micro and nano devices.

Referring now to FIG. 86, another alignment method is disclosed. Here, a tapered hole (e.g., having approximately 45 degree taper) is provided at an alignment position (e.g., in lieu of an alignment mark) on the plural device layers to be stacked. Such alignment holes may be formed prior to formation of the useful structures or after formation of the useful structures. When the layers are stacked, a light beam is attempted to transmit through the holes. When the layer is not aligned, the light will not pass through. The layer is then shifted until light reflects from the Nth layer.

Alternatively, the tapered holes may be filled with optically transparent material, for example, such as SiOx. Further, while not preferred as cumulative errors may occur, a layer may be aligned with the adjacent layer.

Figure 87:
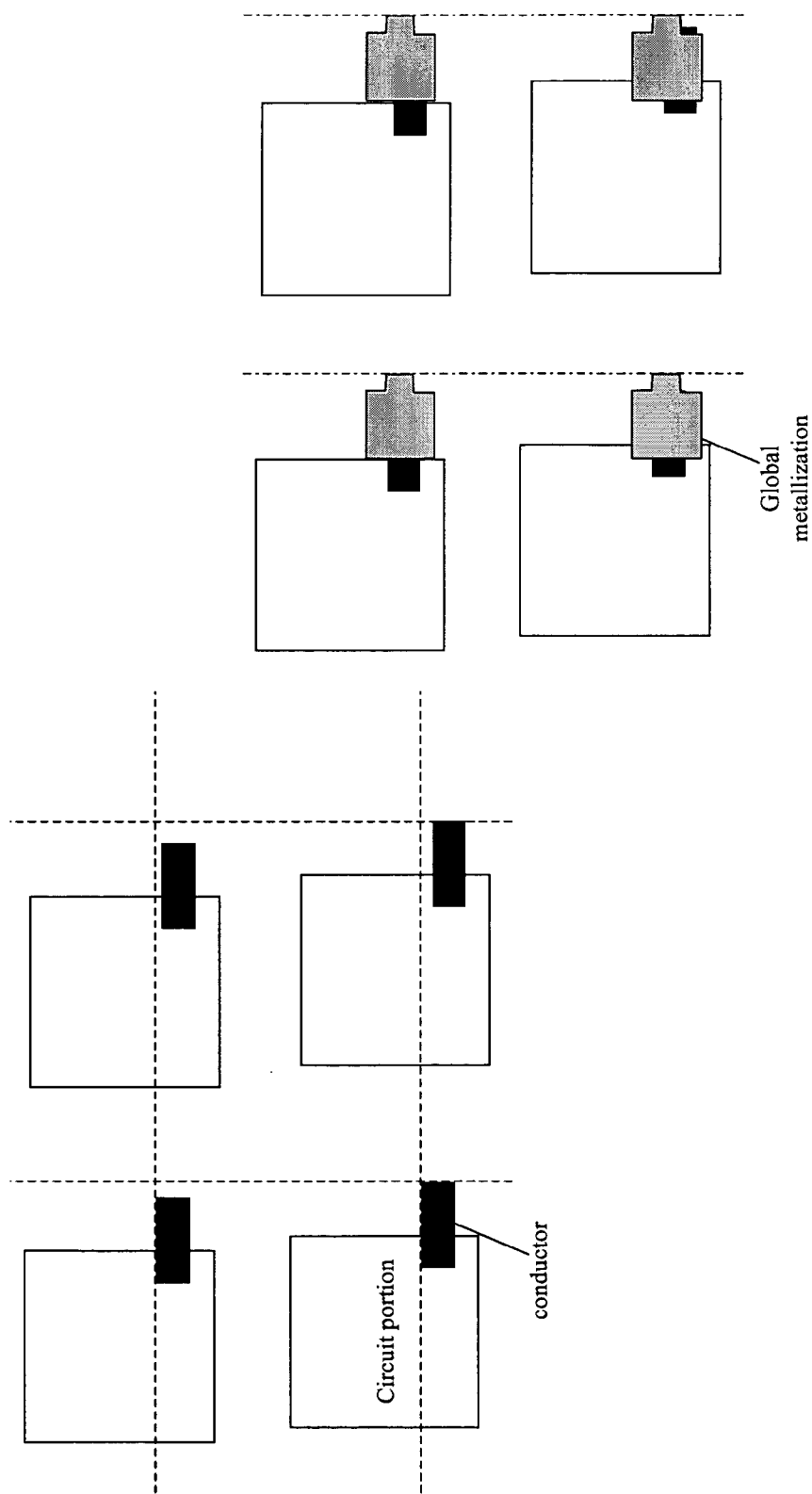
FIG. 87 is a schematic illustration of the alignment technique in accordance with the principles of the invention.

Referring now to FIG. 87, an alignment method for wafer level stacking is provided. The mask may be provided with alignment functionality as described above. However, perfect grid alignment may still not be attained. For example, the relative positions of circuit portions and associated contacts are offset as shown by the dashed reference lines. This random skewing of the useful structure portions may be problematic for wafer level stacking, since hundreds of useful devices may be processed on a wafer.

To resolve this potential problem, at the wafer level, global interconnects or metalization may be provided. Generally, as shown in FIG. 87, the global metalization comprise oversized metalization. These global metalization are formed using the same mask at each level. There are sufficiently large to compensate for any local die position offset. Further, the global metalization also serves to provide edge interconnection as described above. Note that the cut line is shown at the end of the global metalization.

Figure 91:
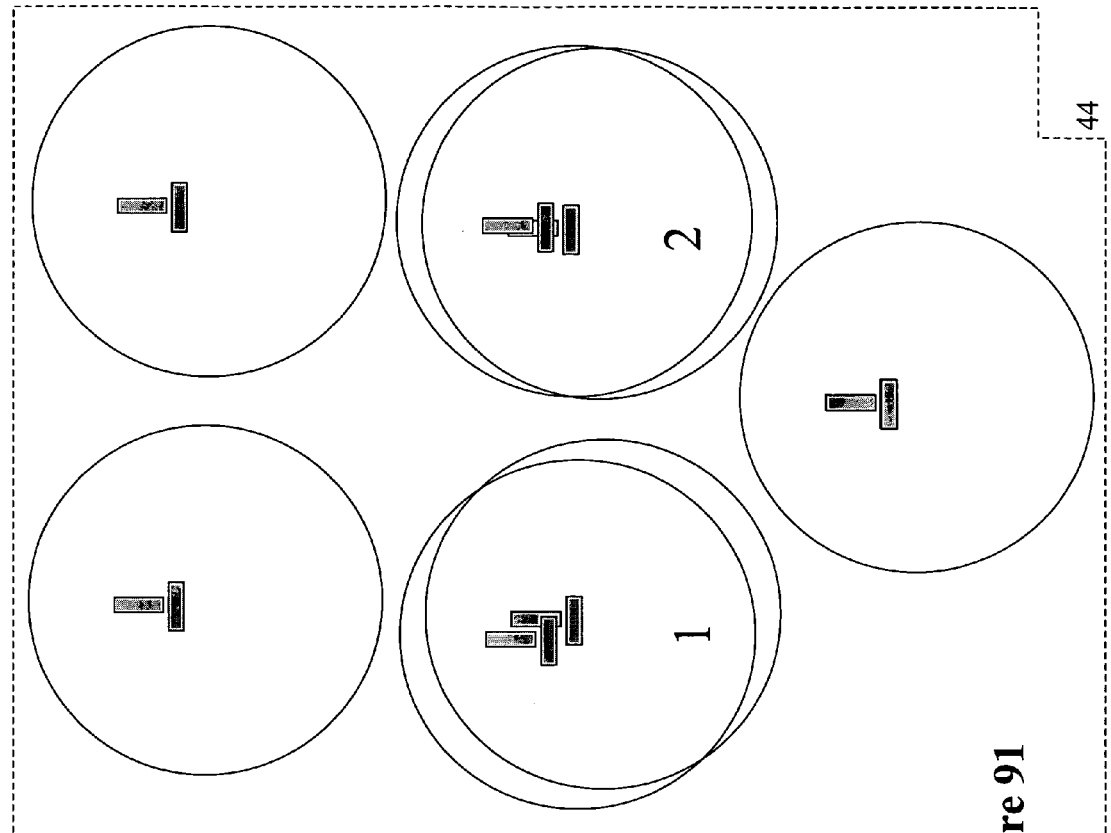
FIG. 91 is a schematic illustration of mechanical alignment in accordance with the principles of the invention.

Referring now to FIG. 91, a further optical alignment technique is provided. A first wafer and a second wafer are each provided with a matching pair of alignment windows, in the form of a pair of rectangles, for example, perpendicular one another. When the second wafer is moved over the first wafer, as shown, only a square is visible. Based on this pattern, movement is in the x direction until the second attempt pattern is seen. Then, movement is in the y direction until the light matches the alignment holes.

Alternatively, the handler may include a resonant layer, thereby serving as a handler and an alignment device. The handler may comprise any known handler, including that described in aforementioned PCT patent application Ser. PCT/US/02/31348 filed on Oct. 2, 2002 and entitled "Device And Method For Handling Fragile Objects, And Manufacturing Method Thereof".

An embodiment of this hybrid handler/LC aligner is shown in FIG. 96, along with an alignment method using the handler. An LC circuit is partially formed in the handler. Note the open circuit. The layer includes a conductor matching the open circuit region, which serves as the alignment mark. The layer including the matching alignment conductor is handled as is known in the handler art. The device layer is fed RF signals from the open LC circuit in the handler. When the devices are near alignment, RF excitation increases, and generally reaches a maximum at the aligned position, i.e., the LC circuit is completely closed.

This method is in contrast to the capacitance method described in IBM Pat. No. 6,355,501, whereby identical resonant circuits are formed on adjacent layers. An AC signal is applied to the metal patterned resonant circuits and aligned based on the magnitude of the sensed current induced by the resonant circuits, whereby perfect alignment is represented by maximum sensed current value. This method is invasive at the layers to be aligned, potentially causing damage, whereas the handler device bears the invasive transmission in the present embodiment using the hybrid handler/LC aligner.

Referring to FIG. 97, various conductor patterns (and accordingly varied hybrid handler/LC aligner systems, not shown) may be provided for sub-micron or nano-scale alignment.

Bonding as described herein may be temporary or permanent. Temporary bonds may be formed, for example, as described above with reference to alignment—that is, after the layer is properly aligned, a temporary bond is formed at local regions of the layer. Note that this bond may remain after final processing, or it may be decomposed as described herein. Further, this bonding step, generally occurring after alignment, may be sufficient to serve as a "permanent" bond.

Generally, permanent bonding of the separate layers after alignment as described herein may be accomplished by a variety of techniques and/or physical phenomenon, including but not limited to, eutectic, fusion, anodic, vacuum, Van der Waals, chemical adhesion, hydrophobic phenomenon, hydrophilic phenomenon, hydrogen bonding, coulombic forces, capillary forces, very short-ranged forces, or a combination comprising at least one of the foregoing bonding techniques and/or physical phenomenon.

In one embodiment, radiation (heat, UV, X-ray, etc) curable adhesives are used for simplicity of fabrication. The UV bonding may be carried out as each layer is stacked, or as a single step.

In certain embodiments, when UV bonding is carried out as single step, the edge portions of the wafer, or of the chip if fabrication is on a chip scale, are UV transparent, for horizontal UV access. To cure the adhesive via radiation from the top of the wafer, radiation transparent regions may be provided at various layers to expose the adhesive to suitable radiation. In other embodiments, the layers are cured layer by layer. In still other embodiments, adhesive may be applied from the edges.

Preferably, portions of the die include adhered sections, and accordingly may include radiation transparent regions.

In another embodiment, to avoid glue exposure to the metalized areas where interconnects are to be formed, or to avoid glue exposure to the circuit or other useful device portions, glue may be patterned on the surface(s) to be adhered. In one embodiment, masking the areas to avoid and depositing adhesive there around may provide a patterned adhesive. Alternatively, controlled deposition may be used to selectively deposit the adhesive. Note that the tolerance for the adhesive may be greater than tolerances at other process steps.

To cure the adhesive, edge radiation transparent portions may be provided, generally as described in aforementioned U.S. Pat. No. 6,355,976. Alternatively, as described above, radiation transparent windows may be provided in optical alignment with the patterned adhesive regions.

The patterned adhesive is advantageously decomposable such that the adhesion may be temporary. Thus, after the entire stack is formed, the temporary bonds may optionally be decomposed, and the stack permanently bonded by other means, such as fusion.

After the stack is diced, the edges are metalized. The metalization may comprise at least one layer/pattern. Plural metalization layers may be provided, which are preferably insulated as is known in the art.

In one embodiment, MSA architecture may be included as described in aforementioned U.S. Pat. No. 6,355,976. Notably, encoding may be provided, thereby permitting selection of individual circuits on the stack with minimum connections and with the shortest propagation delays.

A problem that others encounter, particularly with wafer scale stacking and integration, relates to useful device yield. Herein, this is overcome by suitable diagnostic operations after dicing and sorting, based, e.g., on the number of functioning layers. This method may allow yields approaching 100%.

The method includes: providing a plurality of vertically integrated devices having unknown device health status (generally in the form of "blanks" ready for vending, but having interconnection wiring and substantially ready for, e.g., microprocessing, modular processing, bit sliced processors, parallel processors or storage applications); performing diagnostics on the vertically integrated devices; and sorting the vertically integrated devices based on the number of known good layers.

The devices may be provided by one or more of the processes described herein, or alternatively by other known methods of forming vertically integrated devices. The methods herein are preferred in certain embodiments for various reasons. The edge interconnects of the present methods allow for external diagnostic procedure. By stacking and dicing vertically integrated devices on a wafer level, economies of scale may be taken advantage of. The present methods also facilitate redundancy of connection.

During diagnostics, known diagnostic methods may be used to determine how many layers of a device are good. Based on the number of good layers, the vertically integrated devices are sorted or categorized into bins corresponding with a numerical range of good layers. Alternatively, or in combination, the vertically integrated devices may be sorted or categorized based on device speed. The different bins thus represent product that is suitable for different users.

Figure 92:
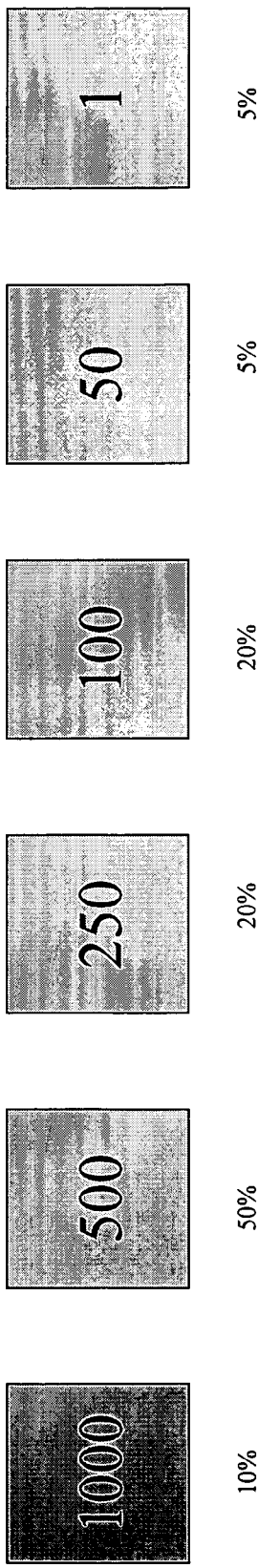
FIG. 92 is a schematic illustration of sorting layers in accordance with the principles of the invention.

For example, and referring to FIG. 92, assume the goal is to achieve 1000 stacked layers on a wafer scale of a wafer producing 500 die. Bins are provided for those with 1000 known good layers; 500 known good layers; 250 known good layers; 100 known good layers; 50 known good layers; and 1 known good layer.

Further, assume that only 10% of the die meet the standards for the 1000 stacked layers. These are sorted into "1000" bin. Obviously, these are the most expensive die stacks, having the desired number of layers. Still further, assume that 10% of the die have greater than 900 but less 1000 known good layers. These are sorted in the "500" bin. Of the 80% remaining, assume 40% are between 500 and 900 known good layers. These also go in to the "500" bin. Note that, of course, the levels for each bin may vary depending, for example, on the demands of the customers. Assume 20% have between 250 and 499 known good layers. These go to the "250" bin. Further, assume 10% have between 100 and 249 known good layers, 5% have between 50 and 99 known good dies and the remaining 5% have between 1 and 49 known good dies, which are sorted to the "100" bin, the "50" bin and the "1" bin, respectively.

Each of the bins being priced accordingly, and demand should exist for each of the various die with a certain number of known good layers. Thus, the commercial yield may be extraordinarily high.

Figure 93:
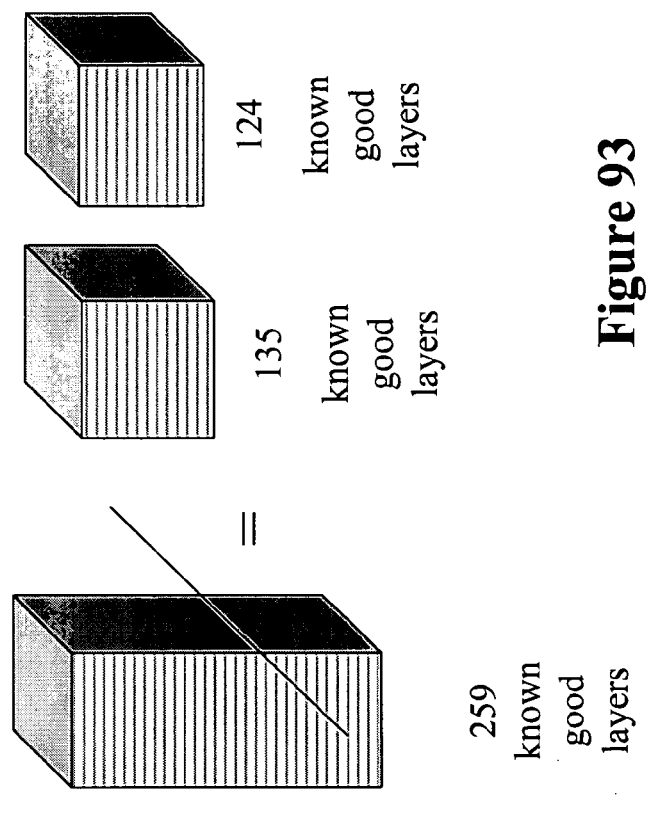
FIG. 93 is a schematic illustration of sorting layers in accordance with the principles of the invention.

Still using the above example, assume that a customer specifies at least 100 known good layers. Any of the die stacks in the "100" bin are suitable. Alternatively, and referring to FIG. 93, a device with 259 layers may be sliced horizontally to form one stack of 135 layers and another stack of 124 layers. The cut may be generally in the x-y plane to reduce the z dimension of the stack. In a preferred embodiment, the cut is formed at one of the known bad die layers to minimize waste.

Figure 94:
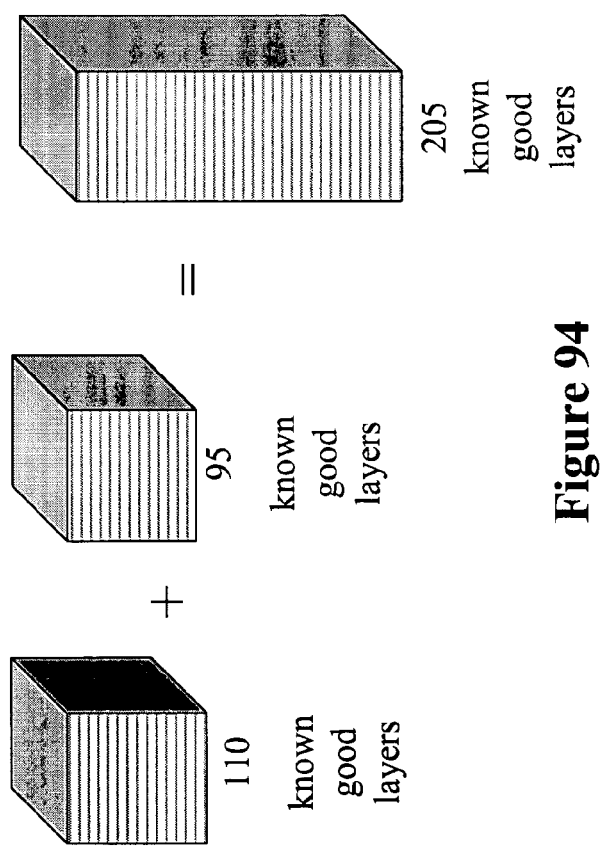
FIG. 94 is a schematic illustration of sorting layers in accordance with the principles of the invention.

In another example, and referring to FIG. 94, assume a customer specifies a device with 200 operable layers. A stack of 110 known good die and a stack of 95 known good die may be vertically stacked together in the z direction to form a device having 205 known good layers. Of course, it is contemplated that more than two die stacks may be stacked. Accordingly, in manufacturing it is possible to take from one bin to fix a die that is lacking a full stack.

Figure 95:
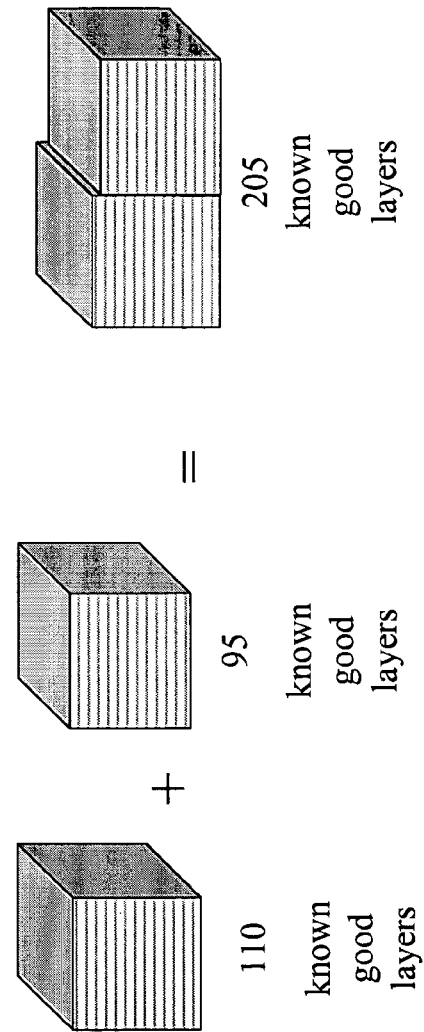
FIG. 95 is a schematic illustration of sorting layers in accordance with the principles of the invention.

Referring to FIG. 95, it is also possible to edge stack the die stacks. This is operably provided herein with the plural edge connectors, generally as described above.

In a further embodiment, after diagnostics and prior to stacking, one layer or a portion of one layer may serve to stores health or test result information. Further, programming and addressing functionality may also be provided in the stacked die. Note that when these are stacked, two layers are used for the health or test result information, although it is contemplated that these may be reprogrammed with updated health and status information. This method is advantageously useful when the layers are identical layers.

Various products and devices may be formed using the processes disclosed herein. As mentioned above, "blanks", both as single layer and vertically integrated layers (complete with interconnections and optional addressing and encoding functionality), generally of identical layers. Another series of products and devices may be formed from different layers. These may be standard (e.g., MEMs or microfluidics with integrated processors and/or memory), or alternatively may be "made to order" based on needs. For example, GPS, RF, power cells, solar cells, and other useful devices may be integrated in the vertical stacks.

Vertically integrated microelectronics may contain a variety of useful structures or devices formed therein. For example, very high speed processing may be accomplished by stacking a multitude of processing circuits according to the methods herein. Even more speed may be derived if the MSA architecture is utilized.

In another embodiment, massive data storage (e.g., capable of 64 GB) devices may be formed according to the methods herein. Such devices may optionally incorporate vertically integrated memory with wired and/or wireless external connection, for communication and data transfer to and from PCs, TVs, PDAs, or other memory requiring devices.

In another embodiment, a vertically integrated device formed according to the methods herein may include one or more processors and/or memory devices in conjunction with optical processing, communication or switching functionality.

In another embodiment, a vertically integrated device formed according to the methods herein may include one or more processors and/or memory devices in conjunction with RF transmission and/or receiving functionality.

In another embodiment, a vertically integrated device formed according to the methods herein may include one or more processors and/or memory devices in conjunction with a global positioning system receiver and/or transmitter.

In still further embodiments, a vertically integrated device formed according to the methods herein may include one or more processors and/or memory devices in conjunction with optical processing, communication or switching functionality; RF transmission and/or receiving functionality; and/or a global positioning system receiver and/or transmitter.

For example, one exemplary product may include a micro-jukebox, providing a user with 100+ hours of customized programming per week on media formed with the herein disclosed methods.

Other memory storage systems include optical, scan tolling microscopic/nano storage; and holographic storage.

Microfluidic devices may serve many purposes. Reductions in costs and increases in quality and functionality may be derived with the present methods and systems. Microfluidics may be provided for various end uses, including but not limited to biotechnology, chemical analysis, scent producing apparatus, micro and nano scale material deposition, heat transfer (e.g., as described herein).

As described in U.S. Pat. No. 6,355,976, and hereinabove, cooling layers may be formed between device layers. Notably, these cooling layers are not possible based on the teachings of IBM U.S. Pat. No. 6,355,501.

Microfluidic devices may also be formed by stacking channels, e.g., as described in part in the context of a handler in aforementioned PCT patent application Ser. PCT/US/02/31348 filed on Oct. 2, 2002 and entitled "Device And Method For Handling Fragile Objects, And Manufacturing Method Thereof".

In addition to stacking of channels, other microfluidic devices may be readily integrated, either by forming those devices according to known techniques, preferably on the weak bond regions of the device layer for easy removal, or by sectional assembly, generally described below with respect to MEMs. These devices may include, but are not limited to, micro flow sensors (e.g., gas flow sensors, surface shear sensors, liquid flow sensors, thermal dilution flow sensors, thermal transit-time sensors, and differential pressure flow sensors), microvalves with external actuators (e.g., solenoid plunger, piezoelectric actuators, pneumatic actuators, shape memory alloy actuators), microvalves with integrated actuators (e.g., electrostatic actuators, bimetallic actuators, thermopneumatic actuators, electromagnetic actuators), check valves, mechanical micropumps (e.g., piezoelectric micropumps, pneumatic micropumps, thermopneumatic micropumps, electrostatic micropumps), non-mechanical pumps (e.g., ultrasonically driven micropump, electro-osmosis micropump, electrohydrodynamic micropumps).

Using the processes described herein, an integrated device including microfluidics as well as processor(s), memory, optical processing, communication or switching functionality; RF transmission and/or receiving functionality; MEMs; and/or a global positioning system receiver and/or transmitter.

PCT application Ser. No. PCT/US02/26090 filed on Aug. 15, 2002 and entitled "Mems And Method Of Manufacturing Mems", which is incorporated by reference herein, discloses a method to form a vertically integrated stack including MEMs and other functionality. In general, the methods therein for forming each MEMs device at the weak bond regions of the device layer (as described herein). Preferably, on a wafer scale, the device layer is removed with minimal damage to the MEMs devices, and the wafer is generally stacked, aligned and bonded with other MEMs, or layers having other useful devices.

Figure 98:
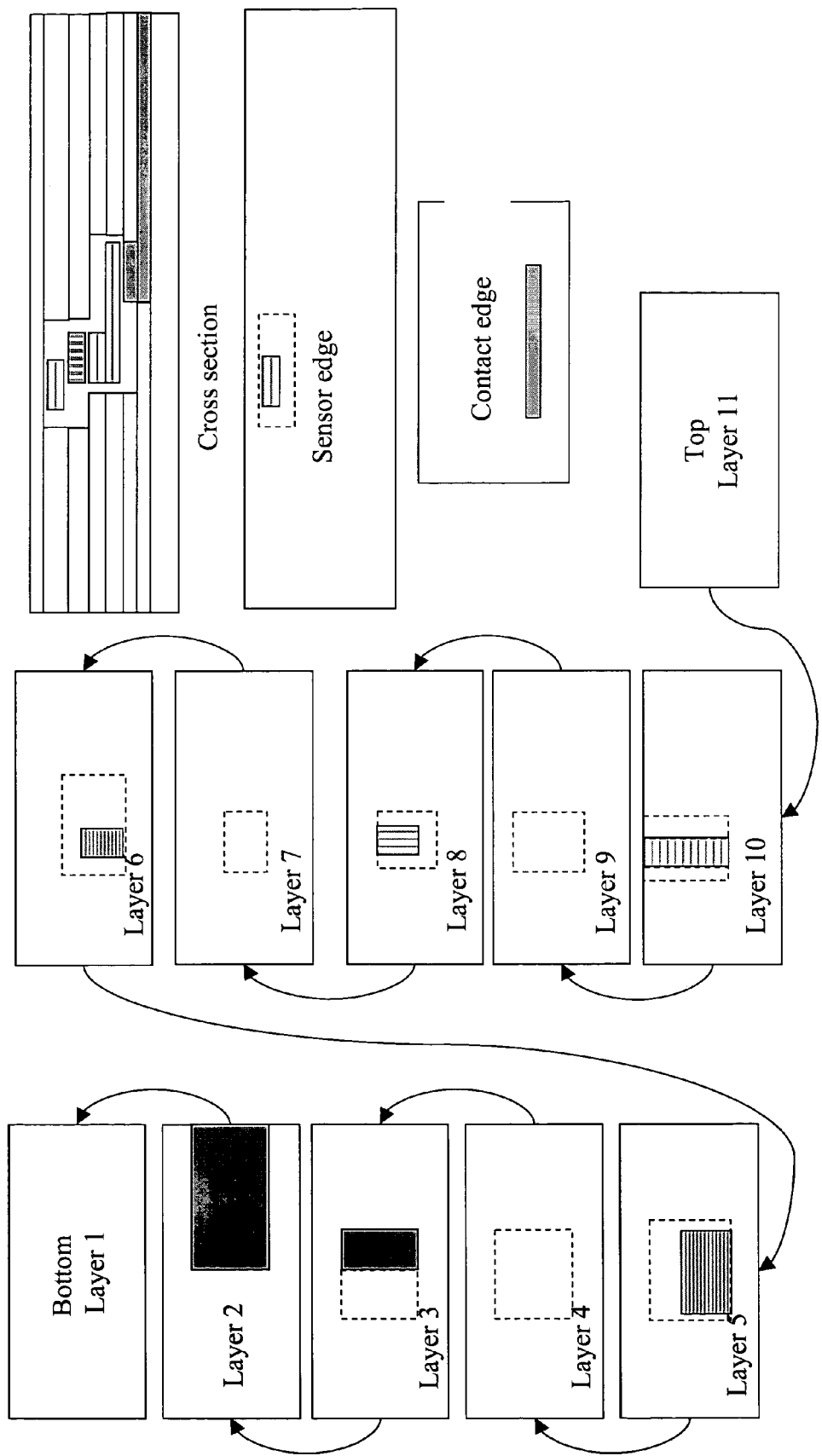
FIG. 98 is a schematic illustration of a selectively bonded device in accordance with the principles of the invention.

Referring now to FIG. 98, views of a cross section, a cantilever bearing edge, an electrical contact edge, and top views of plural layers formed in or on selectively bonded device regions of a multiple layer substrate are shown. In general, the FIG. represents a MEMs device that is formed by stacking cross sectional portions of the device. The bottom layer 1 generally serves as a substrate. Layer 2 includes an edge extending contact. Layer 3 includes a portion of the edge extending contact and an opening, generally to avoid restriction of movement of the mechanical components of the MEMs device. Layer 4 includes an opening. Layer 5 is a portion of a mechanical component (e.g., a cantilever) that is positioned within the stack for contact with the contact portion of layer 3. Layer 6 is another potion of the mechanical component of layer 5. Layer 7 is an opening to allow contact between the mechanical device in layer 6 and that in layer 8. Layer 8 includes openings and another mechanical component. Layer 9 shows an opening. Layer 10 shows the mechanical component extending to the edge of the vertically integrated chip.

Figure 99:
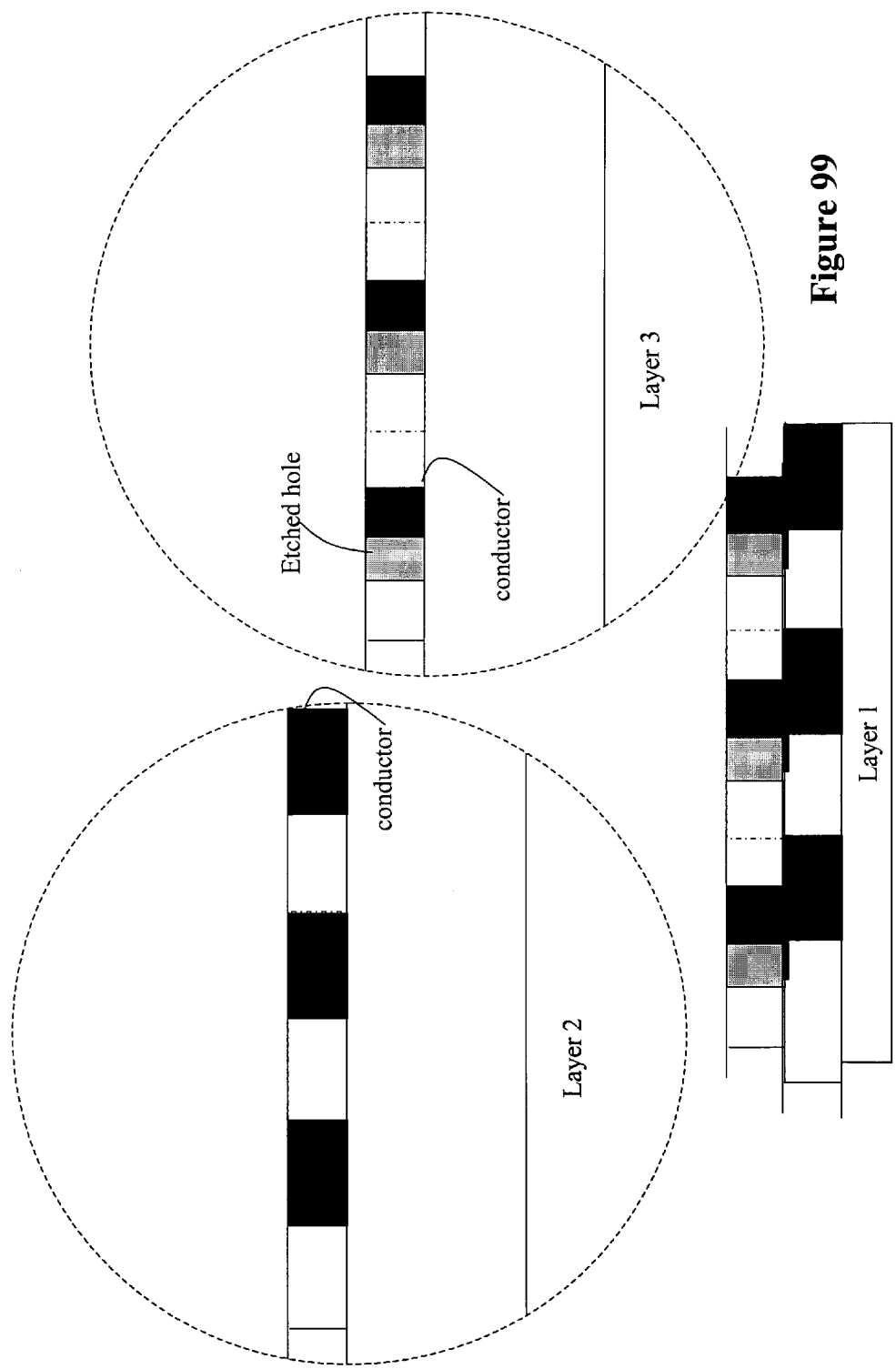
FIG. 99 is a schematic illustration of processing steps for a MEMS device in accordance with the principles of the invention.
Figure 100:
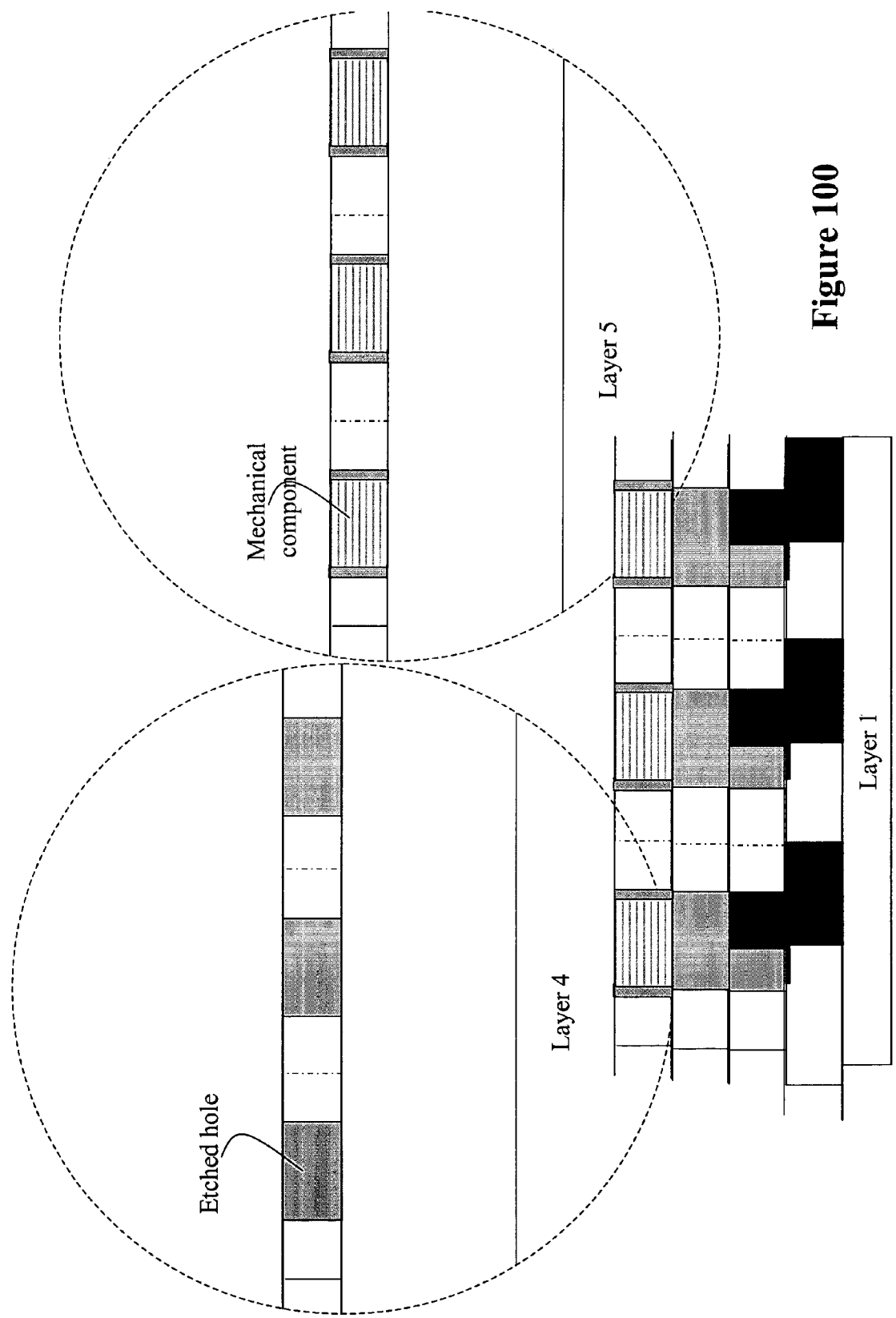
FIG. 100 is a schematic illustration of processing steps for a MEMS device in accordance with he principles of the invention.

FIGS. 99 and 100 show enlarged sectional views of processing certain steps in the MEMs device of FIG. 98. Note that each layer is generally very simple as a cross section, as opposed to micro-machining the desired cantilevered structure. This remains true for any MEMs device, as they may readily be broken down in cross section based on physical and mechanical characteristics.

Optionally, to support layers during stacking, a decomposable material may be provided in the areas to be voided and that require mechanical support.

In further embodiments, logic circuits, memory, RF circuits, optical circuits, power devices, microfluidics, or any combination comprising at least one of the foregoing useful devices may be integrated in the stack (generally depicted in FIG. 98 in cross section).

MEMs may include, but are not limited to, cantilevered structures (e.g., as resonators or resonance detectors), micro-turbines, micro-gears, micro-turntables, optical switches, switchable mirrors (rigid and membrane based), V-groove joints (e.g., for curling structures, bending structures, or for robotic arms and/or legs); microsensors that can measure one or more physical and non-physical variables including acceleration, pressure, force, torque, flow, magnetic field, temperature, gas composition, humidity, acidity, fluid ionic concentration and biological gas/liquid/molecular concentration; micro-actuators; micro-pistons; or any other MEMs device.

As mentioned, the MEMs devices may be broken down according to cross section and fabricated from several layers according to the teachings herein. However, it is understood that an entire MEMs device may be fabricated on the device layer, and transferred and stacked to another device, or used as a stand-alone device.

Using the processes described herein, an integrated device including MEMs as well as processor(s), memory, optical processing, communication or switching functionality; RF transmission and/or receiving functionality; microfluidics; and/or a global positioning system receiver and/or transmitter.

Other devices that may be formed according to the methods described herein include, but are not limited to, micro-jets (e.g., for use in micro-satellites, robotic insects, biological probe devices, directed smart "pills" (e.g., wherein a micro-jet coupled with suitable sensors is capable of locating certain tissue, for example, and with built in microfluidics, and a payload of pharmaceuticals, may direct the pharmaceuticals to the affected tissue)). Further devices that may be formed according to the methods described herein include bit sliced processors, parallel processors, modular processors, micro engines with microfluidics, IC, memory, MEMS, or any combination thereof.

While preferred embodiments have been shown and described, various modifications and substitutions may be made thereto without departing from the spirit and scope of the invention. Accordingly, it is to be understood that the present invention has been described by way of illustrations and not limitation.

What is claimed is:

1. A method of fabricating a vertical microelectromechanical device, the method comprising the steps of:
   providing a bulk substrate;
   selectively creating strong bond regions and weak bond regions on said substrate;
   providing a first bonded semiconductor layer vertically supported on said substrate;
   creating an electrode on said first bonded semiconductor layer, said electrodes corresponding to said weak bond regions;
   creating an actuatable element disposed opposite said electrode;
   removing said first semiconductor layer from said bulk substrate; and
   bonding said first semiconductor layer to a second semiconductor layer.

2. The method of claim 1 further comprising the step of aligning said first semiconductor layer with said second semiconductor layer having similarly positioned electrodes.

3. The method of claim 2, wherein said aligning step is mechanical.

4. The method of claim 2, wherein said aligning step is optical alignment.

5. The method of claim 1 further comprising the step of creating an electrode on said second semiconductor layer.

6. The method of claim 5, wherein said second semiconductor layer has semiconductor device portions on said weak bond regions.

7. The method of claim 1, wherein the ratio of areas of said strong bond regions to said weak bond regions is greater than 1.

8. The method of claim 1, wherein the ratio of bond strengths of said strong bond regions to said weak bond regions is greater than 1.

9. The method of claim 1 further comprising the step of interconnecting said first semiconductor layer with said second semiconductor layer.

10. The method of claim 9, wherein said step of interconnecting is implemented at the edge of said semiconductor layers.

11. The method of claim 10, wherein said step of interconnecting is electrically coupling.

12. The method of claim 10, wherein said step of interconnecting is optically coupling.

13. The method of claim 9, wherein said step of interconnecting is performed vertically through said semiconductor layers.

14. The method of claim 5, further comprising the steps of:
    removing said second semiconductor layer from said bulk substrate; and
    bonding said second semiconductor layer to said first semiconductor layer.

15. The method of claim 1, further comprising the steps of:
    providing an Nth semiconductor layer vertically supported on said bulk substrate, said Nth semiconductor layer having strong bond regions and weak bond regions;
    creating an electrode on said Nth semiconductor layer, said electrode corresponding to said weak bond regions;
    removing said Nth semiconductor layer from said bulk substrate; and
    bonding said Nth semiconductor layer to an (N−1)th semiconductor layer.

16. The method of claim 15, wherein MEMs devices an formed from any two of said N semiconductor layers.

17. The method of claim 1, further comprising the step of:
    dicing said bonded semi conductor layers to form one or more dies.

18. The method of claim 17, further comprising the step of:
    interconnecting said bonded semiconductor layers after said dicing step.

19. The method of claim 18, further comprising the step of:
    forming edge connectors on the boundary of said one or more dies.

20. The method of claim 19 wherein said edge connectors serve as diagnostic conductors to determine health of individual die layers.

21. The method of claim 1, wherein said bulk substrate includes a buried oxide layer.

22. The method of claim 21, wherein said buried oxide layer is formed by ion implantation.

23. A method of fabricating a multi layer microfluidic device, the method comprising the steps of:
    providing a bulk substrate;
    selectively creating strong bond regions and weak bond regions on said substrate;

providing a first bonded layer vertically supported on said substrate;

creating a port on said first bonded layer, said port corresponding to said weak bond regions;

creating a channel mechanically coupled to said port;

removing said first layer from said bulk substrate; and bonding said first bonded layer to a second layer.

24. The method of claim 23 further comprising the step of aligning said first layer with said second layer having similarly positioned ports.

25. The method of claim 24, wherein said aligning step is mechanical alignment.

26. The method of claim 24, wherein said aligning step is optical alignment.

27. The method of claim 23 further comprising the step of creating a port on said second layer.

28. The method of claim 27, wherein said second layer has microfluidic device portions on said weak bond regions.

29. The method of claim 23, wherein the ratio of areas of said strong bond regions to said weak bond regions is greater than 1.

30. The method of claim 23, wherein the ratio of bond strengths of said strong bond regions to said weak bond regions is greater than 1.

31. The method of claim 23 further comprising the step of interconnecting said first layer with said second layer.

32. The method of claim 31, wherein said step of interconnecting is implemented at the edge of said first and said second layers.

33. The method of claim 32, wherein said step of interconnecting is performed vertically through said first and said second layers.

34. The method of claim 31, further comprising the steps of:

removing said second layer from said bulk substrate; and bonding said second layer to said first layer.

35. The method of claim 23, further comprising the steps of:

providing an Nth layer vertically supported on said bulk substrate, said Nth layer having strong bond regions and weak bond regions;

creating a port on said Nth layer, said port corresponding to said weak bond regions;

removing said Nth layer from said bulk substrate; and bonding said Nth layer to an (N−1)th layer.

36. The method of claim 35, wherein microfluidic devices are formed from any two of said N layers.

37. The method of claim 23, further comprising the step of:

dicing said bonded layers to form one or more dies.

38. The method of claim 37, further comprising the step of:

interconnecting said bonded layers after said dicing step.

39. The method of claim 38, further comprising the step of:

forming edge connectors on the boundary of said one or more dies.

40. The method of claim 39 wherein said edge connectors serve as diagnostic indicators for determining the health of individual die layers.

41. The method of claim 23, wherein said bulk substrate includes a buried oxide layer.

42. The method of claim 41, wherein said buried oxide layer is formed by ion implantation.

* * * * *